(12) United States Patent
Yamazaki et al.

(10) Patent No.: US 9,478,664 B2
(45) Date of Patent: Oct. 25, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Akihisa Shimomura, Kanagawa (JP); Yasumasa Yamane, Kanagawa (JP); Yuhei Sato, Kanagawa (JP); Tetsuhiro Tanaka, Kanagawa (JP); Masashi Tsubuku, Kanagawa (JP); Toshihiko Takeuchi, Kanagawa (JP); Ryo Tokumaru, Kanagawa (JP); Mitsuhiro Ichijo, Kanagawa (JP); Satoshi Toriumi, Kanagawa (JP); Takashi Ohtsuki, Kanagawa (JP); Toshiya Endo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/575,052

(22) Filed: Dec. 18, 2014

(65) Prior Publication Data

US 2015/0179810 A1 Jun. 25, 2015

(30) Foreign Application Priority Data

Dec. 25, 2013 (JP) ................................. 2013-267525

(51) Int. Cl.
*H01L 29/10* (2006.01)
*H01L 29/786* (2006.01)
(Continued)

(52) U.S. Cl.
CPC ... *H01L 29/78606* (2013.01); *H01L 29/66969* (2013.01); *H01L 29/7869* (2013.01);
(Continued)

(58) Field of Classification Search
CPC .............. H01L 33/62; H01L 51/5056; H01L 51/5072; H01L 33/06; H01L 27/3244
USPC .............................. 257/43, E21.409, E29.296
See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 101866952 A 10/2010
CN 103247692 A 8/2013
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Andy Huynh
(74) *Attorney, Agent, or Firm* — Fish & Richardson P.C.

(57) ABSTRACT

A change in electrical characteristics is suppressed and reliability in a semiconductor device using a transistor including an oxide semiconductor is improved. The semiconductor device includes an oxide semiconductor film over an insulating surface, an antioxidant film over the insulating surface and the oxide semiconductor film, a pair of electrodes in contact with the antioxidant film, a gate insulating film over the pair of electrodes, and a gate electrode which is over the gate insulating film and overlaps with the oxide semiconductor film. In the antioxidant film, a width of a region overlapping with the pair of electrodes is longer than a width of a region not overlapping with the pair of electrodes.

14 Claims, 73 Drawing Sheets

(51) Int. Cl.
*H01L 29/66* (2006.01)
*H01L 21/02* (2006.01)

(52) U.S. Cl.
CPC ... *H01L29/78618* (2013.01); *H01L 29/78693* (2013.01); *H01L 29/78696* (2013.01); *H01L 21/02554* (2013.01); *H01L 21/02565* (2013.01); *H01L 21/02631* (2013.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0025679 | A1 | 2/2010 | Yamazaki et al. |
| 2010/0038641 | A1 | 2/2010 | Imai |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0264412 | A1 | 10/2010 | Yamazaki et al. |
| 2011/0284959 | A1 | 11/2011 | Kimura et al. |
| 2012/0132906 | A1 | 5/2012 | Yamazaki |
| 2013/0126863 | A1 | 5/2013 | Yamazaki et al. |
| 2013/0200364 | A1 | 8/2013 | Tokunaga |
| 2013/0264563 | A1 | 10/2013 | Okazaki et al. |
| 2013/0270549 | A1 | 10/2013 | Okazaki et al. |
| 2013/0270550 | A1* | 10/2013 | Okazaki et al. |
| 2013/0270563 | A1* | 10/2013 | Yamazaki ......... H01L 29/78609 257/57 |
| 2014/0030845 | A1 | 1/2014 | Koezuka et al. |
| 2015/0053971 | A1 | 2/2015 | Miyanaga et al. |
| 2015/0102341 | A1 | 4/2015 | Yamazaki et al. |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-224479 A | 10/2009 |
| JP | 2010-067954 A | 3/2010 |
| JP | 2010-267955 A | 11/2010 |
| JP | 2012-004549 A | 1/2012 |
| JP | 2012-134472 A | 7/2012 |
| JP | 2012-256915 A | 12/2012 |

(56) References Cited

FOREIGN PATENT DOCUMENTS

| | | |
|---|---|---|
| JP | 2013-065864 A | 4/2013 |
| JP | 2013-161895 A | 8/2013 |
| JP | 5579848 | 8/2014 |
| KR | 2010-0114842 A | 10/2010 |
| KR | 2013-0070641 A | 6/2013 |
| KR | 2013-0082079 A | 7/2013 |
| TW | 201108417 | 3/2011 |
| TW | 201205813 | 2/2012 |
| TW | 201208073 | 2/2012 |
| TW | 201244108 | 11/2012 |
| WO | WO-2004/114391 | 12/2004 |
| WO | WO-2011/145635 | 11/2011 |
| WO | WO-2011/162177 | 12/2011 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp.251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-154202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering". SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Revierw. B), 2008, vol. 77 pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide $InGaO_3(ZnO)_m$ (m<4):a Zn4s conductor", Philosophical Magazine, 2001, vol. 81, No. 5, pp. 501-515.
Orita.M et al., "Mechanism of Electrical Conductivity of Transparent $InGaZnO_4$", Phys. Rev. B (Physical Reviewb B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amosphous GIZO ($Ga_2O_3$—$In_2O_3$—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2014/066832) Dated Mar. 10, 2015.
Written Opinion (Application No. PCT/IB2014/066832) Dated Mar. 10, 2015.

\* cited by examiner

● In   ○ Ga   ○ Zn   ● O   ● H

FIG. 43A
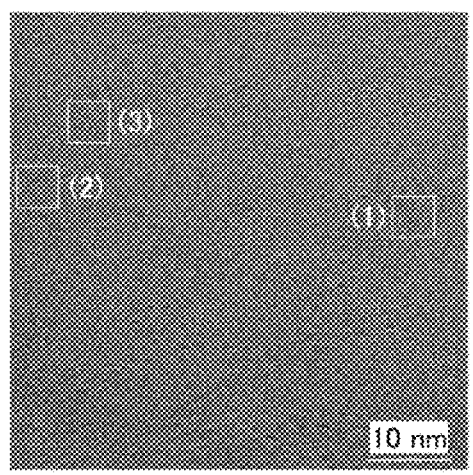
FIG. 43B      FIG. 43C      FIG. 43D
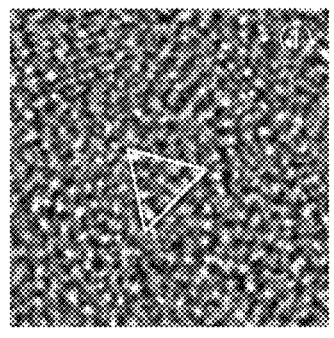 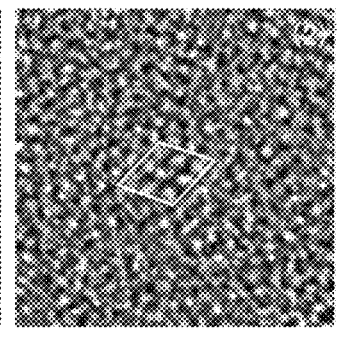 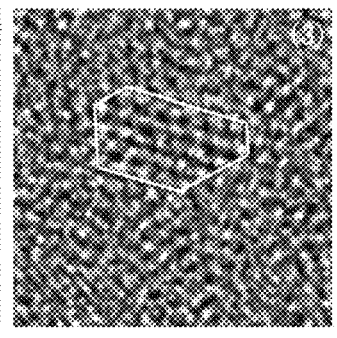

FIG. 44A
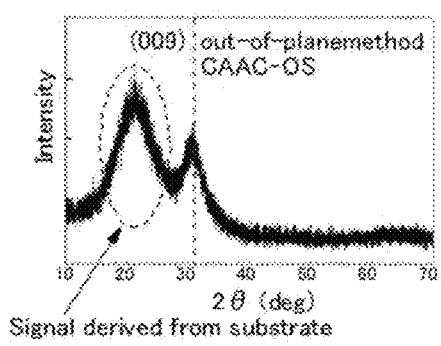
Signal derived from substrate
FIG. 44B
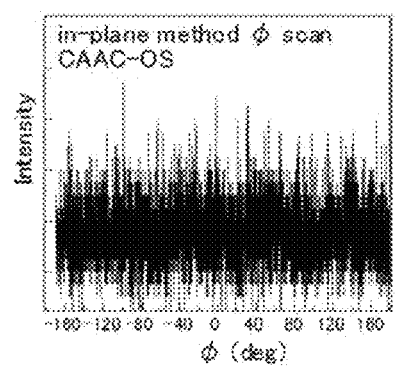
FIG. 44C in-plane method φ scan single crystal OS
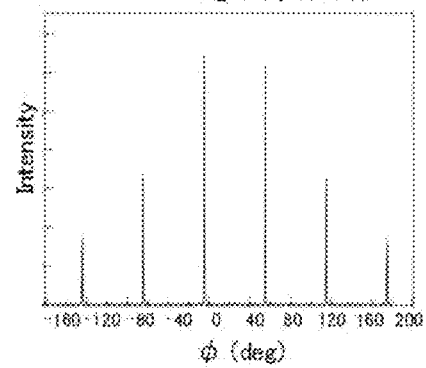

FIG. 50A
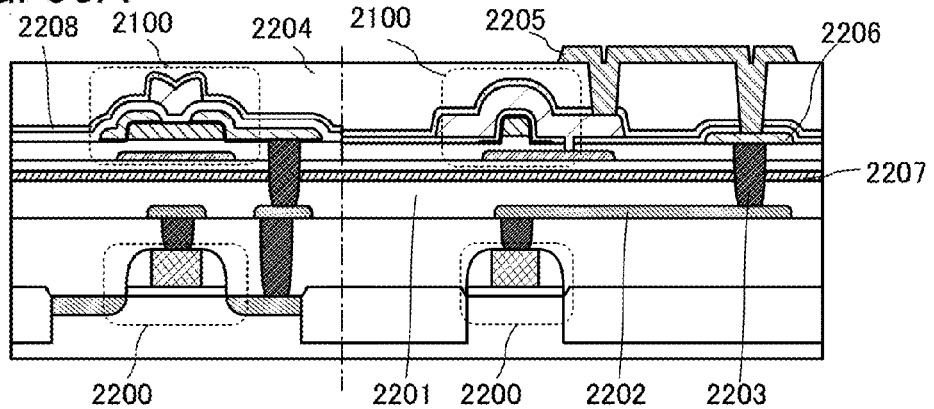
FIG. 50B  FIG. 50C
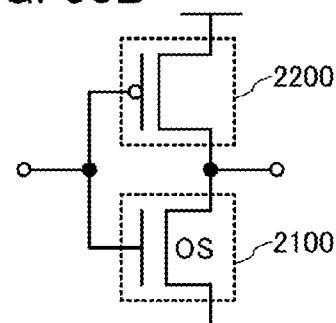 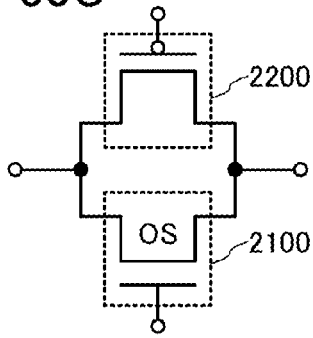
FIG. 50D
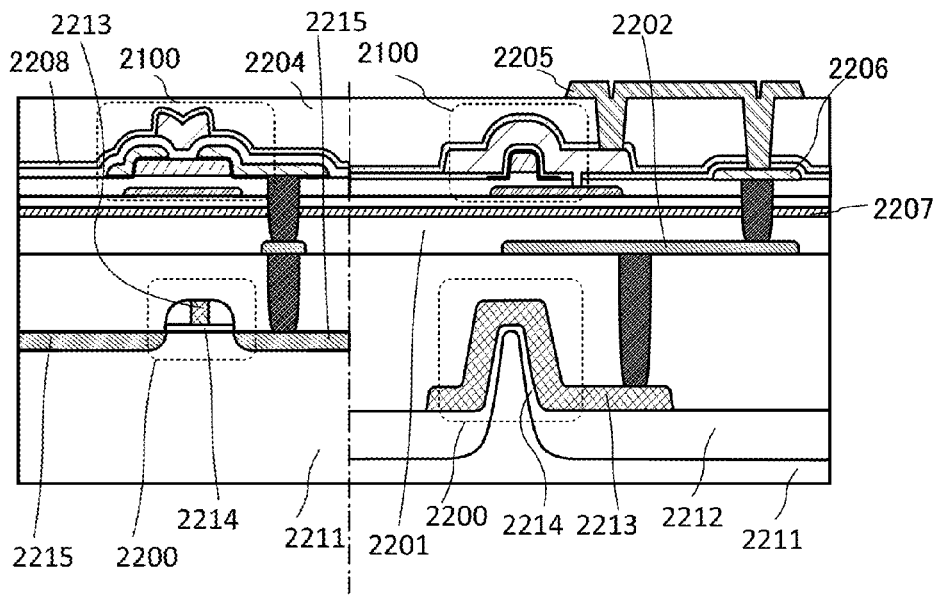

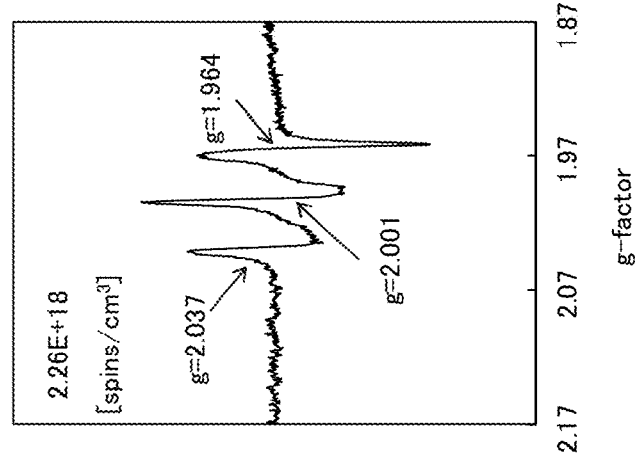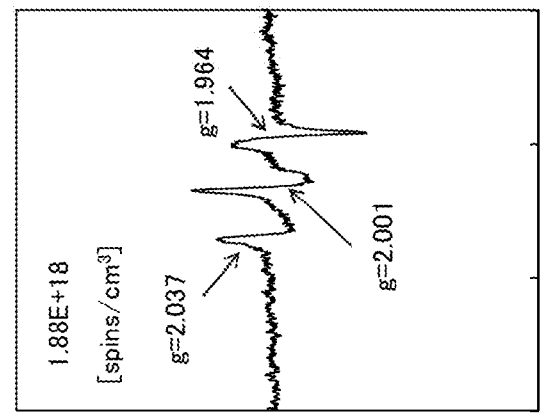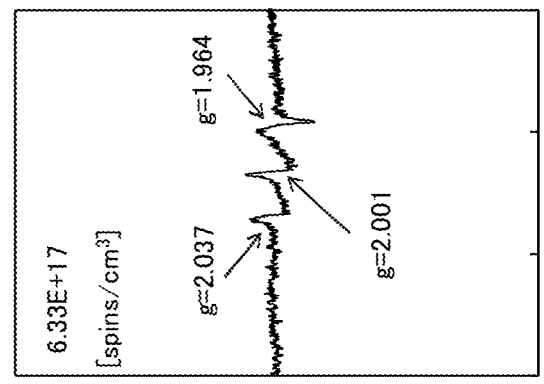

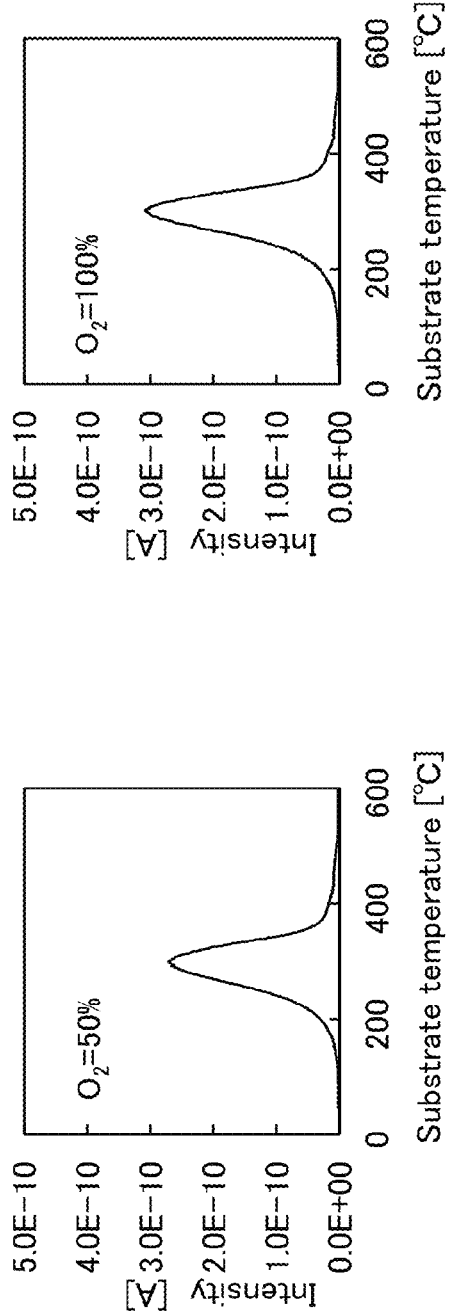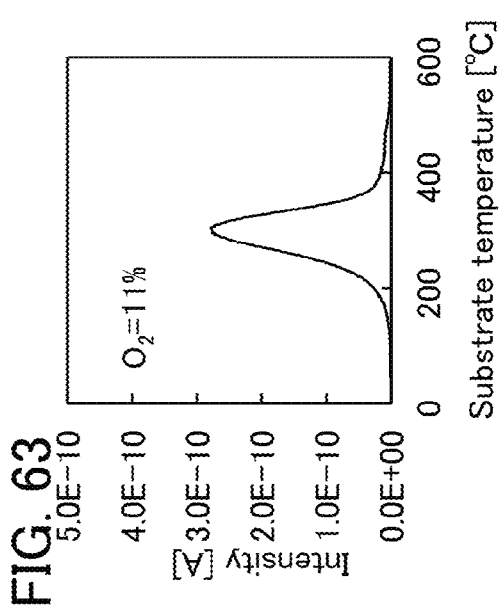
FIG. 63

FIG. 68
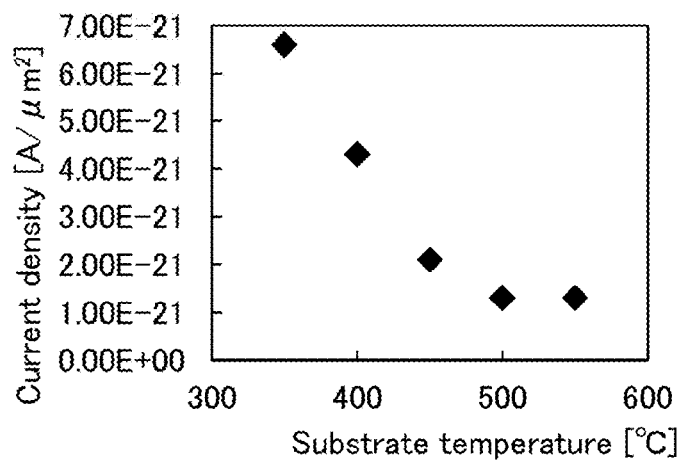
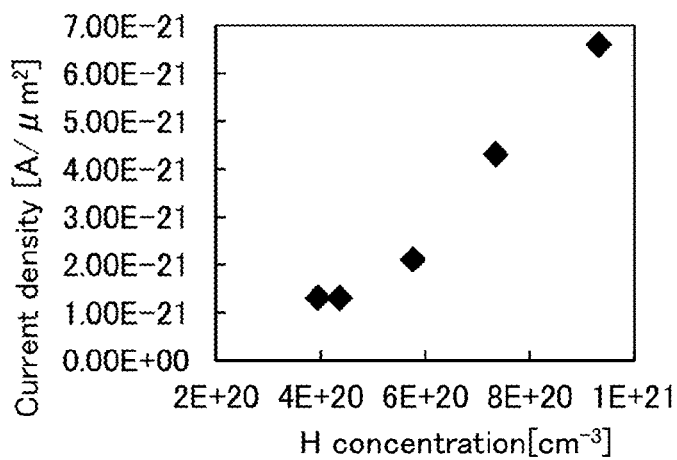
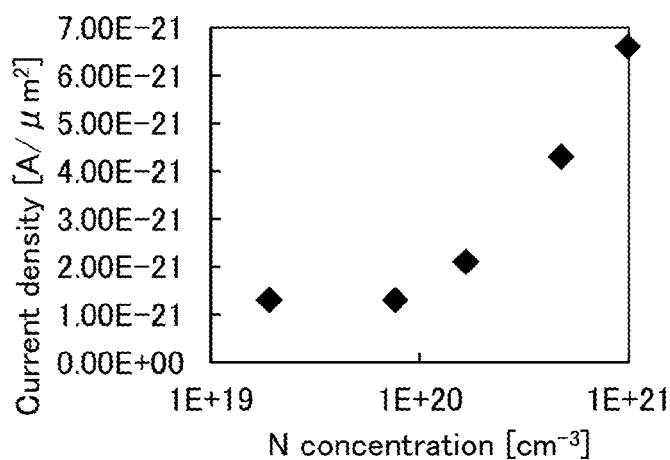

SEMICONDUCTOR DEVICE

TECHNICAL FIELD

One embodiment of the present invention relates to a semiconductor device including a field-effect transistor.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Transistors used for most flat panel displays typified by a liquid crystal display device and a light-emitting display device are formed using silicon semiconductors such as amorphous silicon, single crystal silicon, and polycrystalline silicon provided over glass substrates. Further, such a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor.

For example, a technique is disclosed in which a transistor is manufactured using zinc oxide or an In—Ga—Zn-based oxide as an oxide semiconductor and the transistor is used as a switching element or the like of a pixel of a display device (see Patent Documents 1 and 2).

It has been pointed out that hydrogen is a supply source of carriers particularly in an oxide semiconductor. Therefore, some measures need to be taken to prevent hydrogen from entering the oxide semiconductor at the time of forming the oxide semiconductor. Further, variation in a threshold voltage is suppressed by reducing the amount of hydrogen contained in the oxide semiconductor film or a gate insulating film in contact with the oxide semiconductor (see Patent Document 3).

REFERENCE

Patent Documents

[Patent Document 1] Japanese Published Patent Application No. 2007-123861

[Patent Document 2] Japanese Published Patent Application No. 2007-096055

[Patent Document 3] Japanese Published Patent Application No. 2009-224479

DISCLOSURE OF INVENTION

However, similarly to hydrogen, nitrogen becomes a source for supplying carriers. Thus, when a large amount of nitrogen is contained in a film in contact with an oxide semiconductor film, the electrical characteristics of a transistor including the oxide semiconductor film vary: for a typical example, the threshold voltage of the transistor shifts. Further, there is a problem in that electrical characteristics vary among the transistors.

To reduce oxygen vacancies in the oxide semiconductor film, oxygen needs to be supplied to the oxide semiconductor film. Note that when oxygen is added directly to the oxide semiconductor film, the crystal structure of the oxide semiconductor film is disordered, which causes a reduction in crystallinity. Accordingly, oxygen can be added to a film in contact with the oxide semiconductor film so that the oxygen is supplied from the film to the oxide semiconductor film.

However, the film in contact with the oxide semiconductor film might contain nitrogen. When oxygen is added to such a film, nitrogen oxide (typified by nitrogen monoxide and nitrogen dioxide) is generated, in which case the nitrogen oxide in the film in contact with the oxide semiconductor film forms a trap level at the interface between the film and the oxide semiconductor film; thus, the electrical characteristics of the transistor are varied.

One object of one embodiment of the present invention is to suppress a change in electrical characteristics and to improve reliability in a semiconductor device using a transistor including an oxide semiconductor. Another object of one embodiment of the present invention is to provide a semiconductor device with low power consumption. Another object of one embodiment of the present invention is to provide a novel semiconductor device. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an oxide semiconductor film over an insulating surface, an antioxidant film over the insulating surface and the oxide semiconductor film, a pair of electrodes in contact with the antioxidant film, a gate insulating film over the pair of electrodes, and a gate electrode which is over the gate insulating film and overlaps with the oxide semiconductor film. In the antioxidant film, a width of a region overlapping with the pair of electrodes is longer than a width of a region not overlapping with the pair of electrodes.

In the above structure, the oxide semiconductor film may serve as the antioxidant film.

Another embodiment of the present invention is a semiconductor device including an oxide semiconductor film over an insulating surface, a pair of electrodes in contact with the oxide semiconductor film, a gate insulating film over the pair of electrodes, and a gate electrode which is over the gate insulating film and overlaps with the oxide semiconductor film. In the oxide semiconductor film, a width of a region overlapping with the pair of electrodes is longer than a width of a region not overlapping with the pair of electrodes.

In the above structure, a conductive film and a base insulating film may be included between the insulating surface and the oxide semiconductor film. The conductive film may be in contact with the insulating surface. The base insulating film may be in contact with the insulating surface and the oxide semiconductor film.

In the above structure, in an electron spin resonance spectrum of at least one of the gate insulating film and the base insulating film, a first signal that appears at a g-factor of greater than or equal to 2.037 and smaller than or equal to 2.039, a second signal that appears at a g-factor of greater than or equal to 2.001 and smaller than or equal to 2.003, and a third signal that appears at a g-factor of greater than or equal to 1.964 and smaller than or equal to 1.966 are observed.

In the above structure, at least one of the gate insulating film and the base insulating film includes a portion with a nitrogen concentration of lower than $1\times10^{20}$ atoms/cm$^3$.

In the above structure, at least one of the gate insulating film and the base insulating film includes a portion with a hydrogen concentration of lower than $5\times10^{20}$ atoms/cm$^3$.

In the above structure, a signal attributed to nitrogen oxide is observed in at least one of the gate insulating film and the base insulating film in an electron spin resonance spectrum.

In the above structure, the nitrogen oxide is nitrogen monoxide or nitrogen dioxide.

One embodiment of the present invention can suppress a change in electrical characteristics of a transistor including an oxide semiconductor film and improve reliability. One embodiment of the present invention can provide a semiconductor device with less power consumption. One embodiment of the present invention can provide a novel semiconductor device. Note that the descriptions of these effects do not disturb the existence of other effects. In one embodiment of the present invention, there is no need to obtain all the effects. Other effects will be apparent from and can be derived from the description of the specification, the drawings, the claims, and the like.

BRIEF DESCRIPTION OF DRAWINGS

FIGS. 43A to 43D are Cs-corrected high-resolution TEM images of a plane of a CAAC-OS film.

FIGS. 44A to 44C show structural analysis of a CAAC-OS film and a single crystal oxide semiconductor film by XRD.

FIGS. 50A to 50D are cross-sectional views and circuit diagrams each illustrating a semiconductor device.

FIGS. 59A to 59C show ESR measurement results.

FIG. 63 shows measurement results of TDS analyses.

FIG. 68 shows measurement results of SIMS.

BEST MODE FOR CARRYING OUT THE INVENTION

Figure 1A:
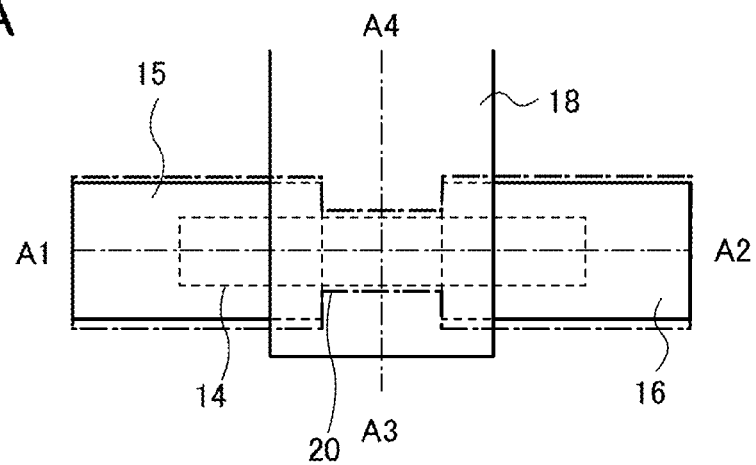
FIGS. 1A to 1C are a top view and cross-sectional views illustrating a transistor.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof is not repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Note that the channel length refers to, for example, a distance between a source (source region or source electrode) and a drain (drain region or drain electrode) in a region where an oxide semiconductor film (or a portion where a current flows in an oxide semiconductor film when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the width of a source or a drain in a region where an oxide semiconductor film (or a portion where a current flows in an oxide semiconductor film when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of an oxide semiconductor film is higher than the proportion of a channel region formed in a top surface of the oxide semiconductor film in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of an oxide semiconductor film is known. Therefore, in the case where the shape of an oxide semiconductor film is not known accurately, it is difficult to measure an effective channel width accurately.

Therefore, in this specification, in a top view of a transistor, an apparent channel width, that is, the width of a source or a drain in a region where an oxide semiconductor film and a gate electrode overlap with each other, is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Embodiment 1

In this embodiment, a semiconductor device of one embodiment of the present invention and a method for manufacturing the semiconductor device are described with reference to drawings. A transistor 10 described in this embodiment has a dual-gate structure.

<1. Structure of Transistor>

Figure 1B:
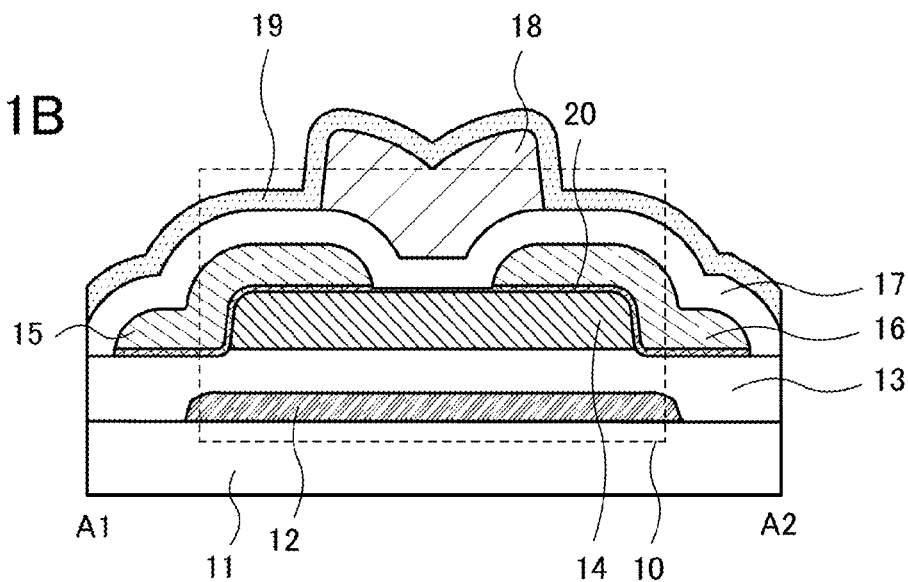
Figure 1C:
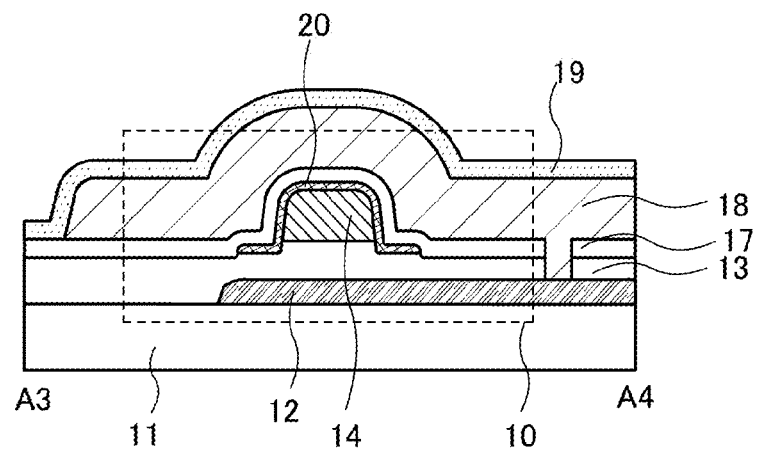

FIGS. 1A to 1C are a top view and cross-sectional views of the transistor 10 included in a semiconductor device. FIG. 1A is a top view of the transistor 10, FIG. 1B is a cross-sectional view taken along dashed-dotted line A1-A2 in FIG. 1A, and FIG. 1C is a cross-sectional view taken along dashed-dotted line A3-A4 in FIG. 1A. In FIGS. 1A to 1C, some components are enlarged, reduced in size, or omitted for easy understanding. In some cases, the direction of the dashed-dotted line A1-A2 is referred to as a channel length direction, and the direction of the dashed-dotted line A3-A4 is referred to as a channel width direction.

The transistor 10 illustrated in FIGS. 1A to 1C includes a conductive film 12 over a substrate 11, a base insulating film 13 over the substrate 11 and the conductive film 12, an oxide semiconductor film 14 over the base insulating film 13, an antioxidant film 20 in contact with the base insulating film 13 and the oxide semiconductor film 14, a pair of electrodes 15 and 16 over the antioxidant film 20, a gate insulating film 17 over the pair of electrodes 15 and 16, and a gate electrode 18 overlapping with the oxide semiconductor film 14 with the gate insulating film 17 provided therebetween. An insulating film 19 may be formed over the gate insulating film 17 and the gate electrode 18.

The insulating film 19 serves as a barrier film that blocks oxygen, hydrogen, water, and the like. This means that the insulating film 19 can prevent hydrogen and water from entering the oxide semiconductor film 14 from the outside and can prevent oxygen in the oxide semiconductor film 14 from being released to the outside.

The antioxidant film 20 is provided directly under the pair of electrodes 15 and 16. The antioxidant film 20 suppresses oxidation of the pair of electrodes induced by oxygen released from the base insulating film 13. For this reason, volume expansion of the pair of electrodes 15 and 16 due to oxidation can be suppressed and the coverage of the pair of electrodes 15 and 16 with the gate insulating film 17 can be improved.

In the antioxidant film 20, the width of a region overlapping with the pair of electrodes 15 and 16 is longer than the width of a region not overlapping with the pair of electrodes 15 and 16. Accordingly, the width of the region not overlapping with the pair of electrodes 15 and 16 can be short, leading to miniaturization of the transistor, and the area of a region where the antioxidant film 20 is in contact with the pair of electrodes 15 and 16 can be increased, leading to a reduction in contact resistance.

As the antioxidant film 20, any film that prevents oxygen from the base insulating film 13 from reaching the pair of electrodes 15 and 16 can be used. For example, an In—Ga—Zn oxide semiconductor film formed by a sputtering method using a target containing In, Ga, and Zn at an atomic ratio of 1:1:1, 1:3:4, 1:3:6, 1:3:8, or 1:4:5 can be used.

In this embodiment, a film positioned near the oxide semiconductor film 14, as a typical example, at least one of the base insulating film 13 and the gate insulating film 17 is preferably an oxide insulating film containing nitrogen and having a small number of defects.

Typical examples of the oxide insulating film containing nitrogen and having a small number of defects include a silicon oxynitride film and an aluminum oxynitride film. Note that an "oxynitride film" such as a silicon oxynitride film or an aluminum oxynitride film refers to a film that contains more oxygen than nitrogen, and a "nitride oxide film" such as a silicon nitride oxide film or an aluminum nitride oxide film refers to a film that contains more nitrogen than oxygen.

In an ESR spectrum at 100 K or lower of the oxide insulating film having a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. In this embodiment, a "signal is observed" means that a spin density of higher than or equal to $4.7\times10^{15}$ spins/cm$^3$ is observed at a g-factor. The split width of the first and second signals and the split width of the second and third signals that are obtained by ESR measurement using an X-band are each approximately 5 mT. The sum of the spin densities of the first to third signals is lower than $4\times10^{18}$ spins/cm$^3$, typically higher than or equal to $2.4\times10^{18}$ spins/cm$^3$ and lower than $4\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

In the oxide insulating film containing nitrogen and having a small number of defects, the nitrogen concentration and the hydrogen concentration become lower as the deposition temperature increases. Typical deposition temperature of the oxide insulating film is higher than or equal to 500° C., preferably higher than or equal to 500° C. and lower than or equal to 550° C. When oxygen is added after the nitrogen concentration is reduced, generation of nitrogen oxide can be suppressed; thus, oxygen can be added to the oxide insulating film and can be supplied to the oxide semiconductor film 14.

When at least one of the base insulating film 13 and the gate insulating film 17 which are positioned near the oxide semiconductor film 14 contains a small amount of nitrogen oxide as described above, the carrier trap at the interface between the base insulating film 13 and the oxide semiconductor film 14 can be inhibited. Accordingly, a shift in the threshold voltage of the transistor included in the semiconductor device can be inhibited, which leads to a reduced change in the electrical characteristics of the transistor.

At least one of the base insulating film 13 and the gate insulating film 17 preferably has a portion in which the nitrogen concentration measured by secondary ion mass spectrometry (SIMS) is lower than $1\times10^{20}$ atoms/cm$^3$. In that case, a nitrogen oxide is unlikely to be generated in at least one of the base insulating film 13 and the gate insulating film 17, so that the carrier trap at the interface between the base insulating film 13 and the oxide semiconductor film 14 can be inhibited. Furthermore, a shift in the threshold voltage of the transistor included in the semiconductor device can be inhibited, which leads to a reduced change in the electrical characteristics of the transistor.

At least one of the base insulating film 13 and the gate insulating film 17 preferably includes a portion in which the hydrogen concentration measured by SIMS is lower than $5\times10^{20}$ atoms/cm$^3$. Low hydrogen concentrations of the base insulating film 13 and the gate insulating film 17 positioned near the oxide semiconductor film 14 can prevent hydrogen from entering the oxide semiconductor film 14.

The details of other components of the transistor 10 are described below.

There is no particular limitation on the property of a material and the like of the substrate 11 as long as the material has heat resistance enough to withstand at least later heat treatment. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, a silicon on insulator (SOI) substrate, or the like may be used as the substrate 11. Furthermore, any of these substrates further provided with a semiconductor element may be used as the substrate 11.

Alternatively, a flexible substrate may be used as the substrate 11, and the transistor 10 may be provided directly on the flexible substrate. Further alternatively, a separation layer may be provided between the substrate 11 and the transistor 10. The separation layer can be used when part or the whole of a semiconductor device formed over the separation layer is separated from the substrate 11 and transferred onto another substrate. In such a case, the transistor 10 can be transferred to a substrate having low heat resistance or a flexible substrate as well.

The conductive film 12 can be formed using a metal element selected from aluminum, chromium, copper, tantalum, titanium, molybdenum, and tungsten; an alloy containing any of these metal elements as a component; an alloy containing these metal elements in combination; or the like. One or more metal elements selected from manganese and zirconium may be used. The conductive film 12 may have a single-layer structure or a stacked layer structure of two or more layers. For example, any of the following can be used: a single-layer structure of an aluminum film containing silicon; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a three-layer structure in which a titanium film, an aluminum film, and a titanium film are stacked in this order; and the like. Alternatively, an alloy film or a nitride film which contains aluminum and one or more elements selected from titanium, tantalum, tungsten, molybdenum, chromium, neodymium, and scandium may be used.

The conductive film 12 can also be formed using a light-transmitting conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, an indium tin oxide containing silicon oxide, an indium oxide compound containing magnesium oxide, zinc oxide containing gallium oxide, zinc oxide containing aluminum oxide, zinc oxide containing magnesium oxide, or tin oxide containing fluorine. It is also possible to employ a stacked-layer structure formed using any of the above light-transmitting conductive materials and any of the above metal elements.

The conductive film 12 serves as a gate electrode and can be used as a back gate and thus can be used to further increase on-state current and to control the threshold voltage. To increase the on-state current, for example, the gate electrode 18 and the conductive film 12 are electrically connected to each other to have the same potential, and the transistor is driven as a dual-gate transistor. To control the threshold voltage, the gate electrode 18 and the conductive film 12 are not electrically connected to each other so that a fixed potential, which is different from a potential of the gate electrode 18, is supplied to the conductive film 12. Note that the gate electrode 18 can be formed using any of the materials for the conductive film 12.

The base insulating film 13 can be formed using, for example, silicon oxide, silicon oxynitride, silicon nitride, silicon nitride oxide, gallium oxide, hafnium oxide, yttrium oxide, aluminum oxide, or aluminum oxynitride. Note that when silicon nitride, gallium oxide, hafnium oxide, yttrium oxide, aluminum oxide, or the like is used for the base insulating film 13, it is possible to suppress diffusion of impurities such as an alkali metal, water, and hydrogen from the substrate 11 side into the oxide semiconductor film 14.

In the case where the base insulating film 13 is formed using an oxide insulating film containing nitrogen and having a small number of defects, the gate insulating film 17 can be formed to have a single-layer structure or a stacked-layer structure using, for example, any of silicon oxide, silicon oxynitride, silicon nitride oxide, silicon nitride, aluminum oxide, hafnium oxide, gallium oxide, a Ga—Zn-based metal oxide, and the like. Note that an oxide insulating film is preferably used for at least a region of the gate insulating film 17, which is positioned near the oxide semiconductor film 14, in order to improve characteristics of the interface with the oxide semiconductor film 14.

Furthermore, it is possible to prevent outward diffusion of oxygen from the oxide semiconductor film 14 and entry of hydrogen, water, or the like into the oxide semiconductor film 14 from the outside by providing an insulating film having a blocking effect against oxygen, hydrogen, water, and the like as the gate insulating film 17. As the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

The gate insulating film 17 may be formed using a high-k material such as hafnium silicate ($HfSiO_x$), hafnium silicate to which nitrogen is added ($HfSi_xO_y$), hafnium aluminate to which nitrogen is added ($HfAl_xO_y$), hafnium oxide, or yttrium oxide, so that gate leakage current of the transistor can be reduced.

The oxide semiconductor film 14 is formed using a metal oxide containing at least In or Zn; as a typical example, an In—Ga oxide, an In—Zn oxide, an In—Mg oxide, a Zn—Mg oxide, or an In-M-Zn oxide (M is Al, Ga, Sn, Y, Zr, La, Ce, Mg, or Nd) can be given.

Note that in the case where the oxide semiconductor film 14 contains an In-M-Zn oxide, the proportions of In and M, not taking Zn and O into consideration, are preferably as follows: the proportion of In is greater than or equal to 25 atomic % and the proportion of M is less than 75 atomic %, or further preferably, the proportion of In is greater than or equal to 34 atomic % and the proportion of M is less than 66 atomic %.

The energy gap of the oxide semiconductor film 14 is 2 eV or more, preferably 2.5 eV or more, further preferably 3 eV or more. With the use of an oxide semiconductor having such a wide energy gap, the off-state current of the transistor 10 can be reduced.

The thickness of the oxide semiconductor film 14 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 14 contains an In-M-Zn oxide (M represents Al, Ga, Y, Zr, La, Ce, Mg, or Nd), it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the atomic ratios of metal elements in the formed oxide semiconductor film 14 vary from the above atomic ratio of metal elements of the sputtering target within a range of ±40% as an error.

Hydrogen contained in the oxide semiconductor reacts with oxygen bonded to a metal atom to be water, and causes oxygen vacancies in a lattice (or a portion) from which oxygen is released. Due to entry of hydrogen into the oxygen vacancy, an electron serving as a carrier is generated. Further, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that hydrogen be reduced as much as possible as well as the oxygen vacancies in the oxide semiconductor film 14. Specifically, the oxide semiconductor film 14 has a portion in which the hydrogen concentration that is measured by SIMS is set to $2 \times 10^{20}$ atoms/cm$^3$ or lower, preferably $5 \times 10^{19}$ atoms/cm$^3$ or lower, further preferably $1 \times 10^{19}$ atoms/cm$^3$ or lower, further preferably $5 \times 10^{18}$ atoms/cm$^3$ or lower, further preferably $1 \times 10^{18}$ atoms/cm$^3$ or lower, further preferably $5 \times 10^{17}$ atoms/cm$^3$ or lower, further preferably $1 \times 10^{16}$ atoms/cm$^3$ or lower. As a result, the transistor 10 has positive threshold voltage (normally-off characteristics).

When silicon or carbon that is one of elements belonging to Group 14 is contained in the oxide semiconductor film 14, oxygen vacancies are increased in the oxide semiconductor film 14, and the oxide semiconductor film 14 becomes an n-type film. Thus, the oxide semiconductor film 14 has a portion in which the concentration of silicon or carbon (the concentration is measured by SIMS) is lower than or equal to $2 \times 10^{18}$ atoms/cm$^3$, preferably lower than or equal to $2 \times 10^{17}$ atoms/cm$^3$. As a result, the transistor 10 has positive threshold voltage (normally-off characteristics).

Furthermore, the oxide semiconductor film 14 has a portion in which the concentration of alkali metal or alkaline earth metal, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal of the oxide semiconductor film 14. As a result, the transistor 10 has positive threshold voltage (normally-off characteristics).

Furthermore, when containing nitrogen, the oxide semiconductor film 14 easily becomes an n-type film by generation of electrons serving as carriers and an increase of carrier density. Thus, a transistor including an oxide semiconductor that contains nitrogen is likely to be normally on. For this reason, nitrogen in the oxide semiconductor film is preferably reduced as much as possible. For example, the oxide semiconductor film preferably has a portion in which the concentration of nitrogen that is measured by SIMS is lower than or equal to $5 \times 10^{18}$ atoms/cm$^3$.

When impurities in the oxide semiconductor film 14 are reduced, the carrier density of the oxide semiconductor film 14 can be lowered. The oxide semiconductor preferably has a portion with a carrier density of $1\times10^{17}/cm^3$ or lower, further preferably $1\times10^{15}/cm^3$ or lower, still further preferably $1\times10^{13}/cm^3$ or lower, yet still further preferably $1\times10^{11}/cm^3$ or lower.

Note that it is preferable to use, as the oxide semiconductor film 14, an oxide semiconductor film in which the impurity concentration is low and density of defect states is low, in which case the transistor can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has a low trap state in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor film 14 may have a non-single-crystal structure, for example. The non-single crystal structure includes a c-axis aligned crystalline oxide semiconductor (CAAC-OS) that is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

Note that the oxide semiconductor film 14 may be a mixed film including two or more of the following: a region having an amorphous structure, a region having a microcrystalline structure, a region having a polycrystalline structure, a region of CAAC-OS, and a region having a single-crystal structure. The mixed film includes, for example, two or more of a region having an amorphous structure, a region having a microcrystalline structure, a region having a polycrystalline structure, a CAAC-OS region, and a region having a single-crystal structure, in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

The pair of electrodes 15 and 16, which serves as a source electrode and a drain electrode, is formed with a single-layer structure or a stacked-layer structure using any of metals such as aluminum, titanium, chromium, nickel, copper, yttrium, zirconium, molybdenum, silver, tantalum, and tungsten and an alloy containing any of these metals as a main component. For example, a single-layer structure of an aluminum film containing silicon; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; and the like can be given. Note that a transparent conductive material containing indium oxide, tin oxide, or zinc oxide may be used.

Further, it is possible to prevent outward diffusion of oxygen from the oxide semiconductor film 14 and entry of hydrogen, water, or the like into the oxide semiconductor film 14 from the outside by providing an insulating film having a blocking effect against oxygen, hydrogen, water, and the like as the insulating film 19. As for the insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film, can be given as examples.

The thickness of the insulating film 19 is preferably greater than or equal to 150 nm and less than or equal to 400 nm.

<2. Method for Manufacturing Transistor>

Next, a method for manufacturing the transistor 10 illustrated in FIGS. 1A to 1C is described with reference to FIGS. 2A to 2C, FIGS. 3A to 3C, and FIGS. 4A to 4D. A cross-section in the channel length direction along dot-dashed line A1-A2 in FIG. 1A and a cross-section in the channel width direction along dot-dashed line A3-A4 in FIG. 1A are used in FIGS. 2A to 2C, FIGS. 3A to 3C, and FIGS. 4A to 4D to describe the method for manufacturing the transistor 10.

The films included in the transistor 10 (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute FET.

The conductive film 12 is formed over the substrate 11.

A formation method of the conductive film 12 is described below. First, a conductive film is formed by a sputtering method, a vacuum evaporation method, a pulsed laser deposition (PLD) method, a thermal CVD method, or the like and then a mask is formed over the conductive film by a lithography process. Next, the conductive film is partly etched using the mask to form the conductive film 12. After that, the mask is removed.

Note that the conductive film 12 may be formed by an electrolytic plating method, a printing method, an ink-jet method, or the like instead of the above formation method.

Alternatively, a tungsten film can be formed as the conductive film with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Here, a 100-nm-thick tungsten film is formed by a sputtering method. Next, a mask is formed by a lithography process, and the tungsten film is subjected to dry etching with the use of the mask to form the conductive film 12.

Figure 2A:
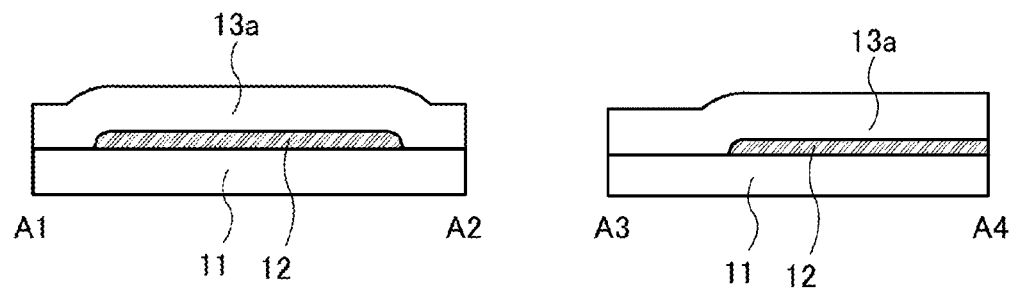
FIGS. 2A to 2C illustrate a method for forming a transistor.

After that, a base insulating film 13a is formed over the substrate 11 and the conductive film 12 (see FIG. 2A). Then, planarization treatment is performed on the base insulating film 13a so that the base insulating film 13 is formed (see FIG. 2B). As the planarization treatment, polishing treatment such as chemical mechanical polishing (CMP) or etching treatment can be performed, for example.

The base insulating film 13 is formed by a sputtering method, a CVD method, a vacuum evaporation method, a pulsed laser deposition (PLD) method, a thermal CVD method, or the like.

In the case of forming a silicon oxide film or a silicon oxynitride film as the base insulating film 13, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case where a gallium oxide film is formed as the base insulating film 13, a metal organic chemical vapor deposition (MOCVD) method can be used.

In the case where a hafnium oxide film is formed as the base insulating film 13 by a thermal CVD method such as an MOCVD method or an ALD method, two kinds of gases, i.e., ozone ($O_3$) as an oxidizer and a source material gas which is obtained by vaporizing liquid containing a solvent and a hafnium precursor compound (a hafnium alkoxide solution, which is typified by tetrakis(dimethylamide)hafnium (TDMAH)), are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as the base insulating film 13 by a thermal CVD method such as an MOCVD method or an ALD method, two kinds of gases, i.e., $H_2O$ as an oxidizer and a source material gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

Furthermore, in the case where a silicon oxide film is formed as the base insulating film 13 by a thermal CVD method such as an MOCVD method or an ALD method, hexachlorodisilane is adsorbed on a deposition surface, chlorine contained in the adsorbate is removed, and radicals of an oxidizing gas (e.g., $O_2$ or dinitrogen monoxide) are supplied to react with the adsorbate.

Here, a silicon oxynitride film formed by a PECVD method is used to form the base insulating film 13.

Figure 2B:
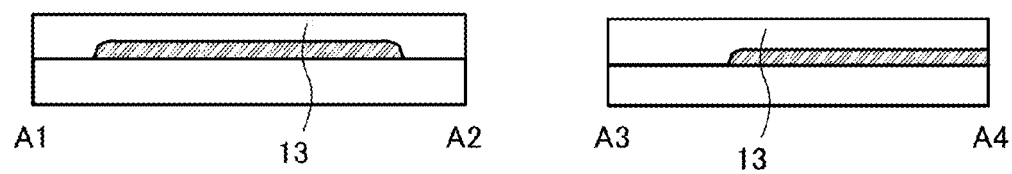
Figure 2C:
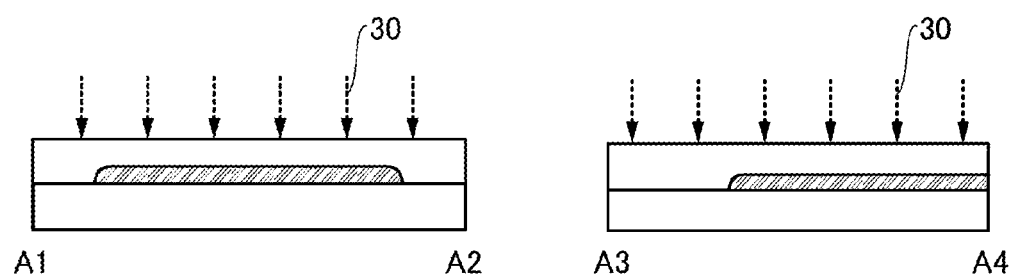

Next, oxygen 30 is added to the base insulating film 13 (see FIG. 2C). The oxygen 30 that is added to the base insulating film 13 includes at least one of an oxygen radical, an oxygen atom, an oxygen molecule, an oxygen atomic ion, and an oxygen molecule ion. As a method for adding the oxygen 30 to the base insulating film 13, an ion doping method, an ion implantation method, or the like is used.

Alternatively, the oxygen 30 may be added after the oxide semiconductor film 14 is formed. In the case where the oxygen 30 is added after the oxide semiconductor film 14 is formed, it is particularly preferred to add a cation of an oxygen molecule ($O_2^+$) to the oxide semiconductor film 14. With the use of $O_2^+$, acceleration voltage per atom can be half of that in the case of adding a cation of an oxygen atom ($O^+$), and the amount of oxygen that reaches the base insulating film 13 can be reduced. In addition, when $O_2^+$ is added, $O_2^+$ hits the outermost surface to split into $O^+$ and then, $O^+$ is dispersed; thus, oxygen can be added more uniformly than in the case of adding $O^+$.

Note that when oxygen is supplied from the base insulating film 13 to the pair of electrodes 15 and 16 in contact with the oxide semiconductor film 14, the volume of the pair of electrodes 15 and 16 might expand and the gate insulating film 17 over the pair of electrodes 15 and 16 might be cut, causing poor characteristics. To prevent this, the amount of oxygen that reaches the pair of electrodes 15 and 16 is preferably reduced.

Figure 3A:
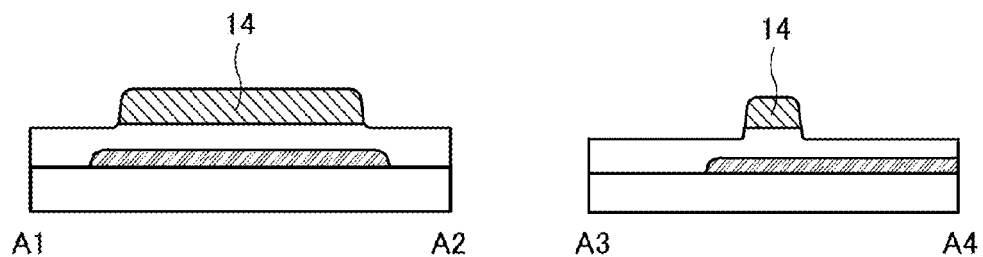
FIGS. 3A to 3C illustrate a method for forming a transistor.

Next, the oxide semiconductor film 14 is formed over the base insulating film 13 and in a region overlapping with the conductive film 12 (see FIG. 3A).

A formation method of the oxide semiconductor film 14 is described below. An oxide semiconductor film is formed over the base insulating film 13 by a sputtering method, a coating method, a pulsed laser deposition method, a laser ablation method, a thermal CVD method, or the like. Next, a conductive film is formed over the oxide semiconductor film and a mask is formed over the conductive film by a photolithography process. After that, the conductive film and the oxide semiconductor film are partly etched using the mask, whereby the element-isolated oxide semiconductor film 14 is formed at a position that is over the base insulating film 13 and partly overlapping with the conductive film 12. Then, the mask and the conductive film are removed. Note that for the conductive film, a film which has a high etching selectivity ratio with respect to the mask and with which a pattern can be easily formed even if the mask is thin is preferably used. Furthermore, it is preferable that the conductive film be not easily etched under the conditions where the oxide semiconductor film is etched because the conductive film is used as a mask when the oxide semiconductor film is etched. As the conductive film, a tungsten film can be used, for example.

The conductive film may be used to form the pair of electrodes 15 and 16 without being removed.

Alternatively, by using a printing method for forming the oxide semiconductor film 14, the oxide semiconductor film 14 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (argon for a typical example), an oxygen gas, or a mixed gas of a rare gas and oxygen is used as appropriate. In the case of the mixed gas of a rare gas and oxygen, the proportion of oxygen to a rare gas is preferably increased.

Furthermore, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., further preferably higher than or equal to 200° C. and lower than or equal to 350° C., the oxide semiconductor film can be a CAAC-OS film.

For the deposition of the CAAC-OS film, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a sputtering gas may be reduced. Specifically, a sputtering gas whose dew point is −80° C. or lower, preferably −100° C. or lower is used.

Furthermore, it is preferable that the proportion of oxygen in the sputtering gas be increased and the power be optimized in order to reduce plasma damage at the deposition. The proportion of oxygen in the sputtering gas is higher than or equal to 30 vol %, preferably 100 vol %.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By forming the oxide semiconductor film while it is heated or performing heat treatment after the formation of the oxide semiconductor film, the oxide semiconductor film can have a portion in which the hydrogen concentration is $2\times10^{20}$ atoms/cm$^3$ or lower, preferably $5\times10^{19}$ atoms/cm$^3$ or lower, further preferably $1\times10^{19}$ atoms/cm$^3$ or lower, still further preferably $5\times10^{18}$ atoms/cm$^3$ or lower, yet still further preferably $1\times10^{18}$ atoms/cm$^3$ or lower, yet still further preferably $5\times10^{17}$ atoms/cm$^3$ or lower, yet still further preferably $1\times10^{16}$ atoms/cm$^3$ or lower.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced two or more times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used. Instead of a Ga(CH$_3$)$_3$ gas, a Ga(C$_2$H$_5$)$_3$ gas may be used. Furthermore, a Zn(CH$_3$)$_2$ gas may be used.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen, whereby the oxide semiconductor film 14 is formed.

When the heat treatment is performed at temperatures higher than 350° C. and lower than or equal to 650° C., preferably higher than or equal to 450° C. and lower than or equal to 600° C., it is possible to obtain an oxide semiconductor film whose proportion of CAAC is greater than or equal to 70% and less than 100%, preferably greater than or equal to 80% and less than 100%, further preferably greater than or equal to 90% and less than 100%, still further preferably greater than or equal to 95% and less than or equal to 98%. Here, the proportion of CAAC is the proportion of a region where a diffraction pattern of a CAAC-OS film is observed in a predetermined area. Furthermore, it is possible to obtain an oxide semiconductor film having a low content of hydrogen, water, and the like. This means that an oxide semiconductor film with a low impurity concentration and a low density of defect states can be formed.

At the time of the etching for forming the oxide semiconductor film 14, a surface of the base insulating film 13 may be slightly etched so that a thin region is formed.

Figure 3B:
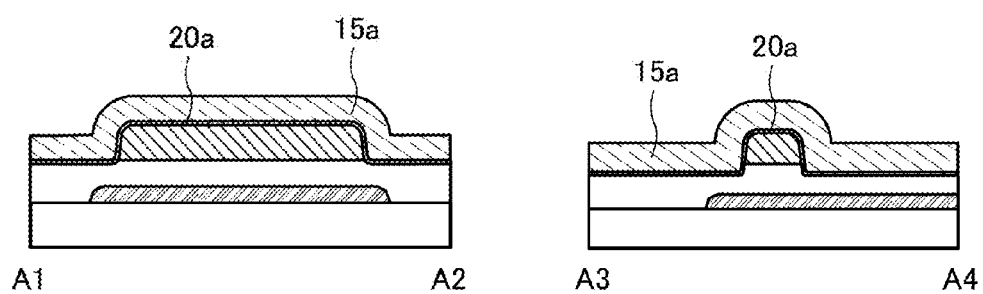

Next, a stack including an antioxidant film 20a and a conductive film 15a is formed over the base insulating film 13 and the oxide semiconductor film 14 (see FIG. 3B).

Figure 3C:
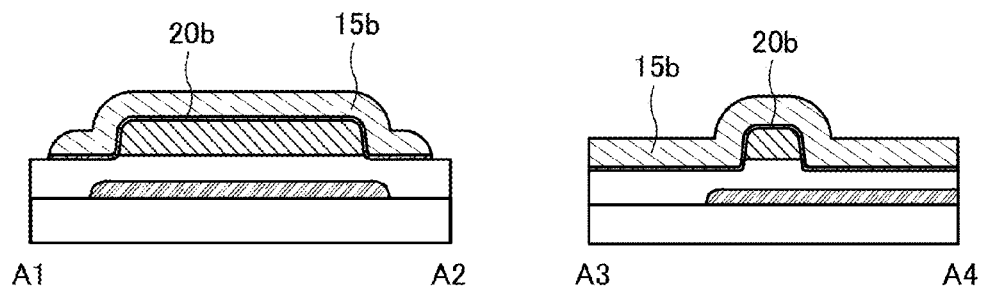

After that, the stack including the antioxidant film 20a and the conductive film 15a is etched so that a stack including an island-shaped antioxidant film 20b and an island-shaped conductive film 15b is formed (see FIG. 3C).

Figure 4A:
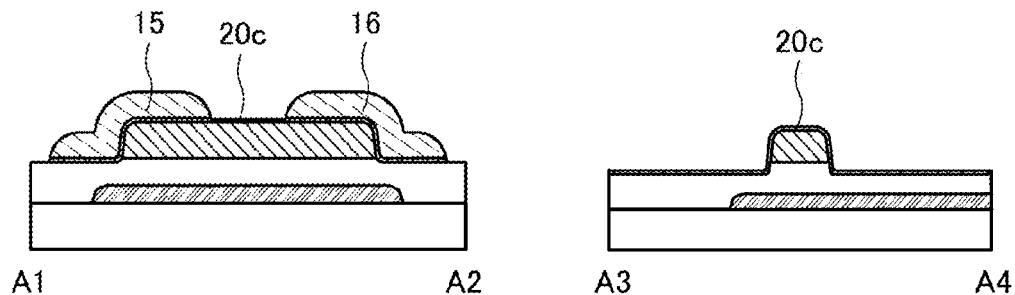
FIGS. 4A to 4D illustrate a method for forming a transistor.

Then, the stack including the island-shaped antioxidant film 20b and the island-shaped conductive film 15b is etched to form the pair of electrodes 15 and 16 and an antioxidant film 20c (see FIG. 4A). Note that at the time of the etching for forming a pair of electrodes, a surface of an antioxidant film may be slightly etched so that a thin region is formed.

Note that heat treatment may be performed after the pair of electrodes 15 and 16 is formed. For example, this heat treatment can be performed in a manner similar to that of the heat treatment performed after the oxide semiconductor film 14 is formed.

After the pair of electrodes 15 and 16 is formed, cleaning treatment is preferably performed to remove an etching residue. A short circuit of the pair of electrodes 15 and 16 can be suppressed by this cleaning treatment. The cleaning treatment can be performed using an alkaline solution such as a tetramethylammonium hydroxide (TMAH) solution; an acidic solution such as a hydrofluoric acid, an oxalic acid solution, or a phosphoric acid solution; or water.

Figure 4B:
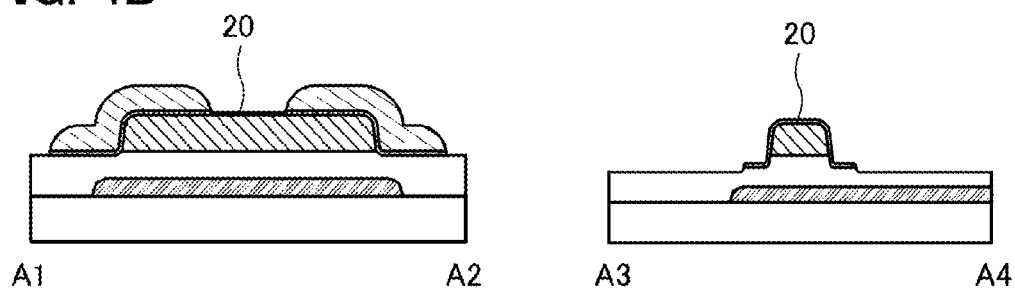

Then, a resist mask is formed over the antioxidant film 20c and the antioxidant film 20c is etched, so that the antioxidant film 20 is formed (see FIG. 4B). Note that at the time of the etching for forming the antioxidant film 20, the surface of the base insulating film 13 may be further etched, so that a thinner region is formed. At this time, in the antioxidant film 20, the width of a region overlapping with the pair of electrodes 15 and 16 at this time is longer than the width of a region not overlapping with the pair of electrodes 15 and 16.

Figure 4C:
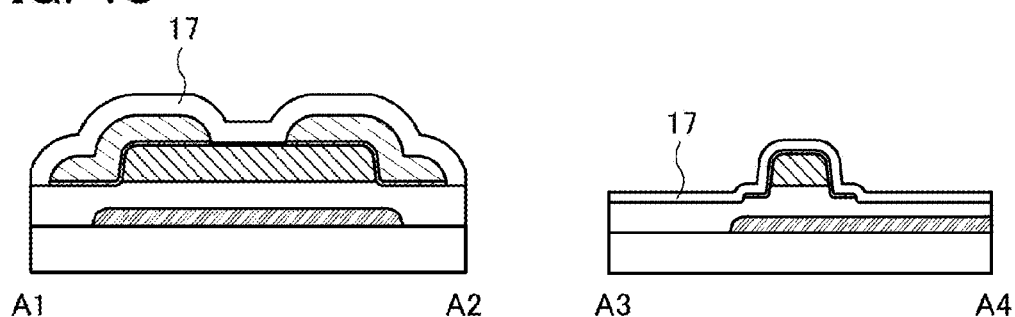

After that, the gate insulating film 17 is formed over the antioxidant film 20 and the pair of electrodes 15 and 16 (see FIG. 4C). For a material and a formation method of the gate insulating film 17, refer to those of the base insulating film 13.

Subsequently, the gate electrode 18 is formed so as to overlap with the oxide semiconductor film 14 with the gate insulating film 17 provided therebetween. For a material and a formation method of the gate electrode 18, refer to those of the conductive film 12. To electrically connect the gate electrode 18 to the conductive film 12 as in FIG. 4D, an opening that reaches the conductive film 12 is formed in the gate insulating film 17 and the base insulating film 13 and then, the gate electrode 18 is formed.

Figure 4D:
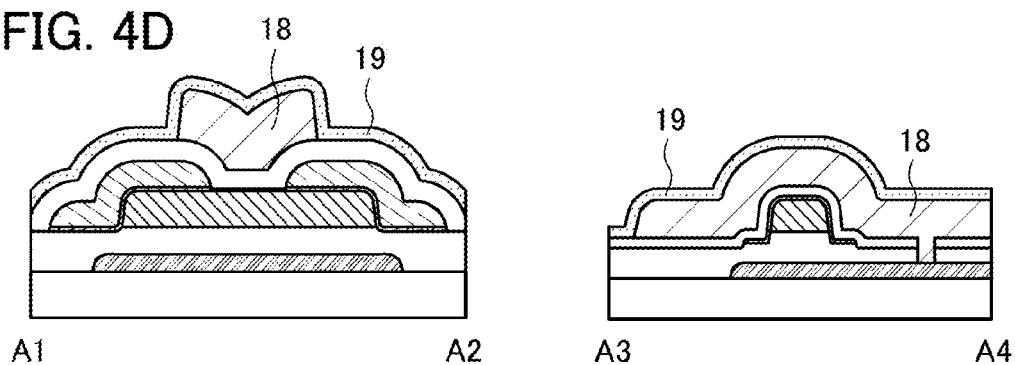

Next, the insulating film 19 is formed over the gate insulating film 17 and the gate electrode 18 (see FIG. 4D). The insulating film 19 can be formed by a sputtering method, a CVD method, an evaporation method, or the like.

In the case where an oxide insulating film containing nitrogen and having a small number of defects is formed as the insulating film 19, a silicon oxynitride film can be formed by a CVD method as an example of the oxide insulating film. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

The oxide insulating film containing nitrogen and having a small number of defects can be formed by a CVD method under the conditions where the ratio of an oxidizing gas to a deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

Here, a silicon oxynitride film is formed by a PECVD method under the conditions where the substrate 11 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

Next, heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. By the heat treatment, water, hydrogen, and the like contained in the insulating film 19 can be released.

Here, heat treatment is performed at 350° C. in a mixed atmosphere containing nitrogen and oxygen for one hour.

Through the above steps, a transistor in which a shift in threshold voltage is reduced can be manufactured. Further, a transistor in which a change in electrical characteristics is reduced can be manufactured.

Modification Example 1

Modification examples of the transistor 10 described in this embodiment are described with reference to FIGS. 5A to 5C and FIGS. 6A to 6C. The transistor 10 described in this embodiment includes the single-layer oxide semiconductor film; in contrast, a transistor 10a and a transistor 10b described in this modification example each includes a multi-layer film.

Figure 5A:
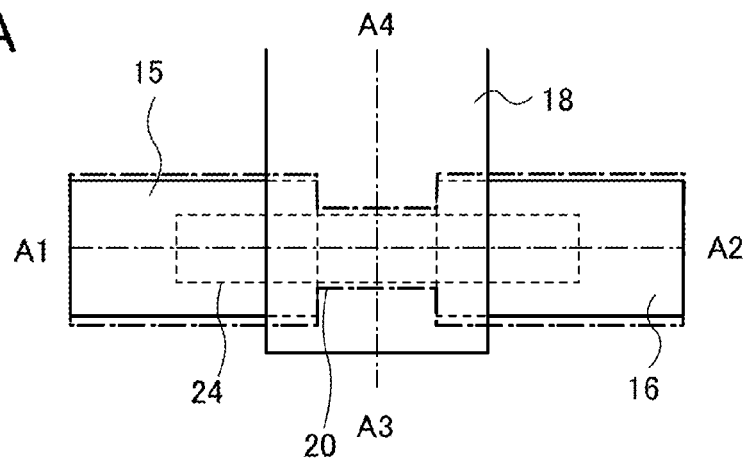
FIGS. 5A to 5C are a top view and cross-sectional views illustrating a transistor.
Figure 5B:
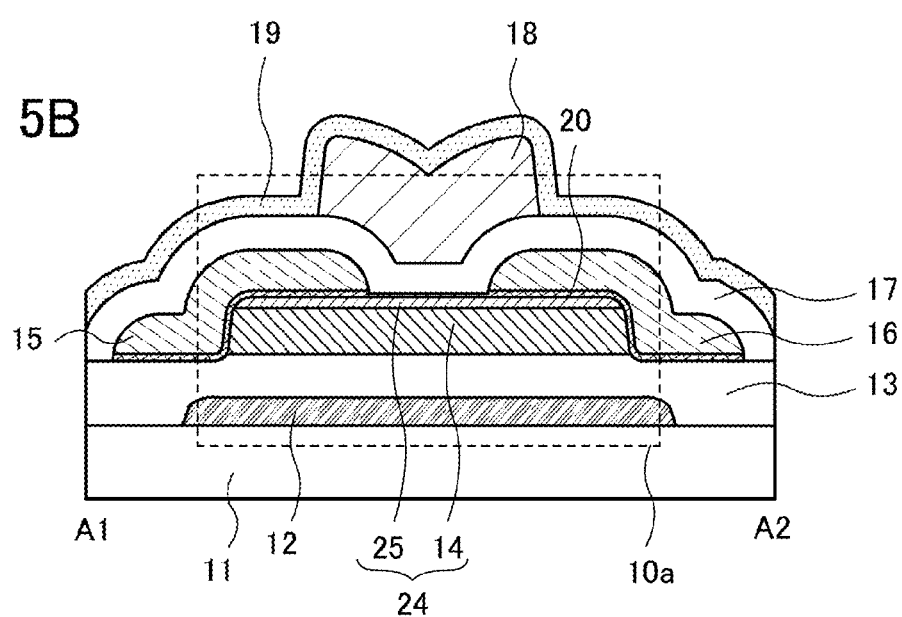
Figure 5C:
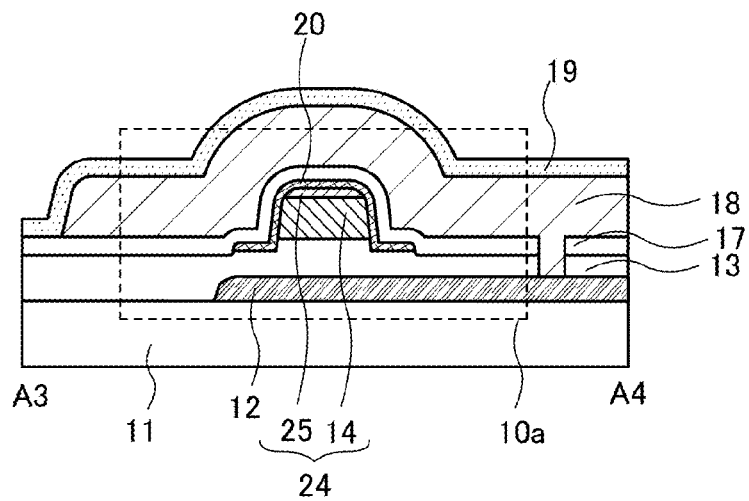

FIGS. 5A to 5C are a top view and cross-sectional views of the transistor 10a included in a semiconductor device. FIG. 5A is a top view of the transistor 10a, FIG. 5B is a cross-sectional view taken along dashed-dotted line A1-A2 in FIG. 5A, and FIG. 5C is a cross-sectional view taken along dashed-dotted line A3-A4 in FIG. 5A. In FIGS. 5A to 5C, some components are enlarged, reduced in size, or omitted for easy understanding.

The transistor 10a illustrated in FIGS. 5A to 5C differs from the transistor 10 in that a multilayer film 24 is provided instead of the oxide semiconductor film 14.

In the transistor 10a described in this embodiment, the multilayer film 24 includes the oxide semiconductor film 14 and an oxide semiconductor film 25. That is, the multilayer film 24 has a two-layer structure. Furthermore, part of the oxide semiconductor film 14 serves as a channel region.

The oxide semiconductor film 25 contains one or more elements that form the oxide semiconductor film 14. Thus, interface scattering is unlikely to occur at the interface between the oxide semiconductor film 14 and the oxide semiconductor film 25. Thus, the transistor can have high field-effect mobility because the movement of carriers is not hindered at the interfaces.

The oxide semiconductor film 25 is formed using a metal oxide containing at least In or Zn. Typical examples of the metal oxide include an In—Ga oxide, an In—Zn oxide, an In—Mg oxide, a Zn—Mg oxide, and an In-M-Zn oxide (M represents Al, Ga, Sn, Y, Zr, La, Ce, Mg, or Nd). The conduction band minimum of the oxide semiconductor film 25 is closer to a vacuum level than that of the oxide semiconductor film 14 is; as a typical example, the energy difference between the conduction band minimum of the oxide semiconductor film 25 and the conduction band minimum of the oxide semiconductor film 14 is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 25 and the electron affinity of the oxide semiconductor film 14 is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 25 preferably contains In because carrier mobility (electron mobility) can be increased.

When the oxide semiconductor film 25 contains a larger amount of Al, Ga, Sn, Y, Zr, La, Ce, Mg, or Nd than the amount of In in an atomic ratio, any of the following effects may be obtained: (1) the energy gap of the oxide semiconductor film 25 is widened; (2) the electron affinity of the oxide semiconductor film 25 decreases; (3) impurity diffusion from the outside is suppressed; (4) an insulating property of the oxide semiconductor film 25 increases as compared to that of the oxide semiconductor film 14; and (5) oxygen vacancies are less likely to be generated in the oxide semiconductor film 25 containing a larger amount of Al, Ga, Sn, Y, Zr, La, Ce, Mg, or Nd in an atomic ratio than the amount of In in an atomic ratio because Al, Ga, Sn, Y, Zr, La, Ce, Mg, and Nd are metal elements which are strongly bonded to oxygen.

In the case of using an In-M-Zn oxide for the oxide semiconductor film 25, when Zn and O are not taken into consideration, the proportion of In and the proportion of M are preferably less than 50 atomic % and greater than or equal to 50 atomic %, respectively, more preferably less than 25 atomic % and greater than or equal to 75 atomic %, respectively.

Furthermore, in the case where each of the oxide semiconductor films 14 and 25 contain an In-M-Zn oxide (M represents Al, Ga, Sn, Y, Zr, La, Ce, Mg, or Nd), the proportion of M atoms in the oxide semiconductor film 25 is higher than that in the oxide semiconductor film 14. As a typical example, the proportion of M in the oxide semiconductor film 25 is 1.5 times or more, preferably twice or more, and more preferably three times or more as high as that in the oxide semiconductor film 14.

Furthermore, in the case where each of the oxide semiconductor films 14 and 25 contains an In-M-Zn oxide (M represents Al, Ga, Sn, Y, Zr, La, Ce, Mg, or Nd), when In:M:Zn=$x_1$:$y_1$:$z_1$ [atomic ratio] is satisfied in the oxide semiconductor film 25 and In:M:Zn=$x_2$:$y_2$:$z_2$ [atomic ratio] is satisfied in the oxide semiconductor film 14, $y_1/x_1$ is higher than $y_2/x_2$, and preferably, $y_1/x_1$ be 1.5 or more times as high as $y_2/x_2$. Alternatively, $y_1/x_1$ is preferably twice or more as high as $y_2/x_2$. Further alternatively, $y_1/x_1$ is preferably three or more times as high as $y_2/x_2$. In this case, it is preferable that in the oxide semiconductor film, $y_2$ be higher than or equal to $x_2$ because a transistor including the oxide semiconductor film can have stable electrical characteristics. However, when $y_2$ is three or more times as large as $x_2$, the field-effect mobility of the transistor including the oxide semiconductor film is reduced; accordingly, $y_2$ is preferably smaller than three times $x_2$.

In the case where the oxide semiconductor film 14 contains an In-M-Zn oxide (M is Al, Ga, Sn, Y, Zr, La, Ce, Mg, or Nd) and a target having the atomic ratio of metal elements of In:M:Zn=$x_1$:$y_1$:$z_1$ is used for forming the oxide semiconductor film 14, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 14 is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 25 contains an In-M-Zn oxide (M is Al, Ga, Y, Zr, La, Ce, Mg, or Nd) and a target having the atomic ratio of metal elements of In:M:Zn=$x_2$:$y_2$:$z_2$ is used for forming the oxide semiconductor film 25, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 25 is easily formed. Typical examples of the atomic ratio of the metal elements of the target are In:M:Zn=1:3:2, In:M:Zn=1:3:4, In:M:Zn=1:3:6, In:M:Zn=1:3:8, and the like.

Note that the proportion of each metal element in the atomic ratio of each of the oxide semiconductor films 14 and 25 varies within a range of ±40% of that in the above atomic ratio as an error.

The thickness of the oxide semiconductor film 25 is greater than or equal to 3 nm and less than or equal to 100 nm, preferably greater than or equal to 3 nm and less than or equal to 50 nm.

The oxide semiconductor film 25 may have a non-single-crystal structure, for example, like the oxide semiconductor film 14. The non-single crystal structure includes a CAAC-OS that is described later, a polycrystalline structure, a microcrystalline structure described later, or an amorphous structure, for example.

The oxide semiconductor film 25 may have an amorphous structure, for example. An amorphous oxide semiconductor film has, for example, disordered atomic arrangement and no crystalline component. Alternatively, an amorphous oxide semiconductor film has, for example, an absolutely amorphous structure and no crystal part.

Note that the oxide semiconductor films 14 and 25 may each be a mixed film including two or more of the following: a region having an amorphous structure, a region having a microcrystalline structure, a region having a polycrystalline structure, a region of CAAC-OS, and a region having a single-crystal structure. The mixed film includes, for example, two or more of a region having an amorphous structure, a region having a microcrystalline structure, a region having a polycrystalline structure, a CAAC-OS region, and a region having a single-crystal structure, in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

In this case, the oxide semiconductor film 25 is provided between the oxide semiconductor film 14 and the gate insulating film 17. Thus, if trap levels are formed in a region between the oxide semiconductor film 25 and the gate insulating film 17 by impurities and defects, electrons flowing in the oxide semiconductor film 14 are less likely to be trapped by the trap levels because there is a distance between the oxide semiconductor film 14 and the region. Accordingly, the amount of on-state current of the transistor can be increased, and the field-effect mobility can be increased. When the electrons are trapped by the trap levels, the electrons become negative fixed charges. As a result, the threshold voltage of the transistor varies. However, by the distance between the oxide semiconductor film 14 and the region, trap of the electrons by the trap levels can be reduced, and accordingly fluctuations of the threshold voltage can be reduced.

The oxide semiconductor film 25 can block impurities from the outside, and accordingly, the amount of impurities that are transferred from the outside to the oxide semiconductor film 14 can be reduced. Furthermore, an oxygen vacancy is less likely to be formed in the oxide semiconductor film 25. Consequently, the impurity concentration and the number of oxygen vacancies in the oxide semiconductor film 14 can be reduced.

Note that the oxide semiconductor films 14 and 25 are not formed by simply stacking each film, but are formed to form a continuous junction (here, in particular, a structure in which the conduction band minimum is changed continuously between each film). In other words, a stacked-layer structure in which there exists no impurity that forms a defect level such as a trap center or a recombination center at each interface is provided. If an impurity exists between the oxide semiconductor films 14 and 25 that are stacked, a continuity of the energy band is damaged, and the carrier is trapped or recombined at the interface and then disappears.

To form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of gas, especially gas containing carbon or hydrogen from an exhaust system to the inside of the chamber.

Figure 6A:
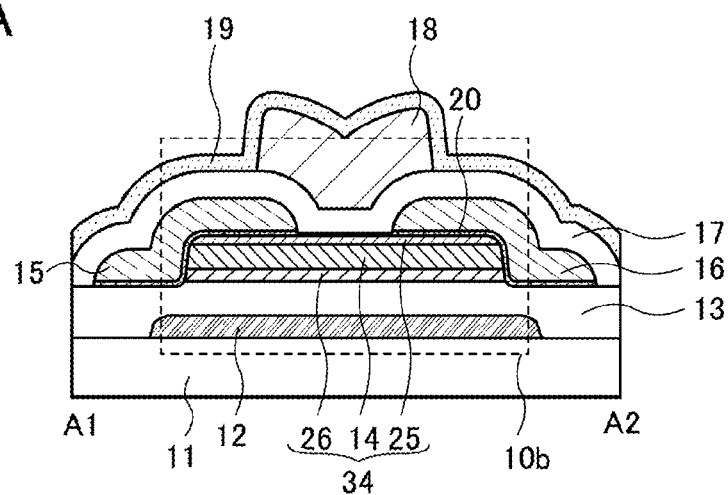
FIGS. 6A to 6C are cross-sectional views each illustrating a transistor.

Note that a multilayer film 34 in the transistor 10b illustrated in FIG. 6A may be included instead of the multilayer film 24.

An oxide semiconductor film 26, the oxide semiconductor film 14, and the oxide semiconductor film 25 are stacked in this order in the multilayer film 34. That is, the multilayer film 34 has a three-layer structure. Furthermore, the oxide semiconductor film 14 serves as a channel region.

Furthermore, the base insulating film 13 is in contact with the oxide semiconductor film 26. This means that the oxide semiconductor film 26 is provided between the base insulating film 13 and the oxide semiconductor film 14.

The gate insulating film 17 is in contact with the oxide semiconductor film 25. In other words, the oxide semiconductor film 25 is provided between the gate insulating film 17 and the oxide semiconductor film 14.

The oxide semiconductor film 26 can be formed using a material and a formation method similar to those of the oxide semiconductor film 25.

It is preferable that the thickness of the oxide semiconductor film 26 be smaller than that of the oxide semiconductor film 14. When the thickness of the oxide semiconductor film 26 is greater than or equal to 1 nm and less than or equal to 5 nm, preferably greater than or equal to 1 nm and less than or equal to 3 nm, a variation in the threshold voltage of the transistor can be reduced.

In the transistors described in this embodiment, the oxide semiconductor film 26 is provided between the oxide semiconductor film 14 and the base insulating film 13. Thus, if trap levels are formed in a region between the oxide semiconductor film 26 and the base insulating film 13 by impurities and defects, electrons flowing in the oxide semiconductor film 14 are less likely to be trapped by the trap levels because there is a distance between the oxide semiconductor film 14 and the region. Accordingly, the amount of on-state current of the transistor can be increased, and the field-effect mobility can be increased. When the electrons are trapped by the trap levels, the electrons become negative fixed charges. As a result, the threshold voltage of the transistor varies. However, by the distance between the oxide semiconductor film 14 and the region, trap of the electrons by the trap levels can be reduced, and accordingly fluctuations of the threshold voltage can be reduced.

The oxide semiconductor film 26 can block entry of impurities from the outside, and accordingly, the amount of impurities transferred to the oxide semiconductor film 14 from the outside can be reduced. Furthermore, an oxygen vacancy is less likely to be formed in the oxide semiconductor film 26. Consequently, the impurity concentration and the number of oxygen vacancies in the oxide semiconductor film 14 can be reduced.

The oxide semiconductor film 25 is provided between the gate insulating film 17 and the oxide semiconductor film 14, and the oxide semiconductor film 26 is provided between the oxide semiconductor film 14 and the base insulating film 13. Thus, it is possible to reduce the concentration of silicon or carbon in the vicinity of the interface between the oxide semiconductor film 25 and the oxide semiconductor film 14, in the oxide semiconductor film 14, or in the vicinity of the interface between the oxide semiconductor film 26 and the oxide semiconductor film 14.

The transistor 10b having such a structure includes very few defects in the multilayer film 34 including the oxide semiconductor film 14; thus, the electrical characteristics, typified by the on-state current and the field-effect mobility, of these transistors can be improved. Further, in a gate BT stress test and a gate BT photostress test that are examples of a stress test, a variation in threshold voltage is small, and thus, reliability is high.

Figure 6B:
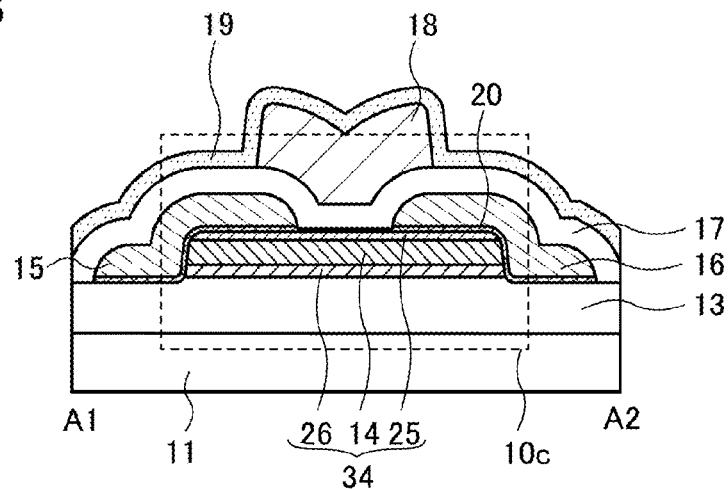

As in a transistor 10c illustrated in FIG. 6B, a structure in which the conductive film 12 is not provided may be employed.

Figure 6C:
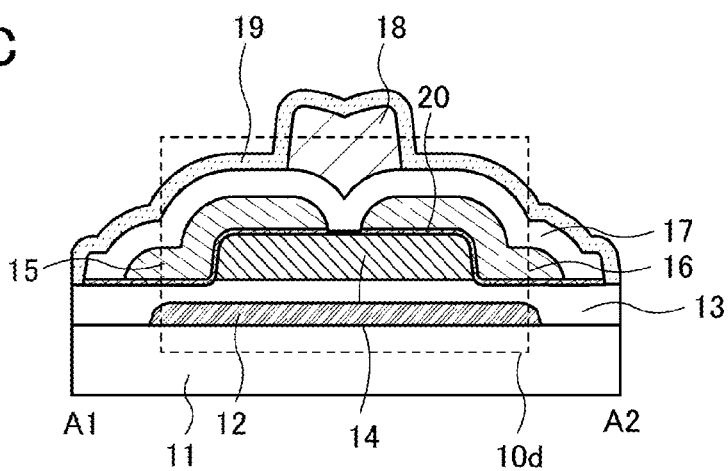

Alternatively, a structure of a transistor 10d illustrated in FIG. 6C may be employed.

Modification Example 2

A modification example of the transistor 10 described in this embodiment is described with reference to FIGS. 7A to 7C. In this modification example, a transistor in which an oxide semiconductor film is provided between a gate insulating film and a pair of electrodes is described.

Figure 7A:
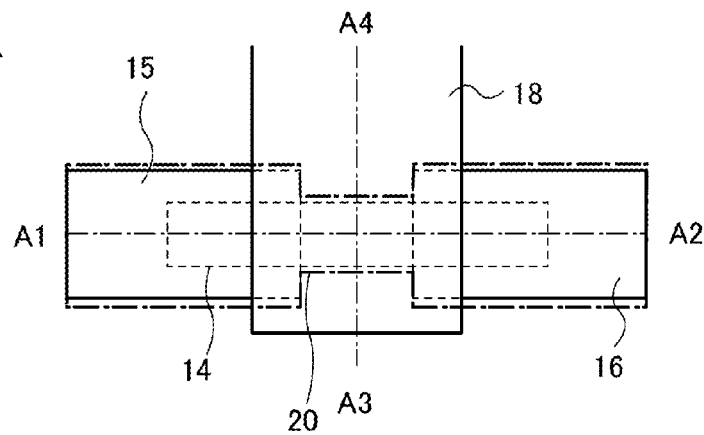
FIGS. 7A to 7C are a top view and cross-sectional views illustrating a transistor.
Figure 7B:
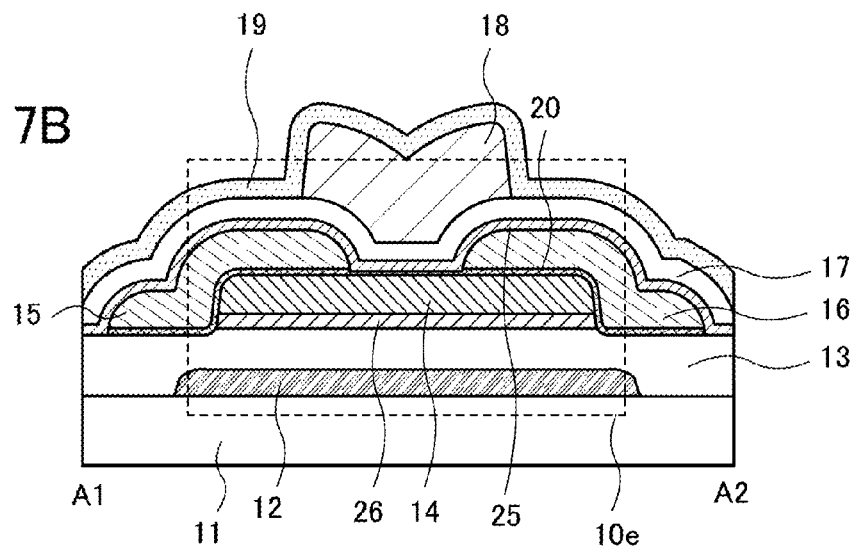
Figure 7C:
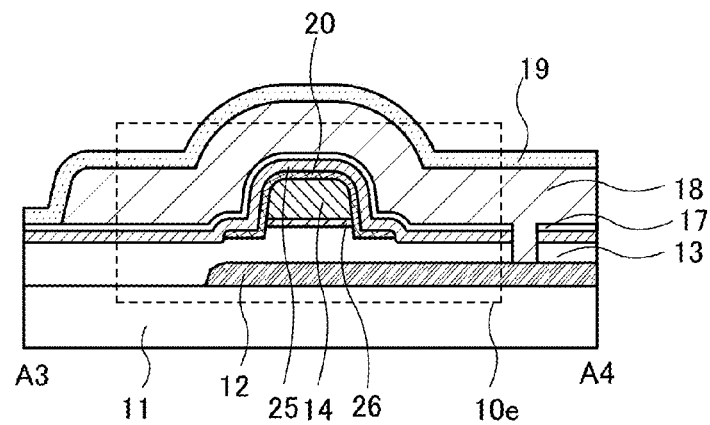

FIGS. 7A to 7C are a top view and cross-sectional views of a transistor 10e included in a semiconductor device of one embodiment of the present invention. FIG. 7A is a top view, FIG. 7B is a schematic cross-sectional view taken along dot-dashed line A1-A2 in FIG. 7A, and FIG. 7C is a schematic cross-sectional view taken along dot-dashed line A3-A4 in FIG. 7A. In FIGS. 7A to 7C, some components are enlarged, reduced in size, or omitted for easy understanding.

The transistor 10e illustrated in FIG. 7A includes the conductive film 12 over the substrate 11, the base insulating film 13 over the substrate 11 and the conductive film 12, the oxide semiconductor film 26 over the base insulating film 13, the oxide semiconductor film 14 over the oxide semiconductor film 26, the antioxidant film 20 which is over the base insulating film 13 and the oxide semiconductor film 26 and is in contact with the oxide semiconductor film 14, the pair of electrodes 15 and 16 over the antioxidant film 20, the oxide semiconductor film 25 in contact with the antioxidant film 20 and the pair of electrodes 15 and 16, the gate insulating film 17 over the oxide semiconductor film 25, and the gate electrode 18 overlapping with the oxide semiconductor film 14 with the gate insulating film 17 provided therebetween. An insulating film 19 may be formed over the gate insulating film 17 and the gate electrode 18.

As illustrated in FIG. 7B, the oxide semiconductor film 25 is in contact with the top surface of the antioxidant film 20 and the top and side surfaces of the pair of electrodes 15 and 16. As illustrated in FIG. 7C, the oxide semiconductor film 25 is in contact with part of the top surface of the base insulating film 13.

As illustrated in FIG. 7C, in the channel width direction of the transistor 10e, the gate electrode 18 faces the top surfaces and side surfaces of the oxide semiconductor film 14 and the oxide semiconductor film 26 with the gate insulating film 17 provided therebetween.

The gate electrode 18 electrically surrounds the oxide semiconductor film 14. With this structure, on-state current of the transistor 10e can be increased. Such a transistor structure is referred to as a surrounded channel (s-channel) structure. Note that in the s-channel structure, current flows in the whole (bulk) of the oxide semiconductor film 14. Since current flows in an inner part of the oxide semiconductor film 14, the current is hardly affected by interface scattering, and high on-state current can be obtained. In addition, by making the oxide semiconductor film 14 thick, on-state current can be increased.

In fabricating a transistor with a small channel length and a small channel width, when a pair of electrodes, an oxide semiconductor film, or the like is processed while a resist mask is reduced in size, the pair of electrodes, the oxide semiconductor film, or the like has a round end portion (curved surface) in some cases. With this structure, the coverage with the oxide semiconductor film 25 and the gate insulating film 17, which are to be formed over the oxide semiconductor film 14, can be improved. In addition, electric field concentration which might occur at the edges of the pair of electrodes 15 and 16 can be relaxed, which can suppress deterioration of the transistor.

In addition, by miniaturizing the transistor, higher integration and higher density can be achieved. For example, the channel length of the transistor is set to 100 nm or less, preferably 40 nm or less, further preferably 30 nm or less, still further preferably 20 nm or less, and the channel width of the transistor is set to 100 nm or less, preferably 40 nm or less, further preferably 30 nm or less, still further preferably 20 nm or less. The transistor of one embodiment of the present invention with the s-channel structure can increase on-state current even in the case where the channel width thereof is shortened as described above.

High integration of a semiconductor device requires miniaturization of a transistor. However, it is known that miniaturization of transistors causes deterioration in electrical characteristics of the transistor. A decrease in channel width causes a reduction in on-state current.

However, in the transistor of one embodiment of the present invention, as described above, the oxide semiconductor film 25 is formed to cover the channel formation region of the oxide semiconductor film 14, and the channel formation region and the gate insulating film 17 are not in contact with each other. Therefore, scattering of carriers formed at the interface between the oxide semiconductor film 14 and the gate insulating film 17 can be suppressed, whereby on-state current of the transistor can be increased.

In the case where an oxide semiconductor film is made intrinsic or substantially intrinsic, decrease in the number of carriers contained in the oxide semiconductor film may reduce the field-effect mobility. However, in the transistor of one embodiment of the present invention, a gate electric field is applied to the oxide semiconductor film 14 not only in the vertical direction but also from the side surfaces. That is, the gate electric field is applied to the whole of the oxide semiconductor film 14, whereby current flows in the bulk of the oxide semiconductor films. It is thus possible to improve the field-effect mobility of the transistor while a change in electrical characteristics is reduced by highly purified intrinsic properties.

In the transistor of one embodiment of the present invention, the oxide semiconductor film 14 is formed over the oxide semiconductor film 26, so that an interface state is less likely to be formed. In addition, impurities do not enter the oxide semiconductor film 14 from above and below because the oxide semiconductor film 14 are provided between the oxide semiconductor films 25 and 26. Thus, the oxide semiconductor film 14 is surrounded by the oxide semiconductor film 26 and the oxide semiconductor film 25 (also electrically surrounded by the gate electrode 18), so that stabilization of the threshold voltage in addition to the above-described improvement of on-state current of the transistor is possible. As a result, current flowing between the source and the drain when the voltage of the gate electrode is 0 V can be reduced, which leads to lower power consumption. Further, the threshold voltage of the transistor becomes stable; thus, long-term reliability of the semiconductor device can be improved.

Note that the structures, methods, and the like described in this embodiment can be used as appropriate in combination with any of the structures, methods, and the like described in the other embodiments and examples.

<Band Structure of Transistor>

Next, band structures of the multilayer film 24 included in the transistor 10a illustrated in FIGS. 5A to 5C and the multilayer film 34 included in the transistor 10b illustrated in FIG. 6A will be described with reference to FIGS. 8A to 8D.

Here, for example, an In—Ga—Zn oxide having an energy gap of 3.15 eV is used for the oxide semiconductor film 14, and an In—Ga—Zn oxide having an energy gap of 3.5 eV is used for the oxide semiconductor film 25. The energy gaps are measured using a spectroscopic ellipsometer (UT-300 manufactured by HORIBA JOBIN YVON SAS).

The energy difference between the vacuum level and the valence band maximum (also called ionization potential) of the oxide semiconductor film 14 and the energy difference between the vacuum level and the valence band maximum of the oxide semiconductor film 25 are 8 eV and 8.2 eV, respectively. Note that the energy difference between the vacuum level and the valence band maximum is measured using an ultraviolet photoelectron spectroscopy (UPS) device (VersaProbe manufactured by ULVAC-PHI, Inc.).

Thus, the energy difference between the vacuum level and the conduction band minimum (also called electron affinity) of the oxide semiconductor film 14 and the energy difference between the vacuum level and the conduction band minimum of the oxide semiconductor film 25 are 4.85 eV and 4.7 eV, respectively.

Figure 8A:
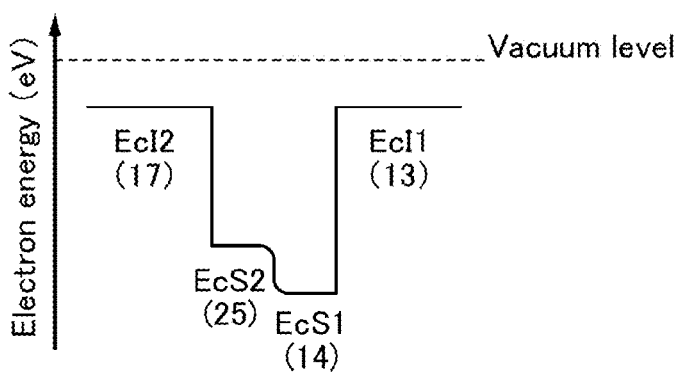
FIGS. 8A to 8D each show a band structure of a transistor.

FIG. 8A schematically illustrates a part of the band structure of the multilayer film 24 included in the transistor 10a. Here, the case where silicon oxide films are used for the base insulating film 13 and the gate insulating film 17 and the silicon oxide films are provided in contact with the multilayer film 24 is described. In FIG. 8A, EcI1 denotes the conduction band minimum of the silicon oxide film; EcS1 denotes the conduction band minimum of the oxide semiconductor film 14; EcS2 denotes the conduction band minimum of the oxide semiconductor film 25; and EcI2 denotes the conduction band minimum of the silicon oxide film. Furthermore, EcI1 and EcI2 correspond to the base insulating film 13 and the gate insulating film 17 in FIG. 5B, respectively.

As illustrated in FIG. 8A, the conduction band minimum gradually changes between the oxide semiconductor films 14 and 25. In other words, the conduction band minimum is continuously changed. This is because the multilayer film 24 contains an element contained in the oxide semiconductor film 14 and oxygen is transferred between the oxide semiconductor films 14 and 25, so that a mixed layer is formed.

As shown in FIG. 8A, the oxide semiconductor film 14 in the multilayer film 24 serves as a well and a channel region of the transistor including the multilayer film 24 is formed in the oxide semiconductor film 14. Note that since the conduction band minimum of the multilayer film 24 is continuously changed, it can be said that a continuous junction is formed between the oxide semiconductor films 14 and 25.

Although trap levels due to impurities or defects might be generated in the vicinity of the interface between the oxide semiconductor film 25 and the gate insulating film 17 as shown in FIG. 8A, the oxide semiconductor film 14 can be distanced from the region where the trap levels are generated owing to the existence of the oxide semiconductor film 25. However, when the energy difference between EcS1 and EcS2 is small, an electron in the oxide semiconductor film 14 might reach the trap level across the energy difference. When the electron is trapped by the trap level, a negative fixed charge is generated at the interface with the gate insulating film, whereby the threshold voltage of the transistor shifts in the positive direction. Thus, it is preferable that the energy difference between EcS1 and EcS2 be 0.1 eV or more, further preferably 0.15 eV or more, because a change in the threshold voltage of the transistor is reduced and stable electrical characteristics are obtained.

Figure 8B:
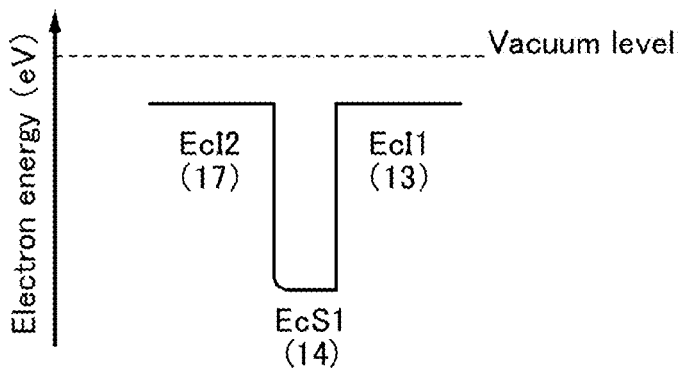

FIG. 8B schematically illustrates a part of the band structure of the multilayer film 24 of the transistor 10a, which is a variation of the band structure shown in FIG. 8A. Here, a structure where silicon oxide films are used for the base insulating film 13 and the gate insulating film 17 and the silicon oxide films are in contact with the multilayer film 24 is described. In FIG. 8B, EcI1 denotes the conduction band minimum of the silicon oxide film; EcS1 denotes the conduction band minimum of the oxide semiconductor film 14; and EcI2 denotes the conduction band minimum of the silicon oxide film. Further, EcI1 and EcI2 correspond to the base insulating film 13 and the gate insulating film 17 in FIG. 5B, respectively.

In the transistor illustrated in FIG. 5B, an upper portion of the multilayer film 24, that is, the oxide semiconductor film 25 might be etched in formation of the pair of electrodes 15 and 16. Furthermore, a mixed layer of the oxide semiconductor films 14 and 25 is likely to be formed on the top surface of the oxide semiconductor film 14 in formation of the oxide semiconductor film 25.

For example, Ga content in the oxide semiconductor film 25 is higher than that in the oxide semiconductor film 14 in the case where the oxide semiconductor film 14 is an oxide semiconductor film formed with use of, as a sputtering target, an In—Ga—Zn oxide whose atomic ratio of In to Ga and Zn is 1:1:1 or 3:1:2, and the oxide semiconductor film 25 is an oxide film formed with use of, as a sputtering target, an In—Ga—Zn oxide whose atomic ratio of In to Ga and Zn is 1:3:2, 1:3:4, 1:3:6, or 1:4:5. Thus, a GaO' layer or a mixed layer whose Ga content is higher than that in the oxide semiconductor film 14 can be formed on the top surface of the oxide semiconductor film 14.

For that reason, even in the case where the oxide semiconductor film 25 is etched, the conduction band minimum EcS1 on the EcI2 side is increased, and the band structure shown in FIG. 8B can be obtained in some cases.

As in the band structure shown in FIG. 8B, in observation of a cross section of a channel region, only the oxide semiconductor film 14 in the multilayer film 24 is apparently observed in some cases. However, a mixed layer that contains Ga more than the oxide semiconductor film 14 is formed over the oxide semiconductor film 14 in fact, and thus the mixed layer can be regarded as a 1.5-th layer. Note that the mixed layer can be confirmed by analyzing a composition in the upper portion of the oxide semiconductor film 14, when the elements contained in the multilayer film 24 are measured by an EDX analysis, for example. The mixed layer can be confirmed, for example, in such a manner that the Ga content in the composition in the upper portion of the oxide semiconductor film 14 is larger than the Ga content in the oxide semiconductor film 14.

Figure 8C:
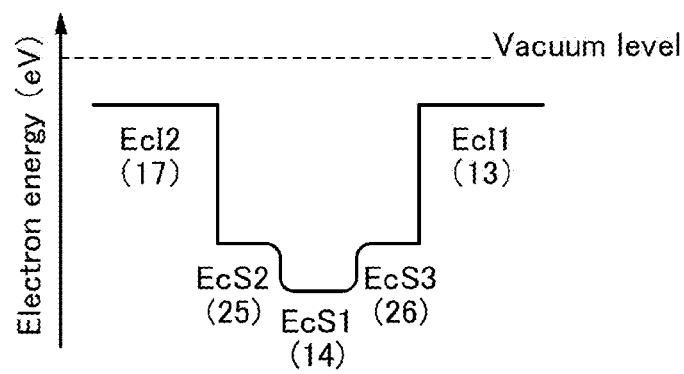

FIG. 8C schematically illustrates a part of the band structure of the multilayer film 34 of the transistor 10b. Here, the case where silicon oxide films are used for the base insulating film 13 and the gate insulating film 17 and the silicon oxide films are in contact with the multilayer film 34 is described. In FIG. 8C, EcI1 denotes the conduction band minimum of the silicon oxide film; EcS1 denotes the conduction band minimum of the oxide semiconductor film 14; EcS2 denotes the conduction band minimum of the oxide semiconductor film 25; EcS3 denotes the conduction band minimum of the oxide semiconductor film 26; and EcI2 denotes the conduction band minimum of the silicon oxide film. Furthermore, EcI1 and EcI2 correspond to the base insulating film 13 and the gate insulating film 17 in FIG. 6A, respectively.

As illustrated in FIG. 8C, there is no energy barrier between the oxide semiconductor films 26, 14, and 25, and the conduction band minimums thereof smoothly vary. In other words, the conduction band minimums are continuous. This is because the multilayer film 34 contains an element contained in the oxide semiconductor film 14 and oxygen is transferred between the oxide semiconductor films 14 and 26 and between the oxide semiconductor films 14 and 25, so that a mixed layer is formed.

As shown in FIG. 8C, the oxide semiconductor film 14 in the multilayer film 34 serves as a well and a channel region of the transistor including the multilayer film 34 is formed in the oxide semiconductor film 14. Note that since the conduction band minimum of the multilayer film 34 is continuously changed, it can be said continuous junctions are formed between the oxide semiconductor films 26 and 14 and between the oxide semiconductor films 25 and 14.

Although trap levels due to impurities or defects might be generated in the vicinity of the interface between the oxide semiconductor film 14 and the gate insulating film 17 and in the vicinity of the interface between the oxide semiconductor film 14 and the base insulating film 13, as illustrated in FIG. 8C, the oxide semiconductor film 14 can be distanced from the region where the trap levels are generated owing to the existence of the oxide semiconductor films 25 and 26.

However, when the energy difference between EcS1 and EcS2 and the energy difference between EcS1 and EcS3 are small, electrons in the oxide semiconductor film 14 might reach the trap level across the energy difference. When the electrons are trapped by the trap level, a negative fixed charge is generated at the interface with the insulating film, whereby the threshold voltage of the transistor shifts in the positive direction. Thus, it is preferable that the energy difference between EcS1 and EcS2 and the energy difference between EcS1 and EcS3 be 0.1 eV or more, further preferably 0.15 eV or more, because a change in the threshold voltage of the transistor is reduced and stable electrical characteristics are obtained.

Figure 8D:
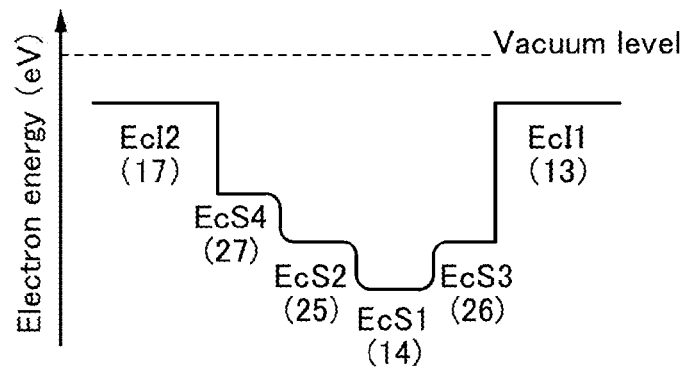

An oxide semiconductor film 27 may be provided between the oxide semiconductor film 25 and the gate insulating film 17. The material of the oxide semiconductor film 27 is selected so that the oxide semiconductor film 27 has a lower electron affinity than the oxide semiconductor film 25. For a material of the oxide semiconductor film 27, refer to the materials of the oxide semiconductor film 14, the oxide semiconductor film 25, the oxide semiconductor film 26, and the like. FIG. 8D shows the band structure of such a multilayer film. Note that EcS4 denotes the conduction band minimum of the oxide semiconductor film 27.

Figure 9A:
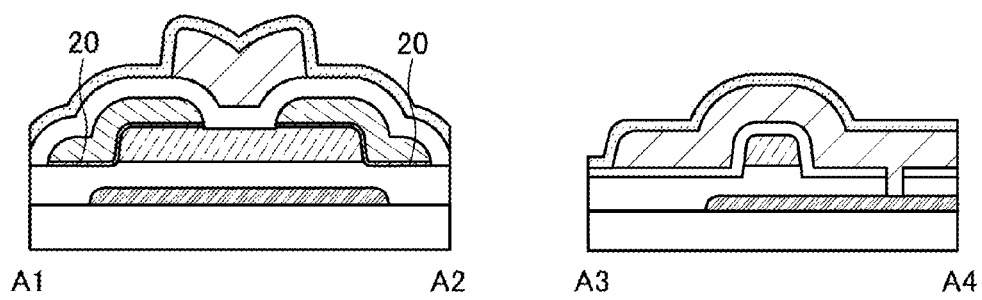
FIGS. 9A and 9B are cross-sectional views illustrating transistors.
Figure 9B:
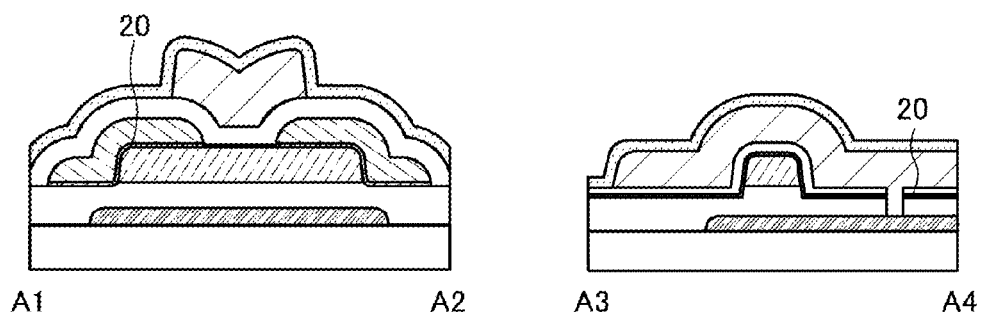

Note that the structure of the transistor is not limited to the above structures. The pair of electrodes 15 and 16 may be used as a mask to form the antioxidant film 20 so that a transistor illustrated in FIG. 9A is formed, or the pair of electrodes 15 and 16 and a resist may be used as masks to form the antioxidant film 20 so that a transistor illustrated in FIG. 9B is formed. A transistor including any of the above-described multilayer films may have such a structure.

Figure 10A:
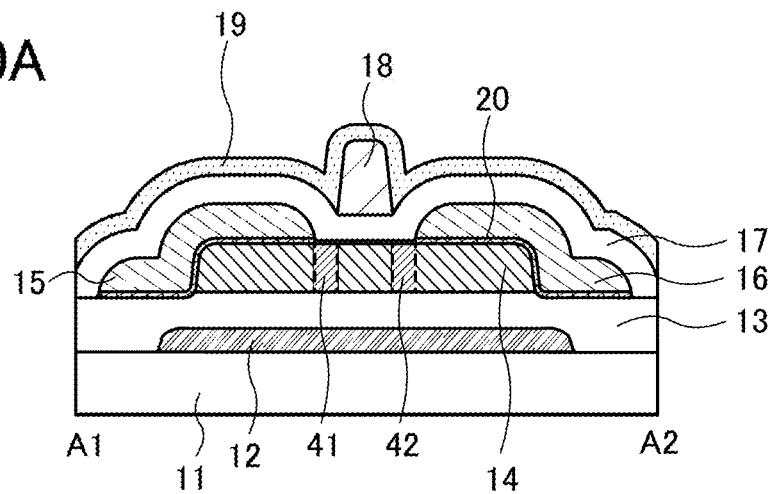
FIGS. 10A to 10C are cross-sectional views each illustrating a transistor.
Figure 10B:
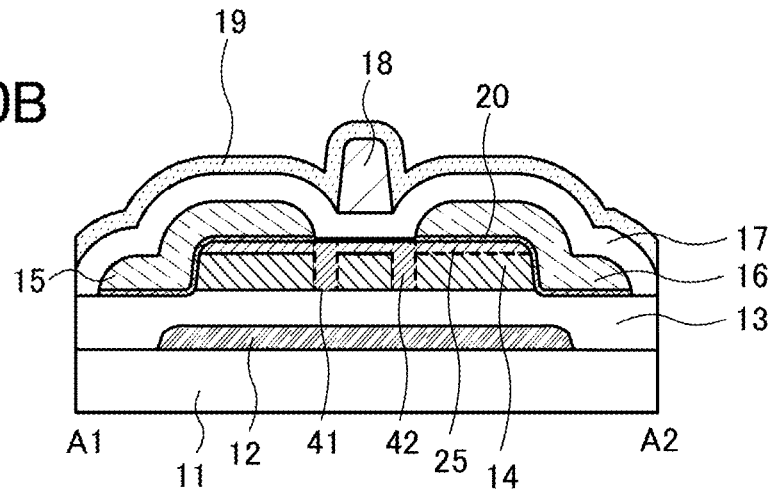
Figure 10C:
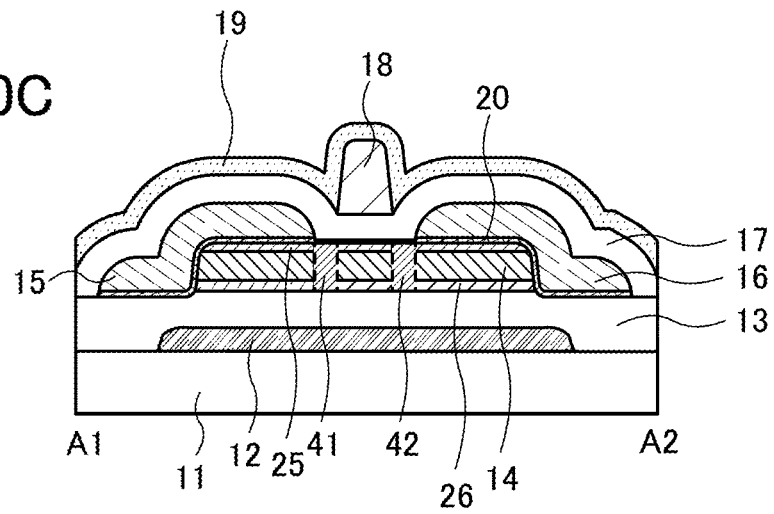

The above structures can each be a self-aligned structure in which the resistance of an offset region is reduced, as illustrated in FIG. 10A, FIG. 10B, or FIG. 10C.

An n-type low-resistance region 41 and an n-type low-resistance region 42 can be formed by adding impurities using the gate electrode 18 as a mask. As a method for adding the impurities, an ion implantation method, an ion doping method, a plasma immersion ion implantation method, or the like can be used.

Impurities such as hydrogen, helium, neon, argon, krypton, xenon, boron, nitrogen, phosphorus, and arsenic increase the conductivities of the oxide semiconductor films 14, 25, and 26.

Figure 11A:
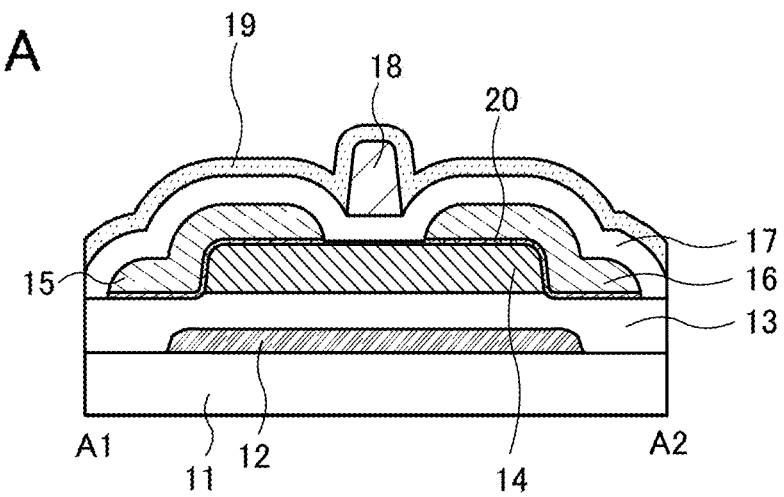
FIGS. 11A to 11C are cross-sectional views each illustrating a transistor.
Figure 11B:
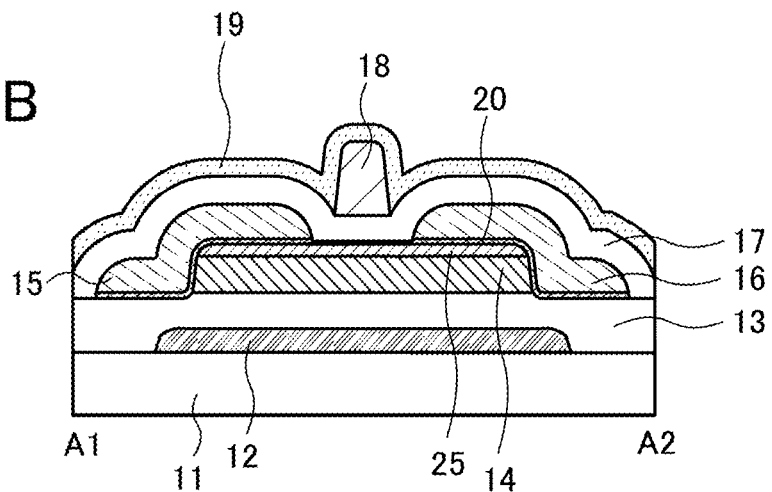
Figure 11C:
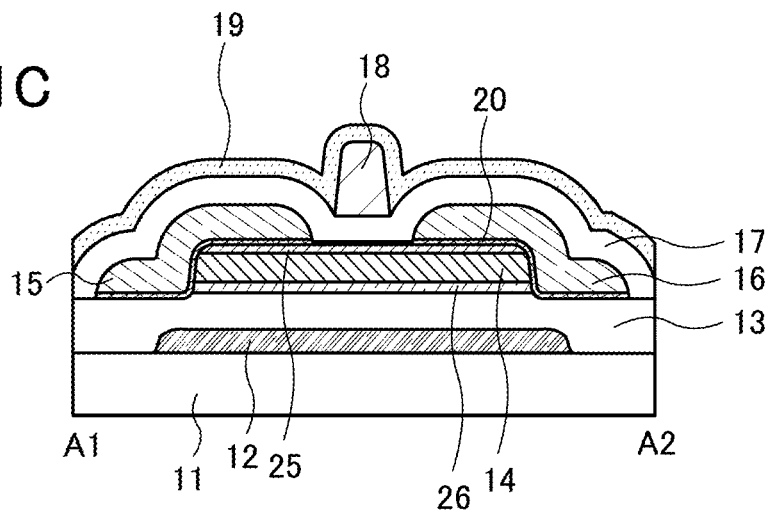

Note that the addition of impurities with the use of the gate electrode 18 as a mask is not necessary. Examples in that case are shown in FIGS. 11A to 11C. Although end portions of the gate electrode 18 are not aligned with end portions of the pair of electrodes 15 and 16 in FIGS. 11A to 11C, one embodiment of the present invention is not limited thereto, and the end portions of the gate electrode 18 may be aligned with the end portions of the pair of electrodes 15 and 16.

Figure 12A:
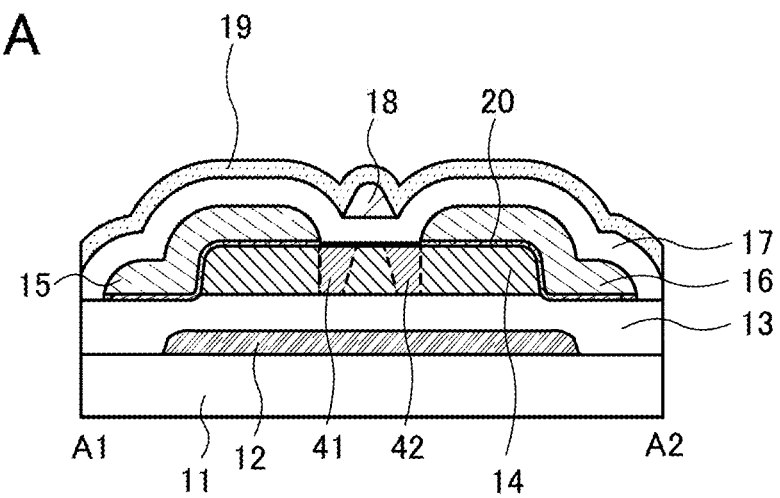
FIGS. 12A to 12C are cross-sectional views each illustrating a transistor.
Figure 12B:
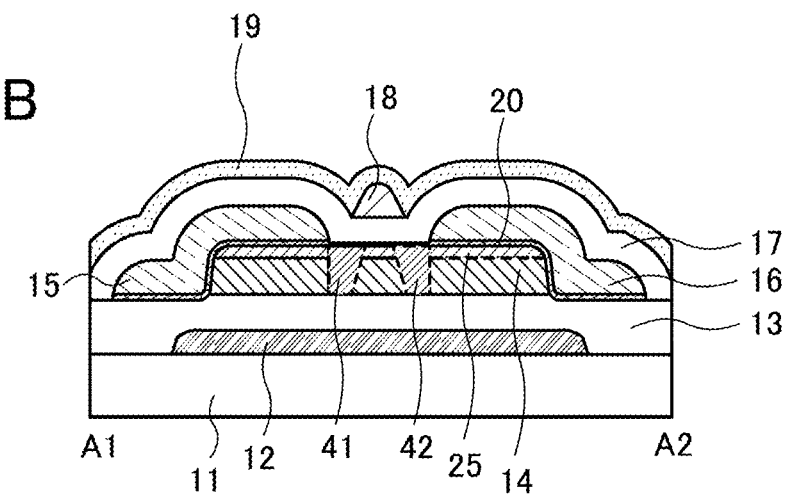
Figure 12C:
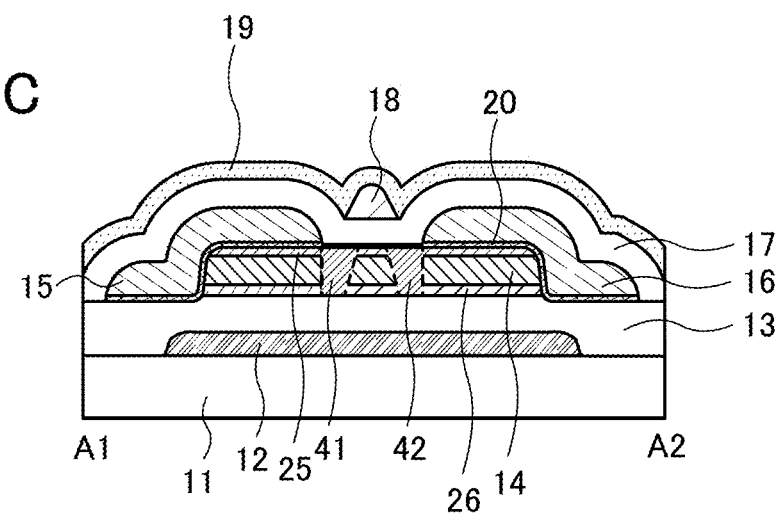

With the gate electrode 18 having a tapered shape, the shapes of the low-resistance regions 41 and 42 can be controlled as illustrated in FIGS. 12A to 12C.

Although an example where a channel or the like is formed in an oxide semiconductor film is described in this embodiment, one embodiment of the present invention is not limited thereto. For example, depending on cases or conditions, a channel, the vicinity of the channel, a source region, a drain region, or the like may be formed using a material containing Si (silicon), Ge (germanium), SiGe (silicon germanium), GaAs (gallium arsenide), or the like.

Note that the structures, methods, and the like described in this embodiment can be used as appropriate in combination with any of the structures, methods, and the like described in the other embodiments and examples.

Embodiment 2

In this embodiment, a transistor having a structure different from the structures of the transistors described in Embodiment 1 will be described.

<1. Structure of Transistor>

Figure 13A:
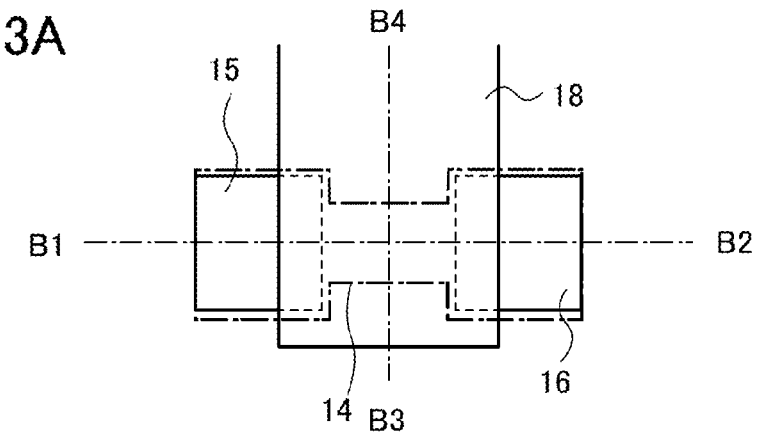
FIGS. 13A to 13C are a top view and cross-sectional views illustrating a transistor.
Figure 13B:
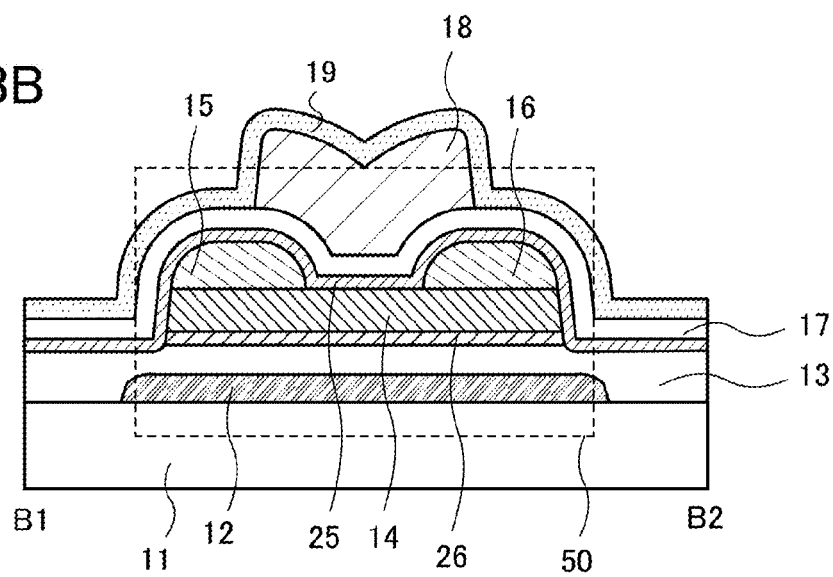
Figure 13C:
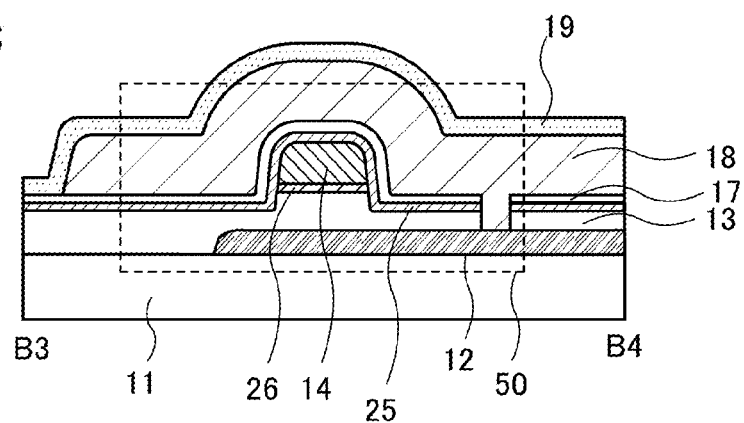

FIGS. 13A to 13C are a top view and cross-sectional views of the transistor 50 included in a semiconductor device. FIG. 13A is a top view of the transistor 50, FIG. 13B is a cross-sectional view taken along dashed-dotted line B1-B2 in FIG. 13A, and FIG. 13C is a cross-sectional view taken along dashed-dotted line B3-B4 in FIG. 13A. In FIGS. 13A to 13C, some components are enlarged, reduced in size, or omitted for easy understanding. In some cases, the direction of the dashed-dotted line B1-B2 is referred to as a channel length direction, and the direction of the dashed-dotted line B3-B4 is referred to as a channel width direction.

The transistor 50 illustrated in FIGS. 13A to 13C includes the conductive film 12 over the substrate 11, the base insulating film 13 over the substrate 11 and the conductive film 12, the oxide semiconductor film 26 over the base insulating film 13, the oxide semiconductor film 14 over the oxide semiconductor film 26, the pair of electrodes 15 and 16 on the top surface of the oxide semiconductor film 14, the oxide semiconductor film 25 in contact with the oxide semiconductor film 14 and the pair of electrodes 15 and 16, the gate insulating film 17 over the oxide semiconductor film 25, and the gate electrode 18 overlapping with the oxide semiconductor film 14 with the gate insulating film 17 provided therebetween. An insulating film 19 may be formed over the gate insulating film 17 and the gate electrode 18.

Since the pair of electrodes 15 and 16 is formed only on the top surface of the oxide semiconductor film 14, oxidation of the pair of electrodes 15 and 16 induced by oxygen from the base insulating film 13 can be suppressed. In the oxide semiconductor film 14, the channel width of a region overlapping with the pair of electrodes 15 and 16 is longer than the channel width of a region not overlapping with the pair of electrodes 15 and 16 (a region where a channel is formed). Accordingly, the channel width of the region not overlapping with the pair of electrodes 15 and 16 can be short, leading to miniaturization of the transistor, and the area of a region where the oxide semiconductor film 14 is in contact with the pair of electrodes 15 and 16 can be increased, leading to a reduction in contact resistance.

<2. Method for Manufacturing Transistor>

Next, a method for manufacturing the transistor 50 in FIGS. 13A to 13C is described with reference to FIGS. 14A to 14C and FIGS. 15A to 15C. A cross-section in the channel length direction along dot-dashed line B1-B2 in FIG. 13A and a cross-section in the channel width direction along dot-dashed line B3-B4 in FIG. 13A are used in FIGS. 14A to 14C and FIGS. 15A to 15C to describe the method for manufacturing the transistor 50.

Figure 14A:
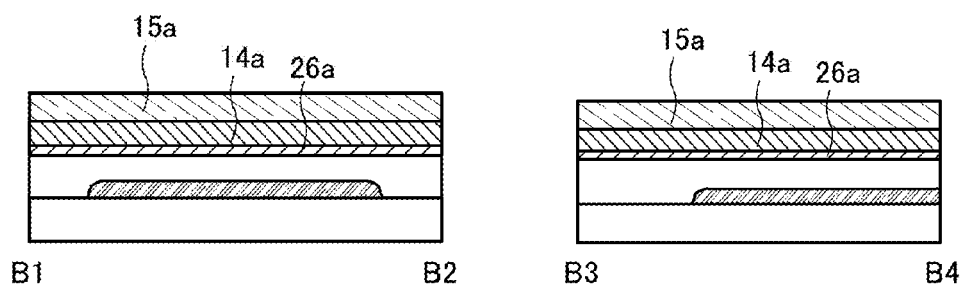
FIGS. 14A to 14C illustrate a method for forming a transistor.

After the steps in FIGS. 2A to 2C, a stack including an oxide semiconductor film 26a, an oxide semiconductor film 14a, and the conductive film 15a is formed over the base insulating film 13 (see FIG. 14A). Refer to Embodiment 1 for materials and formation methods of the oxide semiconductor film 26a, the oxide semiconductor film 14a, and the conductive film 15a.

Figure 14B:
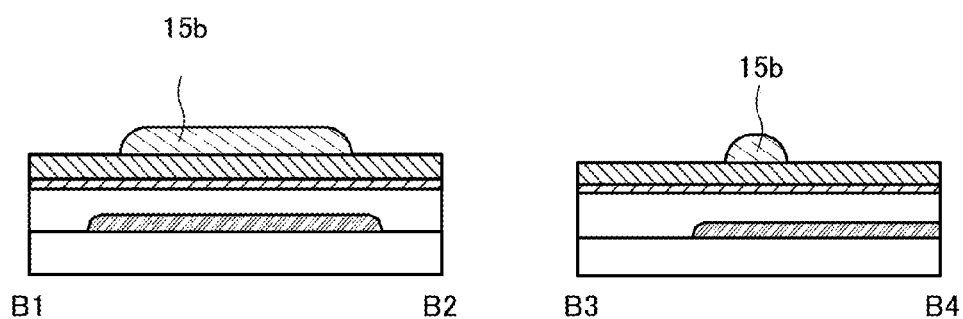

Then, the conductive film 15a is etched so that the conductive film 15b is formed (see FIG. 14B).

Figure 14C:
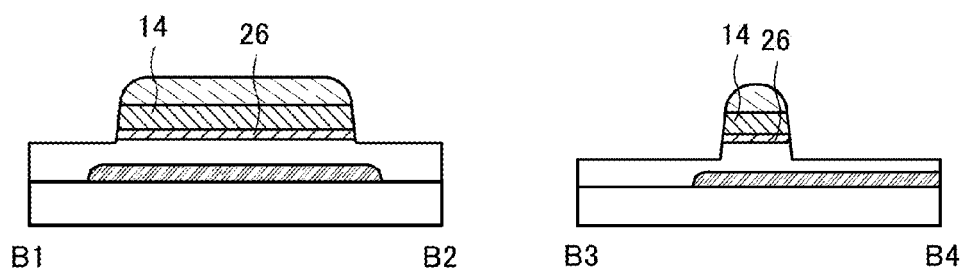

Subsequently, the oxide semiconductor film 26a and the oxide semiconductor film 14a are etched using the conductive film 15b as a mask so that the oxide semiconductor film 26 and the oxide semiconductor film 14 are formed (see FIG. 14C).

Figure 15A:
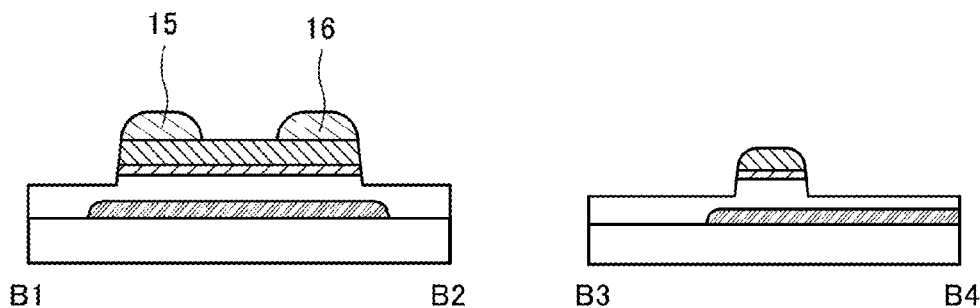
FIGS. 15A to 15C illustrate a method for forming a transistor.

Next, the conductive film 15b is etched so that the pair of electrodes 15 and 16 is formed (see FIG. 15A).

Figure 15B:
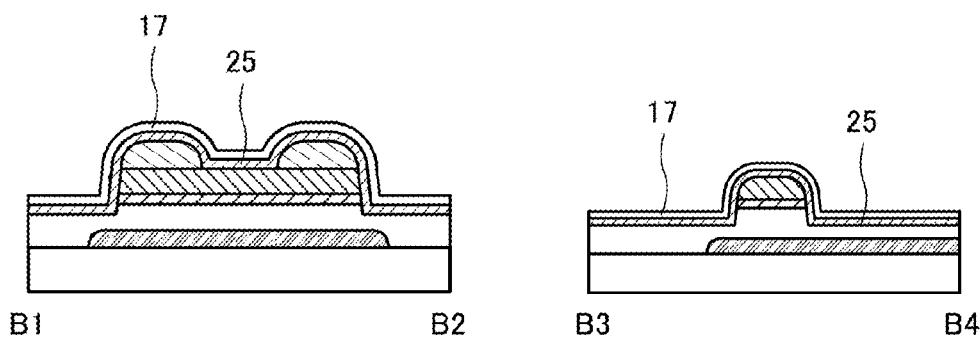
Figure 15C:
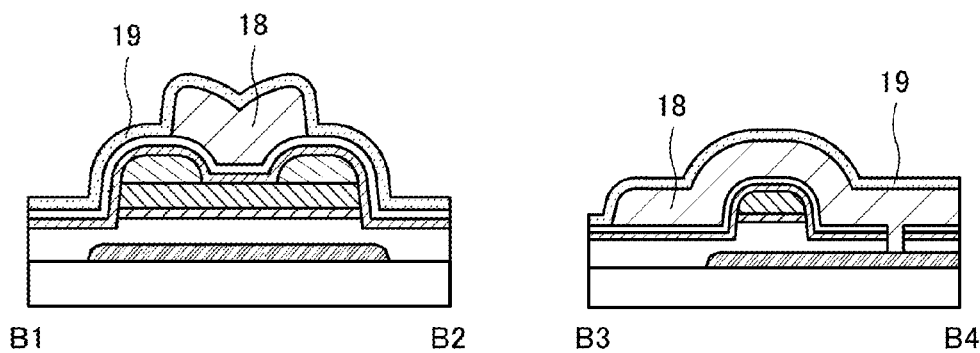

Then, the oxide semiconductor film 25 and the gate insulating film 17 are formed over the oxide semiconductor film 14 and the pair of electrodes 15 and 16 (see FIG. 15B). Refer to Embodiment 1 for materials and formation methods of the oxide semiconductor film 25 and the gate insulating film 17.

After that the gate electrode 18 overlapping with the oxide semiconductor film 14 with the gate insulating film 17 provided therebetween is formed. Subsequently, the insulating film 19 is formed over the gate insulating film 17 and the gate electrode 18 (see FIG. 15C). Refer to Embodiment 1 for materials and formation methods of the gate electrode 18 and the insulating film 19.

Through the above steps, a transistor in which a shift in threshold voltage is reduced can be manufactured. Furthermore, a transistor in which a change in electrical characteristics is reduced can be manufactured.

Modification Example 1

Modification examples of the transistor 50 described in this embodiment are described with reference to FIGS. 16A to 16C.

Figure 16A:
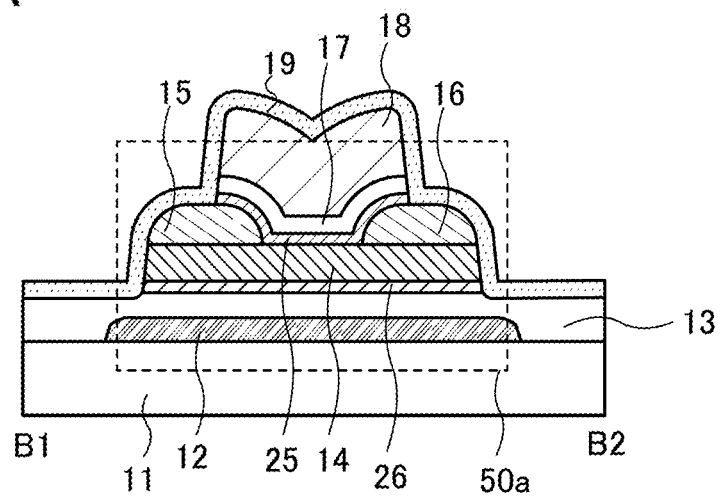
FIGS. 16A to 16C are cross-sectional views each illustrating a transistor.

A transistor 50a illustrated in FIG. 16A differs from the transistor 50 in the shapes of the oxide semiconductor film 25 and the gate insulating film 17. Since the oxide semiconductor film 25 and the gate insulating film 17 in FIG. 16A are formed using the gate electrode 18 as a mask, the number of masks can be reduced.

Figure 16B:
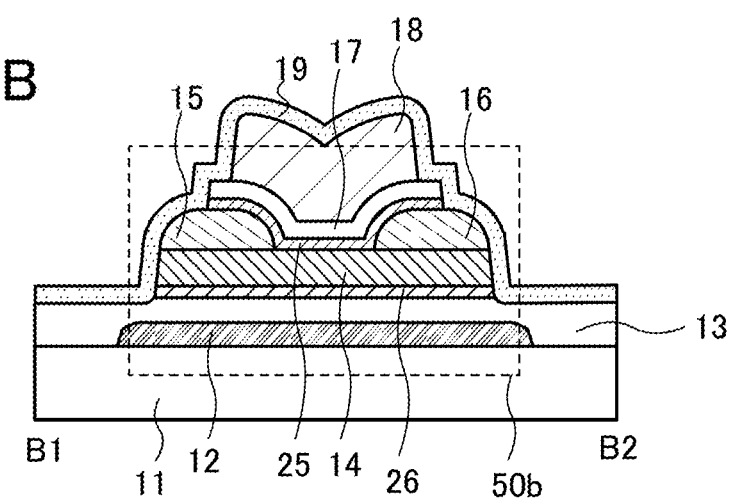

Alternatively, a mask for forming the oxide semiconductor film 25 and the gate insulating film 17 and a mask for forming the gate electrode 18 may be used, so that a transistor 50b illustrated in FIG. 16B is formed.

Figure 16C:
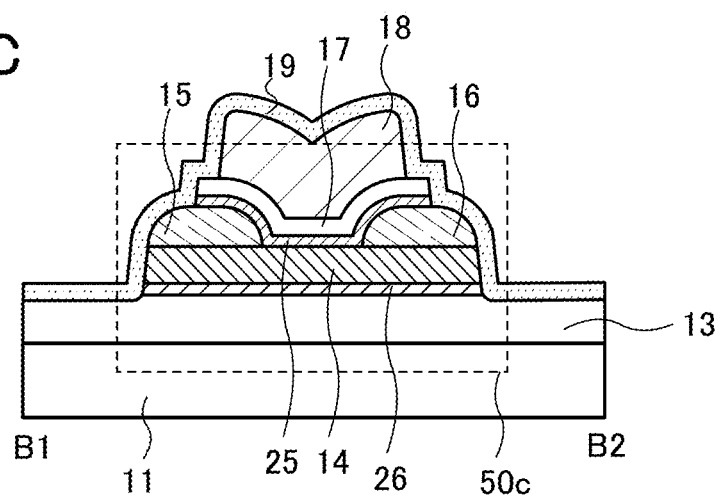

As in a transistor 50c illustrated in FIG. 16C, a structure in which the conductive film 12 is not provided may be employed.

Figure 17A:
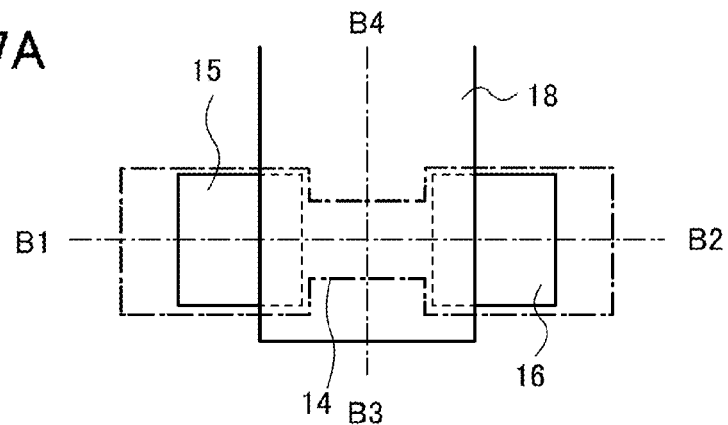
FIGS. 17A to 17C a top view and cross-sectional views illustrating a transistor.
Figure 17B:
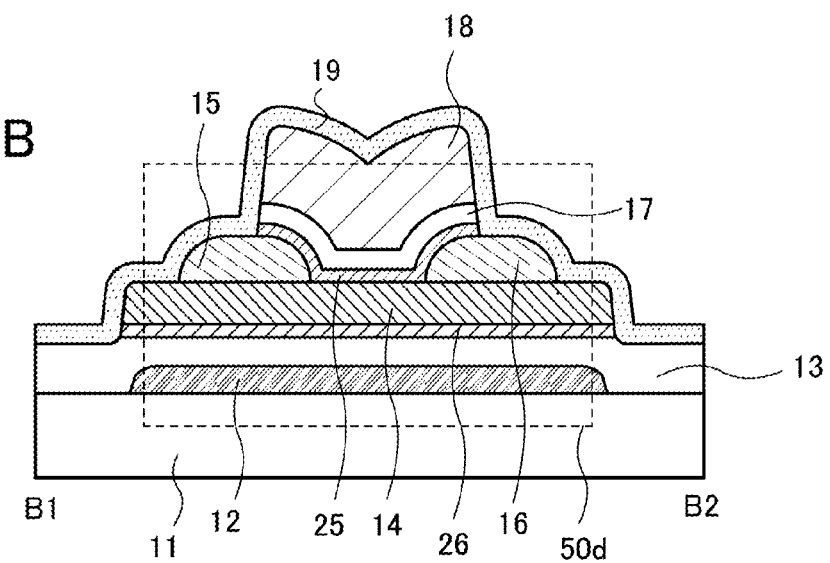
Figure 17C:
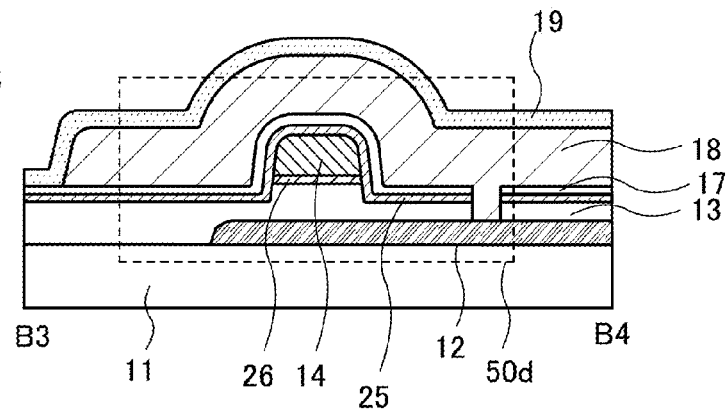

A transistor 50d illustrated in FIGS. 17A to 17C may have a structure obtained by forming the oxide semiconductor films 26 and 14 after the pair of electrodes 15 and 16 is formed.

Figure 18A:
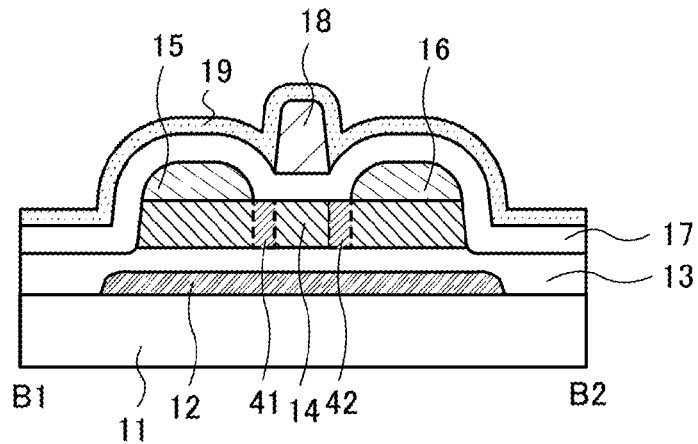
FIGS. 18A to 18C are cross-sectional views each illustrating a transistor.
Figure 18B:
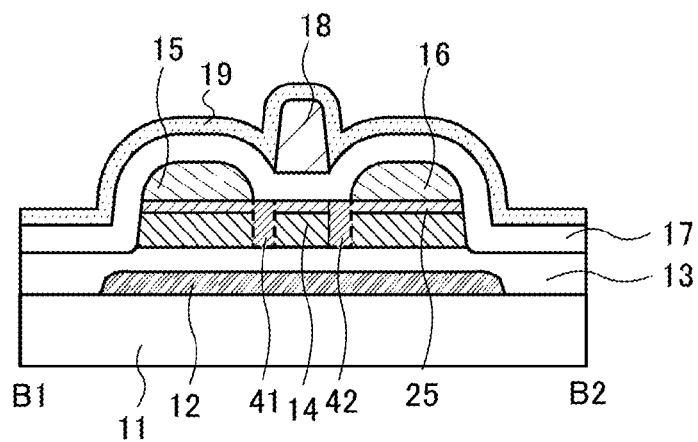
Figure 18C:
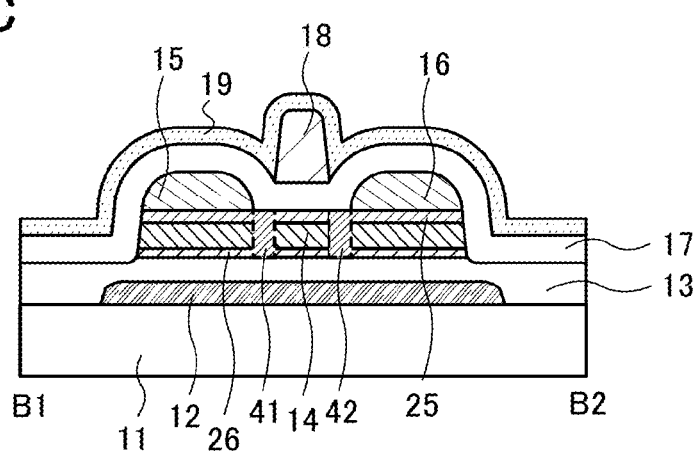

The above structures can each be a self-aligned structure in which the resistance of an offset region is reduced, as illustrated in FIGS. 18A to 18C.

The n-type low-resistance regions 41 and 42 can be formed by adding impurities using the gate electrode 18 as a mask. Refer to Embodiment 1 for the impurities and a method for adding the impurities.

Figure 19A:
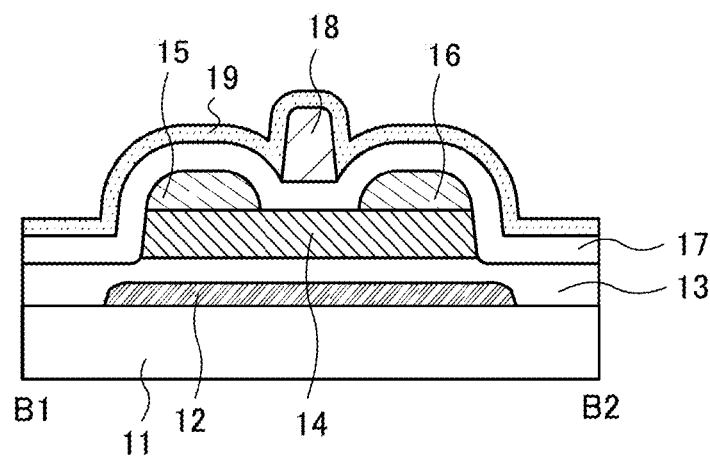
FIGS. 19A to 19C are cross-sectional views each illustrating a transistor.
Figure 19B:
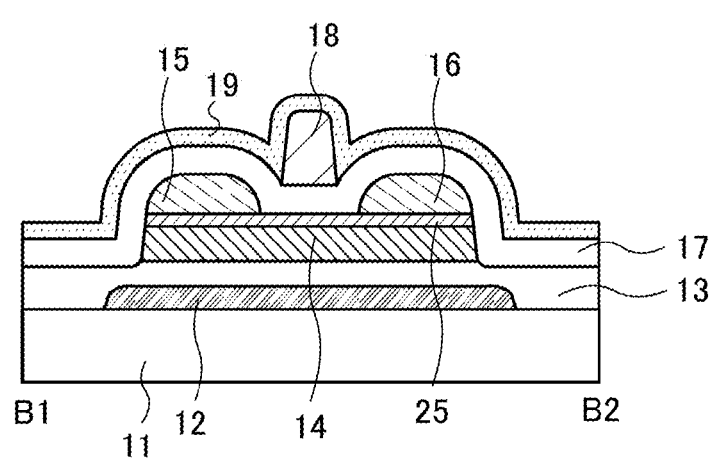
Figure 19C:
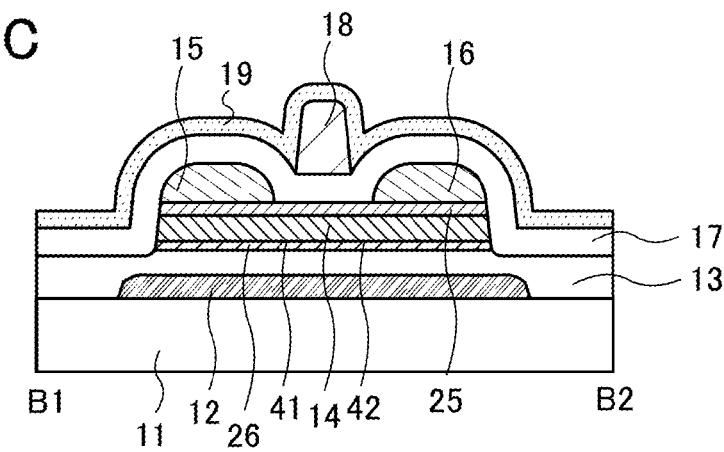

Note that the addition of impurities with the use of the gate electrode 18 as a mask is not necessary. Examples in that case are shown in FIGS. 19A to 19C. Although end portions of the gate electrode 18 are not aligned with end portions of the pair of electrodes 15 and 16 in FIGS. 19A to 19C, one embodiment of the present invention is not limited thereto, and the end portions of the gate electrode 18 may be aligned with the end portions of the pair of electrodes 15 and 16.

Figure 20A:
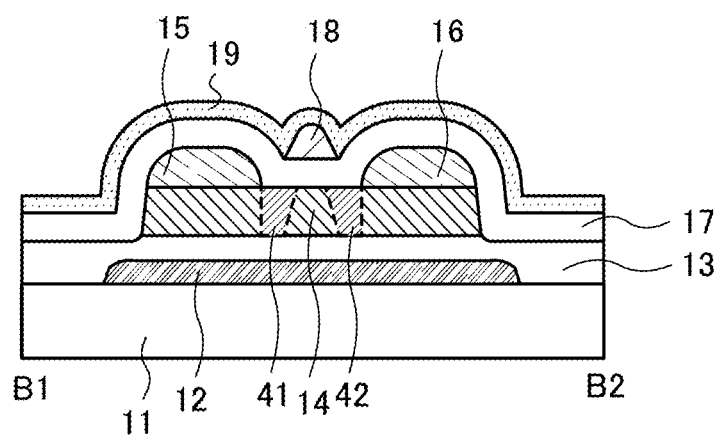
FIGS. 20A to 20C are cross-sectional views each illustrating a transistor.
Figure 20B:
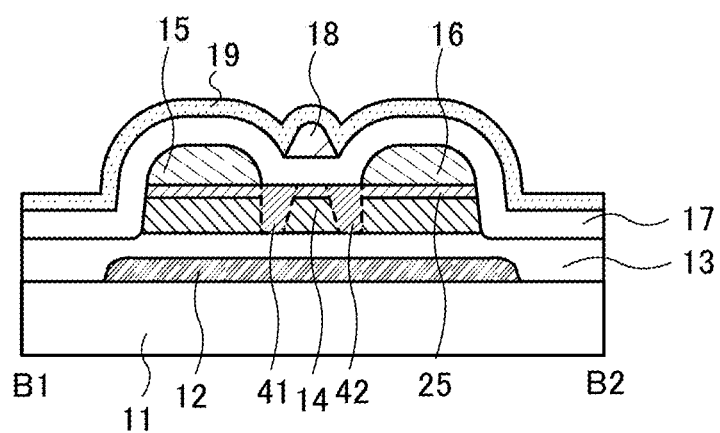
Figure 20C:
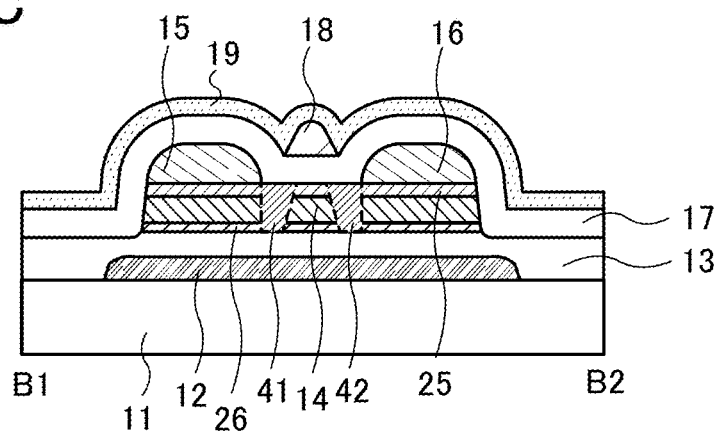

As in FIGS. 12A to 12C, the gate electrodes 18 in FIGS. 18A to 18C can have tapered shapes so that the shapes of the low-resistance regions 41 and 42 are controlled as illustrated in FIGS. 20A to 20C.

Note that the structures, methods, and the like described in this embodiment can be used as appropriate in combination with any of the structures, methods, and the like described in the other embodiments and examples.

Embodiment 3

In this embodiment, an oxide semiconductor film included in a transistor, defects included in an oxide insulating film (a base insulating film or a gate insulating film) in contact with the oxide semiconductor film, and the deterioration of transistor characteristics are described.

<1. $NO_x$>

First, nitrogen oxide (hereinafter $NO_x$; x is greater than 0 and less than or equal to 2, preferably greater than or equal to 1 and less than or equal to 2) contained in the oxide insulating film in contact with the oxide semiconductor film is described.

<1-1. Transition Level of $NO_x$ in Oxide Insulating Film>

First, transition levels of point defects in a solid are described. A transition level shows the charge state of impurities or defects (hereinafter referred to as a defect D) forming a state in a gap, and is calculated from the formation energy of defects. In other words, a transition level is similar to a donor level or an acceptor level.

The relationship between formation energy and transition levels of the charge state of the defect D and is described. The formation energy of the defect D is different depending on the charge state and also depends on the Fermi energy. Note that $D^+$ represents a state in which a defect releases one electron, $D^-$ represents a state in which a defect traps one electron, and $D^0$ represents a state in which no electron is transferred.

Figure 21A:
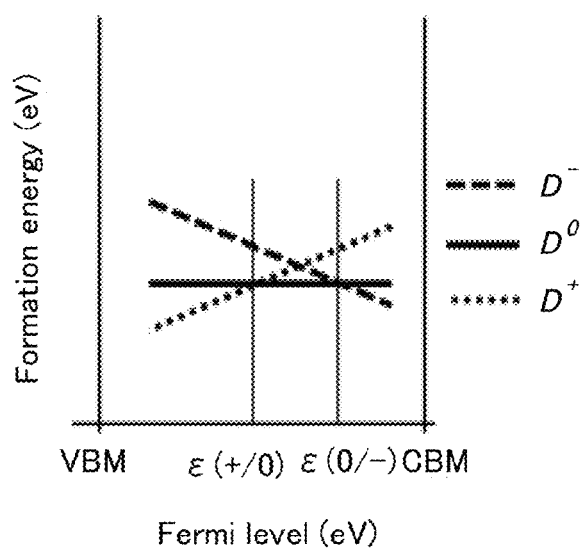
FIGS. 21A and 21B illustrate the relationship between formation energy and transition levels and electron configurations of defects.
Figure 21B:
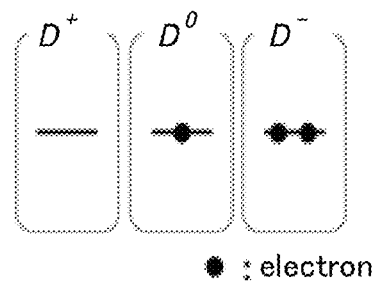

FIG. 21A illustrates the relationship between the formation energy and the transition level of each of the defects $D^+$, $D^0$, and $D^-$. FIG. 21B illustrates electron configurations of the defects $D^+$, $D^0$, and $D^-$.

In FIG. 21A, a dotted line indicates the formation energy of the defect $D^+$, a solid line indicates the formation energy of the defect $D^0$, and a dashed line indicates the formation energy of the defect $D^-$. The transition level at which the defect $D^+$ changes into the defect $D^0$ (that is, a level at which the dotted line and the solid line intersect) is denoted by $\in(+/0)$, and the transition level at which the defect $D^0$ changes into the defect $D^-$ (that is, a level at which the solid line and the dashed line intersect) is denoted by $\in(0/-)$.

Figure 22:
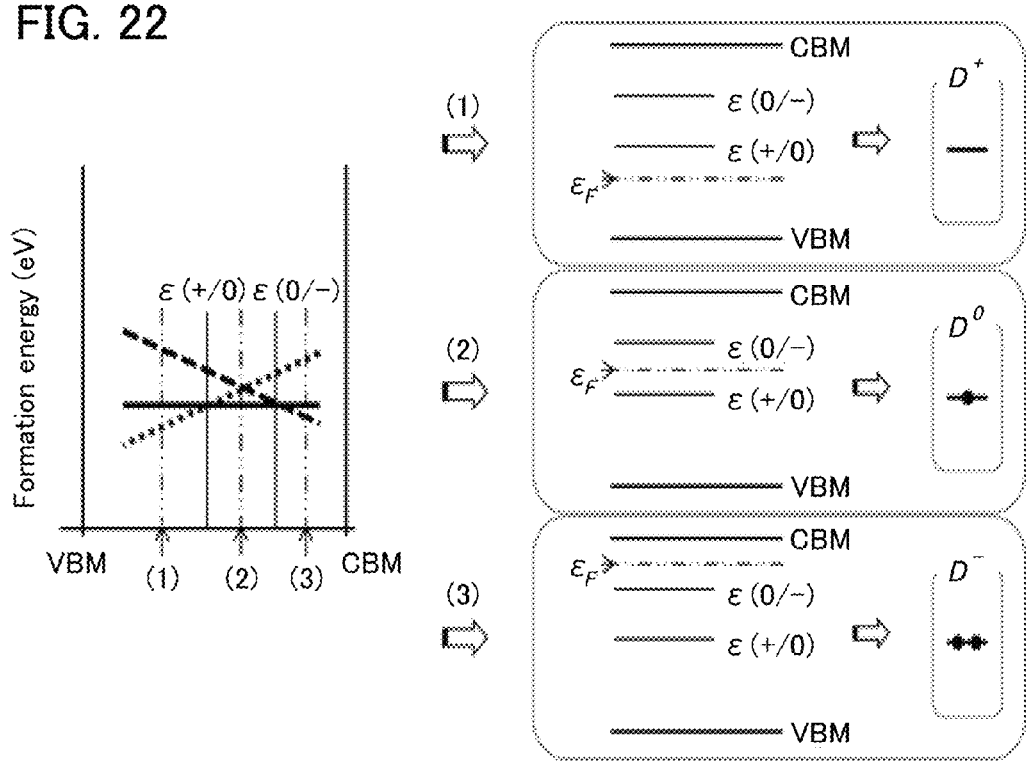
FIG. 22 illustrates a change in the Fermi level and a change in the charge states of defects.

FIG. 22 is a conceptual diagram of a change in charge states of a defect when the Fermi level is changed. In FIG. 22, a dashed double-dotted line indicates the Fermi level. Right views of FIG. 22 are band diagrams illustrating the Fermi levels (1), (2), and (3) in a left view of FIG. 22.

By finding out the transition level of a solid, it is qualitatively known that which charge state a defect is in at each of the Fermi levels when the Fermi level is used as a parameter.

As a typical example of the oxide insulating film in contact with the oxide semiconductor film, a silicon oxynitride (SiON) film was used, and the defect level in the silicon oxynitride film and an ESR signal attributed to the defect level were examined by calculation. Specifically, models in which $NO_2$, $N_2O$, NO, and an N atom were introduced into the respective silicon oxide ($SiO_2$) were formed, and the transition levels thereof were examined to verify whether $NO_2$, $N_2O$, NO, and an N atom introduced into silicon oxide serve as electron traps of the transistor.

Figure 23:
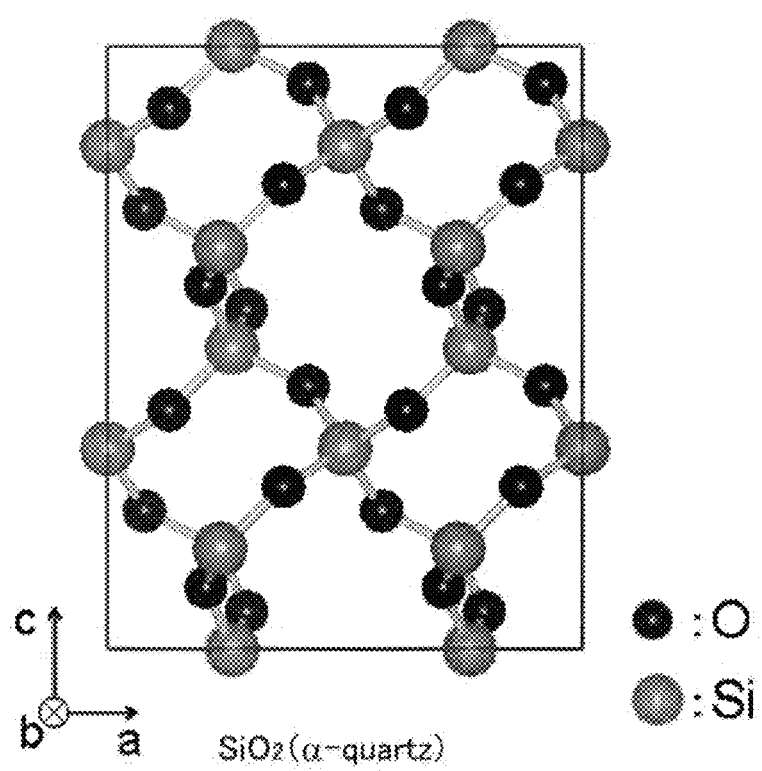
FIG. 23 shows a crystalline model of c-SiO$_2$.

In calculation, $SiO_2$ (c-$SiO_2$) with a low-temperature quartz (α-quartz) crystal structure was used as a model. A crystal model of c-$SiO_2$ without defects is shown in FIG. 23.

First, structure optimization calculation was performed on a model including 72 atoms, particularly on the lattice constants and the atomic coordinates. The model was obtained by doubling the unit cells in all axis direction of c-$SiO_2$. In the calculation, first principles calculation software VASP (the Vienna Ab initio Simulation Package) was used. The effect of inner-shell electron was calculated by a projector augmented wave (PAW) method, and as a functional, Heyd-Scuseria-Ernzerhof (HSE) DFT hybrid factor (HSE06) was used. The calculation conditions are shown below.

TABLE 1

| Software | VASP |
| --- | --- |
| Pseudopotential | PAW method |
| Functional | HSE06 |
| Mixing ratio of exchange term | 0.4 |
| Cut-off energy | 800 eV |
| k-point | 1 × 1 × 1 (optimization) |
|  | 2 × 2 × 2 (total energy) |

The band gap of c-$SiO_2$ model after the structure optimization was 8.97 eV that is close to the experimental value, 9.0 eV.

Next, the structure optimization calculation was performed on the above c-$SiO_2$ models where $NO_2$, $N_2O$, NO, and an N atom were introduced into spaces (interstitial sites) in respective crystal structures. The structure optimization calculation was performed on each model with respect to the following three cases: a case where the whole system is positive monovalent (charge: +1); a case where the whole system is electrically neutral (zerovalent) (charge: neutral); and a case where the whole system is negative monovalent (charge: −1). Note that the charges imposed on the whole system, which were in the ground state of electrons, were localized in defects including $NO_2$, $N_2O$, NO, and an N atom.

Figure 24:
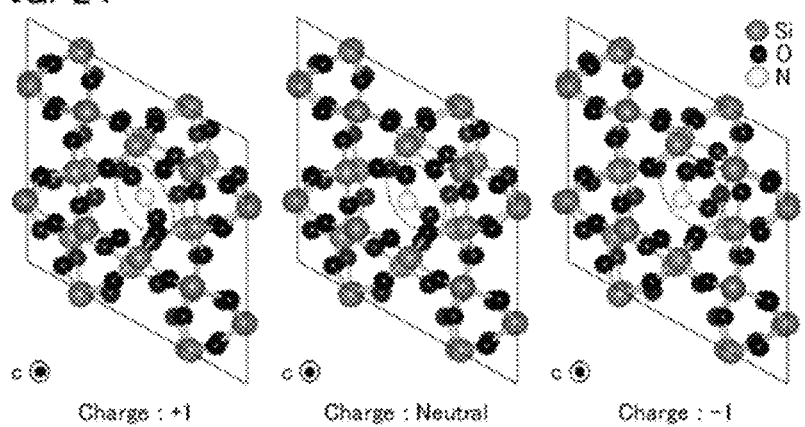
FIG. 24 shows a model in which NO$_2$ is introduced into an interstitial site of a c-SiO$_2$ model.

As for the model in which $NO_2$ was introduced into an interstitial site in the c-$SiO_2$ model, a structure after the structure optimization calculation was performed and structural parameters of an $NO_2$ are shown in FIG. 24. In FIG. 24, structural parameters of an $NO_2$ molecule in a gaseous state are also shown as a reference example.

Note that the molecule that is not electrically neutral is frequently called a molecular ion; however, unlike an isolated system, it is difficult to quantitate the valence of molecule because the molecular discussed here is one introduced inside a crystal lattice. Thus, a molecule that is not electrically neutral is called molecular for convenience.

FIG. 24 shows that when an $NO_2$ molecule is introduced, the $NO_2$ molecule tends to be in a linear arrangement in the case where the charge of the system is +1. FIG. 24 also shows that the angle of the O—N—O bond of the system whose charge is −1 is smaller than that of the model whose charge is neutral, and the angle of the O—N—O bond of the model whose charge is neutral is smaller than that of the model whose charge is +1. This structure change in the $NO_2$ molecule is almost equal to a change in the bonding angle when the charge number of isolated molecules in a gas phase varies. Thus, it is suggested that almost the assumed charges are attributed to the $NO_2$ molecule, and the $NO_2$ molecule in $SiO_2$ probably exists in a state close to an isolated molecule.

Figure 25:
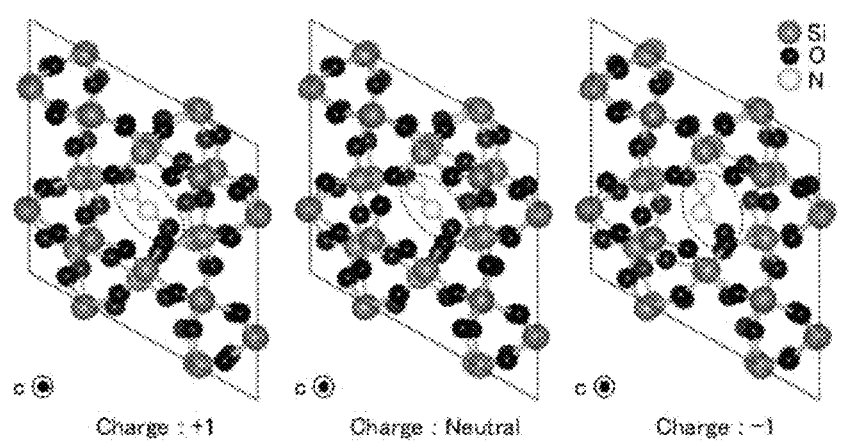
FIG. 25 shows a model in which N$_2$O is introduced into an interstitial site of a c-SiO$_2$ model.

Next, as for the model in which an $N_2O$ molecule was introduced into an interstitial site in the c-$SiO_2$ model, a structure after the structure optimization calculation was performed and structural parameters of the $N_2O$ molecule are shown in FIG. 25. In FIG. 25, structural parameters of the $N_2O$ molecule in a gaseous state are also shown as a reference example.

According to FIG. 25, in the case where the charge of the system is +1 and the case where the charge is neutral, the structures of the $N_2O$ molecules are both in a linear arrangement, which means the $N_2O$ molecules of two cases have almost the same structure. In contrast, in the case where the charge of the system is −1, the $N_2O$ molecule has a bent shape, and the distance between N and O is longer than that of the above two cases. This conceivable reason is that an electron enters the LUMO level that is π* orbital of the $N_2O$ molecule.

Figure 26:
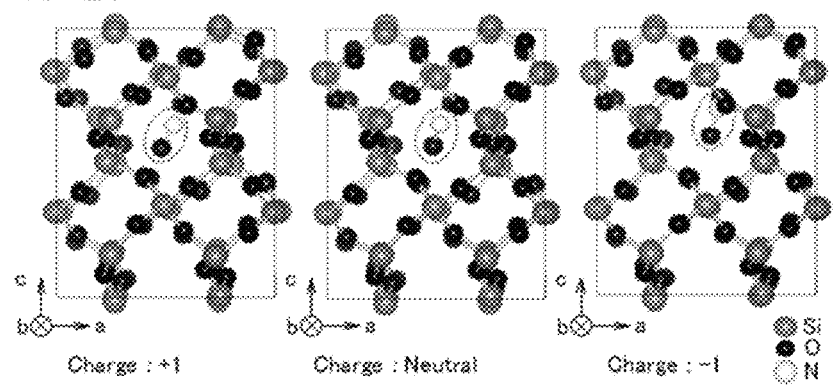
FIG. 26 shows a model in which NO is introduced into an interstitial site of a c-SiO$_2$ model.

Next, as for the model in which an NO molecule was introduced into an interstitial site in the c-$SiO_2$ model, a structure after the structure optimization calculation was performed and structural parameters of the NO molecule are shown in FIG. 26.

According to FIG. 26, the distance between N and O is short in the case where the charge of system is +1, and the distance between N and O is long in the case where the charge of system is −1. It is suggested that this tendency reflect the following: in the case where the charge of the isolated NO molecule is +1, the bond order of the N—O bond is 3.0; in the case where the charge of the isolated NO molecule is 0, the bond order is 2.5; and in the case where the charge of the isolated NO molecule is −1, the bond order is 2.0; thus, the bond order becomes the largest when the charge is +1. Therefore, it is suggested that the NO molecule in $SiO_2$ exist stably in a state close to the isolated molecule.

Figure 27:
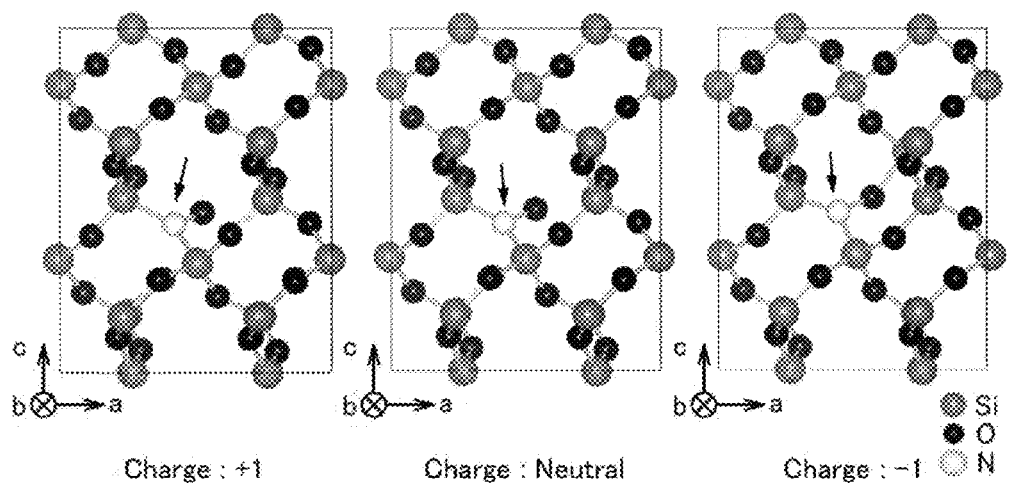
FIG. 27 shows a model in which an N atom is introduced into an interstitial site of a c-SiO$_2$ model.

Then, as for the model in which an N atom was introduced into an interstitial site in the c-$SiO_2$ model, a structure after the structure optimization calculation was performed is shown in FIG. 27.

According to FIG. 27, in either charge state, the N atom that is bonded to atoms in $SiO_2$ is more stable in terms of energy than the N atom exists as an isolated atom in an interstitial site.

Next, the calculation of a transition level was performed on each sample.

The transition level ∈ (q/q') for transition between the charge q state and the charge q' state in a model having defect D in its structure can be calculated with Formula 1.

$$\varepsilon(q/q') = \frac{\Delta E^q - \Delta E^{q'}}{q' - q}$$ [Formula 1]

$$\Delta E^q = E_{tot}(D^q) - E_{tot}(\text{bulk}) + \sum_i n_i \mu_i + q(\varepsilon_{VBM} + \Delta V_q + E_F)$$

In the above formula, $E_{tot}(D^q)$ represents the total energy in the model having defect D of the charge q, $E_{tot}$ (bulk)

represents the total energy in a model without defects, $n_i$ represents the number of atoms i contributing to defects, $\mu_i$ represents the chemical potential of atom i, $\in_{VBM}$ represents the valence band maximum in the model without defects, $\Delta V_q$ represents the correction term relating to the electrostatic potential, and $E_f$ represents the Fermi energy.

Figure 28:
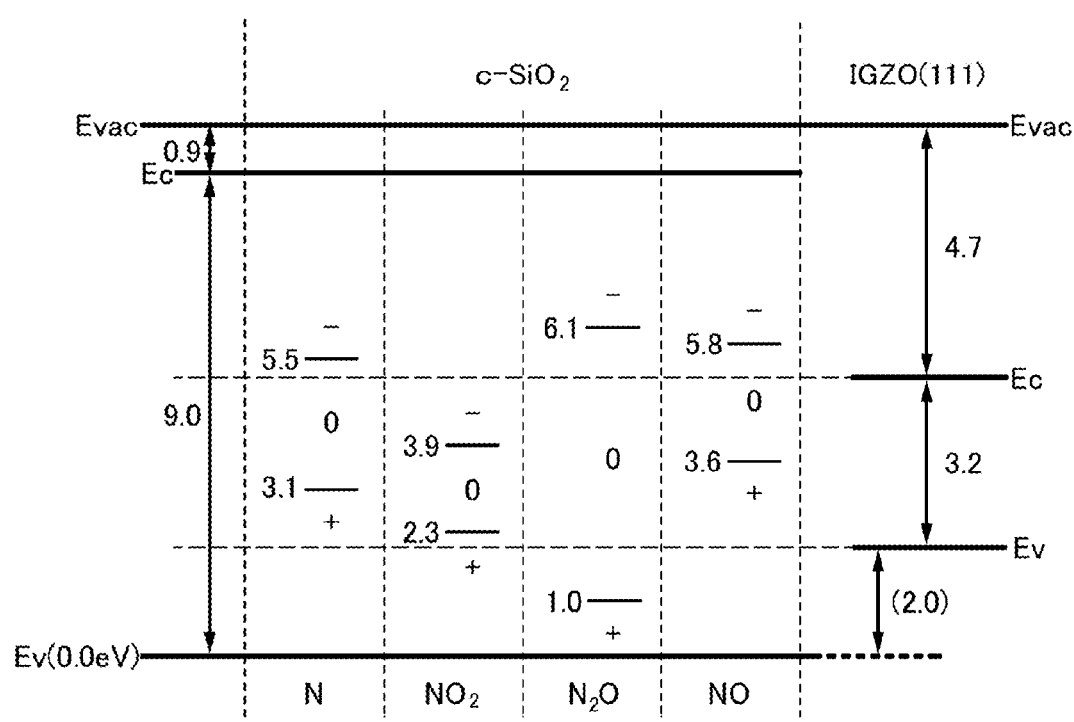
FIG. 28 is a band diagram.

FIG. 28 is a band diagram showing the transition levels obtained from the above formula. As the oxide semiconductor film, an oxide semiconductor film (hereinafter referred to as IGZO(111)) formed using metal oxide having an atomic ratio of In:Ga:Zn=1:1:1 is used. In FIG. 28, a band diagram of the IGZO(111) is shown in addition to the band diagrams of the above four models. The unit of the values in FIG. 28 is "eV".

In FIG. 28, the value of each transition level indicates a value obtained when the valence band maximum of $SiO_2$ is considered as a base (0.0 eV). Although a reference value was used as an electron affinity of $SiO_2$ here, the practical positional relation of the bands in the case where $SiO_2$ is bonded to the IGZO(111) is affected by the electron affinity of $SiO_2$ in some cases.

Hereinafter, the transition level that transits between a state where the charge of the system is +1 and a state where the charge of the model is 0 is referred to as (+/0), and the transition level that transits between a state where the charge of the system is 0 and a state where the charge of system is −1 is referred to as (0/−).

According to FIG. 28, in the model in which an $NO_2$ molecule was introduced into $SiO_2$, two transition levels of (+/0) and (0/−) exist at the positions within the band gap of the IGZO(111), which suggests that the $NO_2$ molecule may relate to trap and detrap of electrons. In both a model in which an NO molecule was introduced into $SiO_2$ and a model in which an N atom was introduced into $SiO_2$, the transition level of (+/0) exists at a position within the band gap of the IGZO(111). In contrast, the transition level of the model in which an $N_2O$ molecule was introduced into $SiO_2$ exists outside of the band gap of the IGZO(111), and the $N_2O$ molecules probably exist stably as neutral molecules regardless of the position on the Fermi level.

The above results strongly suggest that an interstitial molecule containing nitrogen, which relates to trap and detrap of electrons and is a factor causing a shift of the threshold voltage of a transistor in the positive direction, is either an $NO_2$ or NO molecule having the transition level at a position within the band gap on a side closer to the conduction band of IGZO (111) or is both of them.

<1-2. Examination of ESR Signal>

Following the calculation results of the transition level, ESR signals of $NO_2$ molecules were calculated. In addition, a model in which an N atom substituted in a site of an O atom in $SiO_2$ was examined in a manner similar to that of the above case.

In this case, an N atom has seven electrons, and an O atom has eight electrons; in other words, an electron structure of the $NO_2$ molecule has an open shell. Thus, the neutral $NO_2$ molecule has a lone electron, and can be measured by ESR. In the case where an N atom substitutes in a site of an O atom in $SiO_2$, only two Si atoms exist around an N atom and the N atom includes a dangling bond. Thus, the case can also be measured by ESR. Furthermore, $^{14}N$ has only one nuclear spin, and a peak of an ESR signal relating to $^{14}N$ is split into three. At this time, the split width of the ESR signal is a hyperfine coupling constant.

Figure 29A:
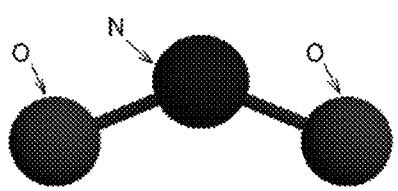
FIGS. 29A and 29B each show a model of a cluster structure.
Figure 29B:
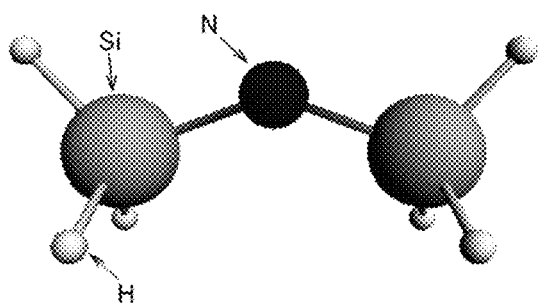

Thus, calculation was performed to examine whether split of an ESR signal of the oxide insulating film into three is caused by the $NO_2$ molecule or the N atom that substitutes in a site of an O atom in $SiO_2$. When an $SiO_2$ crystal structure is used as a model, the amount of calculation is enormous. Thus, in this case, two kinds of models of cluster structures as shown in FIGS. 29A and 29B were used, the structure optimization was performed on these models, and then, g-factors and hyperfine coupling constants were calculated. FIG. 29A shows a model of an $NO_2$ molecule in a neutral state, and FIG. 29B shows a cluster model including an Si—N—Si bond. Note that the model shown in FIG. 29B is a cluster model in which a dangling bond of an Si atom is terminated with an H atom.

Amsterdam density functional (ADF) software was used for structure optimization of the models and calculation of the g-factors and hyperfine coupling constants of the models whose structures were optimized. In the structure optimization and the calculation of the models and the g-factors and hyperfine coupling constants of the models whose structures were optimized, "GGA:BP" was used as a functional, and "QZ4P" was used as a basic function, and "None" was used as Core Type. In addition, in the calculation of the g-factors and hyperfine coupling constants, "Spin-Orbit" was considered as a relativistic effect, and as a calculation method of ESR/EPR, "g & A-Tensor (full SO)" was employed. The calculation conditions are as follows.

TABLE 2

| | |
|---|---|
| Software | ADF |
| Basis function | QZ4P |
| Functional | GGA-BP |
| Core Type | None |
| Relativistic Effect | Spin-Orbit |
| Calculation method of ESR/EPR | g & A-Tensor (full SO) |

As a result of structure optimization, in the case of the $NO_2$ molecule shown in FIG. 29A, the bonding distance of the N—O bond was 0.1205 nm, and the angle of the O—N—O bond was 134.1°, which are close to experimental values of the $NO_2$ molecule (the bonding distance: 0.1197 nm, and the bonding angle 134.3°. In the case of the Si—N—Si cluster model shown in FIG. 29B, the bonding distance of Si—N was 0.172 nm and the angle of the Si—N—Si bond was 138.3°, which were almost the same as the bonding distance of Si—N (0.170 nm) and the angle of the Si—N—Si bond)(139.0° in the structure that had been subjected to structure optimization by first principles calculation in a state where an N atom substitutes in a site of an O atom in the $SiO_2$ crystal.

The calculated g-factors and hyperfine coupling constants are shown below.

TABLE 3

| | g-factor | | | | Hyperfine coupling constant [mT] | | | |
|---|---|---|---|---|---|---|---|---|
| | g_x | g_y | g_z | g (average) | A_x | A_y | A_z | A (average) |
| $NO_2$ | 2.0066 | 1.9884 | 2.0014 | 1.9988 | 4.54 | 4.49 | 6.53 | 5.19 |
| Si—N—Si | 2.0021 | 2.0174 | 2.0056 | 2.0084 | 3.14 | −0.61 | −0.62 | 0.64 |

As described above, the hyperfine coupling constant A corresponds to the distance between the ESR signals (or the split width between peaks). According to Table 3, the average value of the hyperfine coupling constant A of the $NO_2$ molecule is approximately 5 mT. In the case of the Si—N—Si cluster model, only A_x in the hyperfine coupling constants A is a positive value, which is approximately 3 mT.

According to this result, the ESR spectrum that has three signals, a hyperfine structure constant of approximately 5 mT, and a g-factor of approximately 2, which are obtained by ESR measurement using an X-band, is obtained probably because of an $NO_2$ molecule in an $SiO_2$ crystal. Among three signals, the g-factor of the medium signal is approximately 2.

<1-3. Consideration of Deterioration Mechanism of Transistor>

A mechanism of a phenomenon in which the threshold voltage of a transistor is shifted in the positive direction when a positive GBT test is performed is considered below based on the above results.

Figure 30:
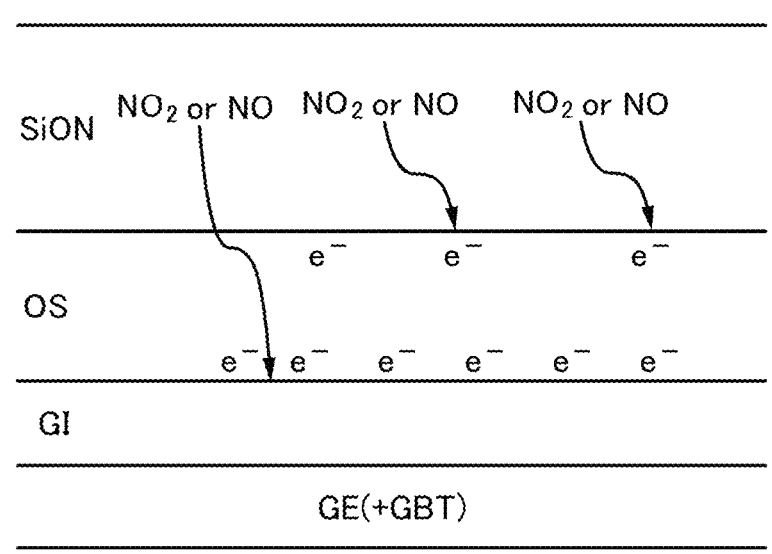
FIG. 30 illustrates a mechanism of a phenomenon in which the threshold voltage of a transistor is shifted in the positive direction.

The mechanism is considered with reference to FIG. 30. FIG. 30 illustrates a structure in which a gate (GE), a gate insulating film (GI), an oxide semiconductor film (OS), and a silicon oxynitride film (SiON) are stacked in this order. Here, a case where the SiON that is positioned on the back channel side of the OS contains nitrogen oxide is described.

When a positive GBT test is performed on the transistor, the electron densities of the OS on the GI side and the SiON side become higher. The electron density of the OS is lower on the SiON side than on the GI side. When an $NO_2$ molecule or an NO molecule contained in the SiON is diffused into the interface between the GI and the OS and the interface between the OS and the SiON, electrons on the GI side and the back channel side that are induced by the positive GBT are trapped. As a result, the trapped electrons remain in the vicinity of the interface between the GI and the OS and the interface between the OS and the SiON; thus, the threshold voltage of the transistor is shifted in the positive direction.

That is, a lower concentration of nitrogen oxide contained in the silicon oxynitride film in contact with the oxide semiconductor film can suppress a change in the threshold voltage of the transistor. Here, as specific examples of the silicon oxynitride film in contact with the oxide semiconductor film, the base insulating film, the gate insulating film, and the like can be given. By providing the silicon oxynitride film containing an extremely small amount of nitrogen oxide in contact with the oxide semiconductor film, the transistor can have excellent reliability.

<2. $V_OH$>

Next, an H atom (hereinafter referred to as $V_OH$) positioned in an oxygen vacancy $V_O$, which is one of defects contained in the oxide semiconductor film, is described.

<2-1. Energy and Stability Between Existing Modes of H>

First, the energy difference and stability in a mode of H that exists in an oxide semiconductor film is described with calculated results. Here, IGZO(111) was used as the oxide semiconductor film.

The structure used for the calculation is based on an 84-atom bulk model in which twice the number of a hexagonal unit cell of the IGZO(111) is arranged along the a-axis and b-axis.

Figure 31A:
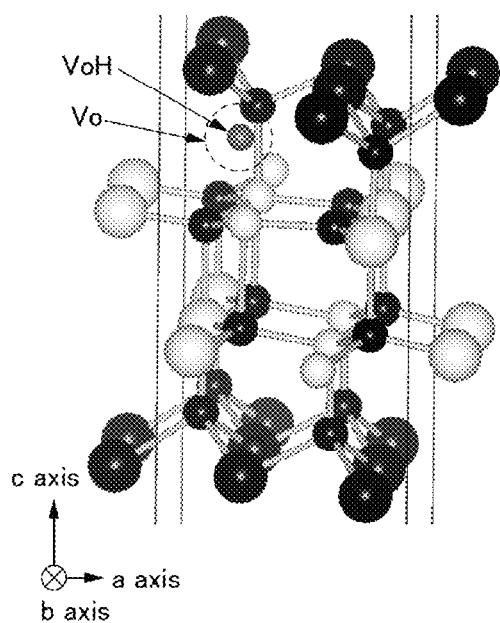
FIGS. 31A to 31D illustrate bulk models.
Figure 31B:
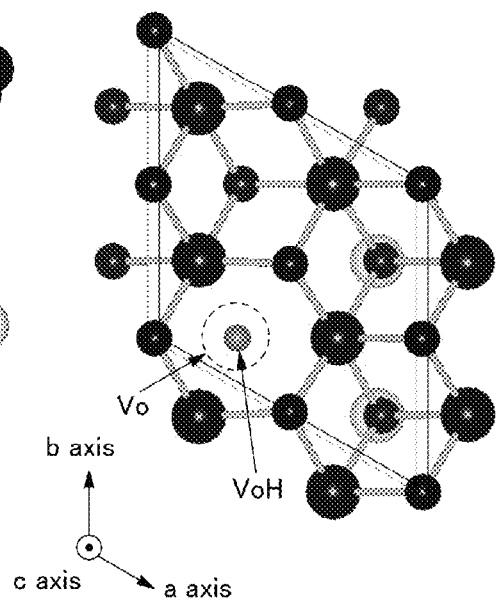

As the bulk model, a model in which one O atom bonded to three In atoms and one Zn atom is replaced with an H atom was prepared (see FIG. 31A). FIG. 31B shows a diagram in which the a-b plane of the InO layer in FIG. 31A is viewed from the c-axis direction. A region from which one O atom bonded to three In atoms and one Zn atom is removed is shown as an oxygen vacancy $V_O$, which is shown in a dashed line in FIGS. 31A and 31B. In addition, an H atom in the oxygen vacancy $V_O$ is expressed as $V_OH$.

Figure 31C:
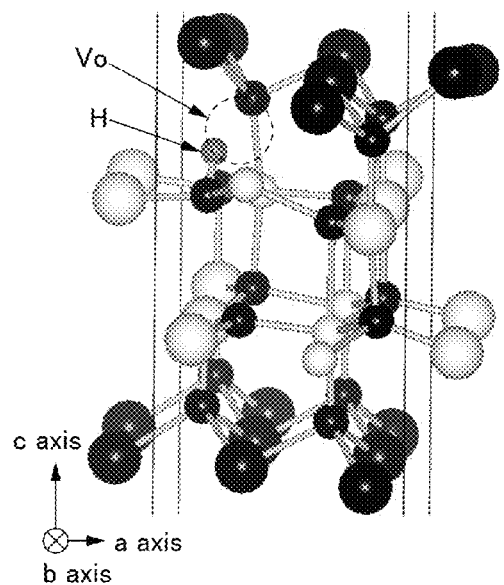
Figure 31D:
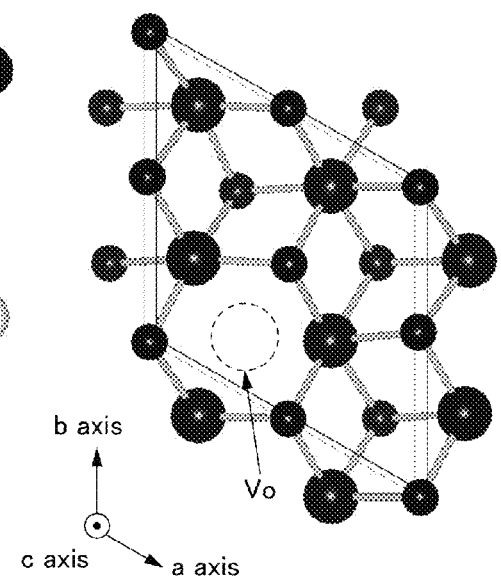

In the bulk model, one O atom bonded to three In atoms and one Zn atom is removed, whereby an oxygen vacancy ($V_O$) is formed. A model in which, in the vicinity of the oxygen vacancy $V_O$, an H atom is bonded to one O atom to which one Ga atom and two Zn atoms are bonded on the a-b plane was prepared (see FIG. 31C). FIG. 31D shows a diagram in which the a-b plane of the InO layer in FIG. 31C is viewed from the c-axis direction. In FIGS. 31C and 31D, an oxygen vacancy $V_O$ is shown in a dashed line. A model in which an oxygen vacancy $V_O$ is formed and, in the vicinity of the oxygen vacancy $V_O$, an H atom is bonded to one O atom to which one Ga atom and two Zn atoms are bonded on the a-b plane is expressed as $V_O+H$.

Optimization calculation was performed on the above two models with a fixed lattice constant to calculate the total energy. Note that as the value of the total energy is smaller, the structure becomes more stable.

In the calculation, first principles calculation software VASP was used. The calculation conditions are shown in Table 4.

TABLE 4

| Software | VASP |
| Pseudopotential | PAW method |
| Functional | GGA/PBE |
| Cut-off energy | 500 eV |
| k-point | 4 × 4 × 1 |

As pseudopotential calculation of electronic states, a potential generated by a PAW method was used, and as a functional, generalized-gradient-approximation/Perdew-Burke-Ernzerhof (GGA/PBE) was used.

In addition, the total energy of the two models that were obtained by the calculations is shown in Table 5.

TABLE 5

| Model | Total energy |
| --- | --- |
| VoH | −456.084 eV |
| Vo + H | −455.304 eV |

According to Table 5, the total energy of $V_OH$ is lower than that of $V_O+H$ by 0.78 eV. Thus, $V_OH$ is more stable than $V_O+H$. This suggests that, when an H atom comes close to an oxygen vacancy ($V_O$), the H atom is easily trapped in the oxygen vacancy ($V_O$) than bonding with an O atom.

<2-2. Thermodynamic State of $V_OH$>

Next, the thermodynamic state of $V_OH$, which is an H atom trapped in an oxygen vacancy ($V_O$), is evaluated with electronic state calculation, and the results are described.

The formation energies of the defects $V_OH$ contained in the IGZO, $(V_OH)^+$, $(V_OH)^-$, and $(V_OH)^0$, were calculated. Note that $(V_OH)^+$ represents a state in which a defect releases one electron, $(V_OH)^-$ represents a state in which a defect traps one electron, and $(V_OH)^0$ represents a state in which no electron is transferred.

Figure 32:
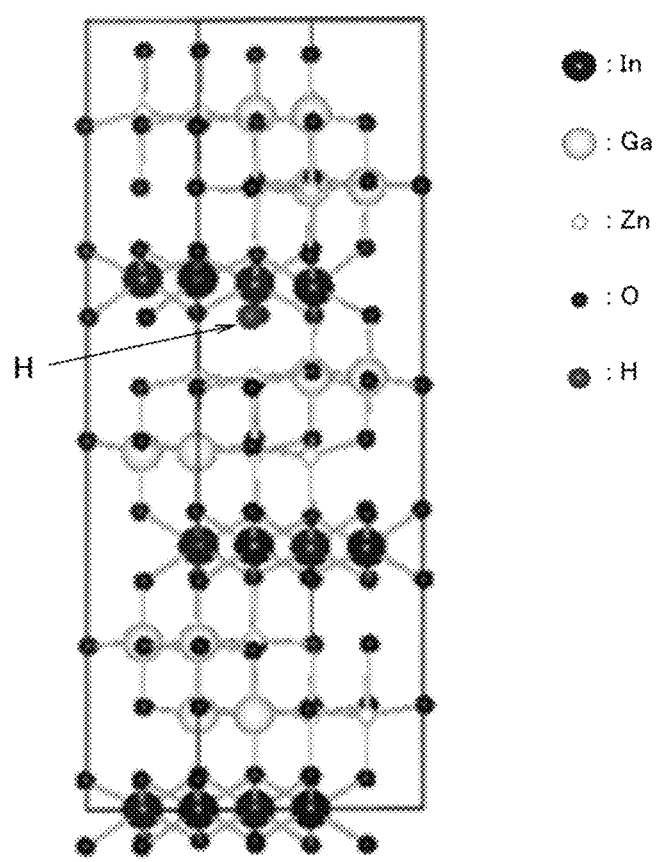
FIG. 32 illustrates a structure of a model.

In the calculation, the first principles calculation software VASP was used. The calculation conditions are shown in Table 6. FIG. 32 illustrates a model that was used for the calculation. The formation energy was calculated on the assumption of the reaction in Formula 2 below. As pseudopotential calculation of electronic states, a potential generated by a PAW method was used, and as a functional, Heyd-Scuseria-Ernzerhof (HSE) DFT hybrid factor (HSE06) was used. Note that the formation energy of an oxygen vacancy was calculated as follows: a dilute limit of the concentration of oxygen vacancies was assumed, and excessive expansion of electrons and holes to the conduction band and the valence band was corrected. In addition, shift of the valence band due to the defect structure was corrected using the average electrostatic potential with the valence band maximum of a complete crystal serving as the origin of energy.

TABLE 6

| Software | VASP |
|---|---|
| Pseudopotential | PAW method |
| Functional | HSE06 |
| Cut-off energy | 800 eV |
| The number of k-point samples | 2 × 2 × 1 (optimization) |
| | 4 × 4 × 1 (single) |
| Spin | Polarized |
| Shielding parameter | 0.2 |
| Exchange term mixing ratio | 0.25 |
| The number of atoms | 84 |

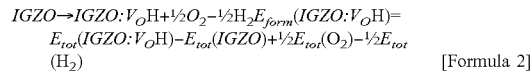

$IGZO \to IGZO{:}V_OH + \tfrac{1}{2}O_2 - \tfrac{1}{2}H_2 \; E_{form}(IGZO{:}V_OH) = E_{tot}(IGZO{:}V_OH) - E_{tot}(IGZO) + \tfrac{1}{2}E_{tot}(O_2) - \tfrac{1}{2}E_{tot}(H_2)$ [Formula 2]

Figure 33A:
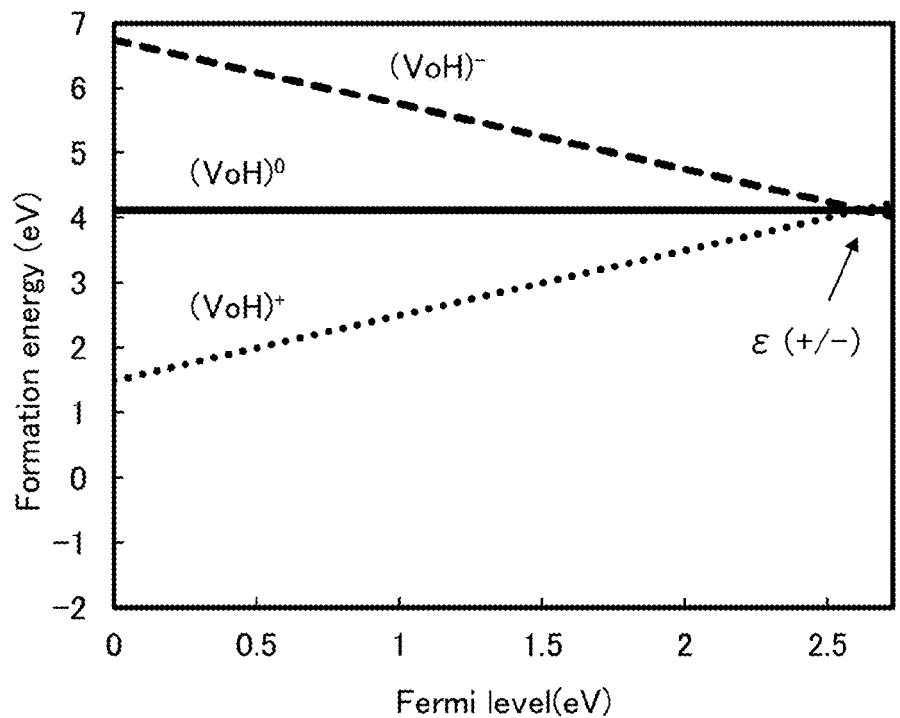
FIGS. 33A and 33B illustrate the relationship between the formation energy and transition levels of V$_O$H and the thermodynamic transition level of V$_O$H.

The formation energy obtained by the calculation is shown in FIG. 33A.

FIG. 33A shows the formation energies of $(V_OH)^+$, $(V_OH)^-$, and $(V_OH)^0$. The lateral axis represents the Fermi level, and the longitudinal axis represents the formation energy. The dotted line represents the formation energy of $(V_OH)^+$, the solid line represents the formation energy of $(V_OH)^0$, and the dashed line represents the formation energy of $(V_OH)^-$. In addition, the transition level of the $V_OH$ charge from $(V_OH)^+$ to $(V_OH)^-$ through $(V_OH)^0$ is represented by $\in(+/-)$.

Figure 33B:
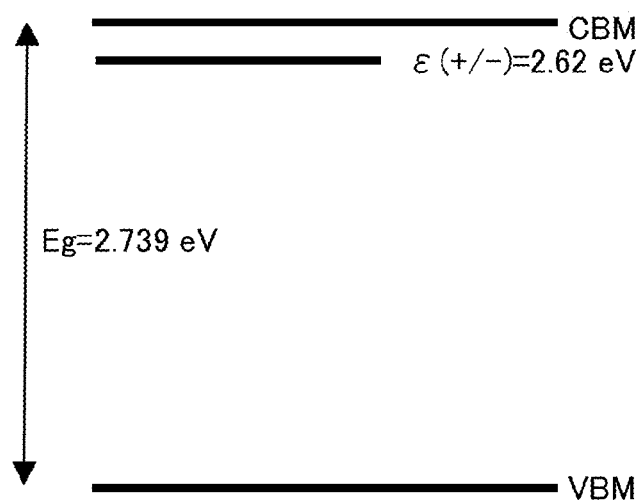

FIG. 33B shows a thermodynamic transition level of $V_OH$. From the calculation result, the energy gap of InGaZnO$_4$ was 2.739 eV. In addition, when the energy of the valence band is 0 eV, the transfer level ($\in(+/-)$) is 2.62 eV, which exists just under the conduction band. These suggest that in the case where the Fermi level exists in the energy gap, the charge state of $V_OH$ is always +1 and $V_OH$ serves as a donor. This shows that IGZO(111) becomes n-type by trapping an H atom in an oxygen vacancy ($V_O$).

Figure 34:
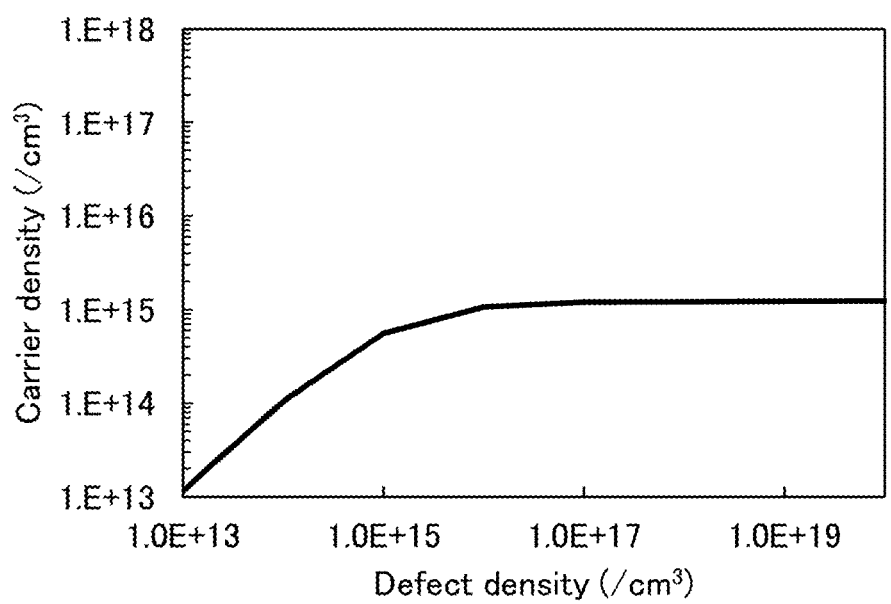
FIG. 34 shows the relationship between the carrier density and the defect density of V$_O$H.

Next, FIG. 34 shows the evaluation results of the relationship between the carrier (electron) density and the defect ($V_OH$) density.

FIG. 34 shows that the carrier density increases as the defect ($V_OH$) density increases.

Accordingly, it is found that $V_OH$ in the IGZO(111) serves as a donor. In addition, it is also found that when the density of $V_OH$ becomes high, the IGZO(111) becomes n-type.

<3. Model Explaining Relationship Between DOS in Oxide Semiconductor Film and Element to be DOS>

When density of states (DOS) exists inside an oxide semiconductor film and in the vicinity of the interface between the oxide semiconductor film and the outside, DOS can cause deterioration of a transistor including the oxide semiconductor film. The DOS inside the oxide semiconductor film and in the vicinity of the interface with the oxide semiconductor film can be explained on the basis of the positions of and the bonding relation among oxygen (O), an oxygen vacancy ($V_O$), hydrogen (H), and nitrogen oxide (NO$_x$). A concept of a model is described below.

In order to fabricate a transistor with stable electrical characteristics, it is important to reduce the DOS inside the oxide semiconductor film and in the vicinity of the interface (to make a highly purified intrinsic state). In order to reduce the DOS, oxygen vacancies, hydrogen, and nitrogen oxide should be reduced. A relationship between DOS, which exists inside the oxide semiconductor film and in the vicinity of the interface with the oxide semiconductor film, and an oxygen vacancy, hydrogen, and nitrogen oxide will be described below with the use of a model.

Figure 35:
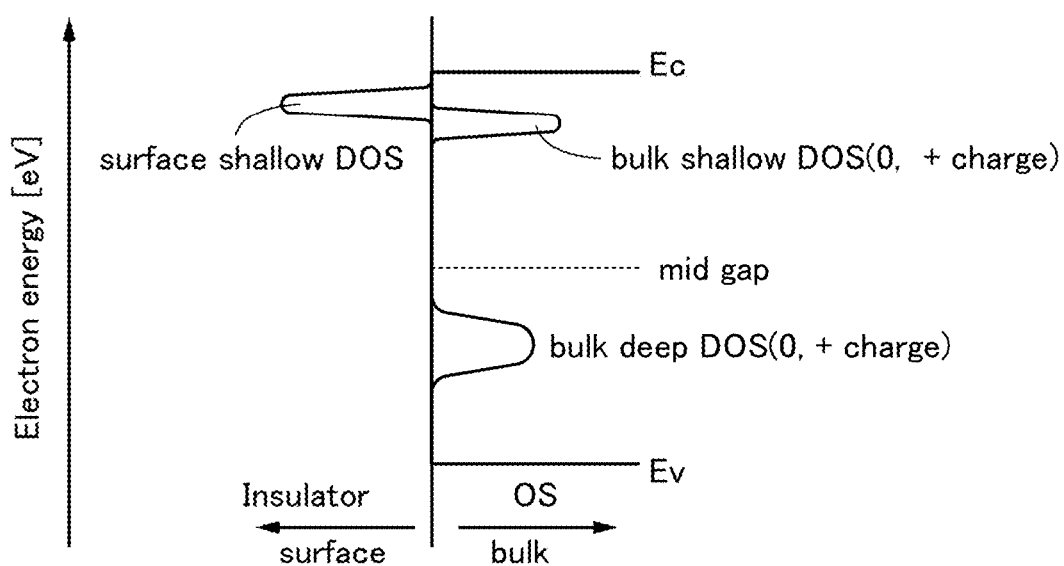
FIG. 35 illustrates a band structure of DOS inside an oxide semiconductor film and in the vicinity of the interface of the oxide semiconductor film.

FIG. 35 illustrates a band structure of DOS inside an oxide semiconductor film and in the vicinity of the interface of the oxide semiconductor film. The case where the oxide semiconductor film is the oxide semiconductor film (IGZO (111)) containing indium, gallium, and zinc is described below.

There are two types of DOS, DOS at a shallow level (shallow level DOS) and DOS at a deep level (deep level DOS). Note that in this specification, the shallow level DOS refers to DOS between energy at the conduction band minimum (Ec) and the mid gap. Thus, for example, the shallow level DOS is located closer to energy at the conduction band minimum. Note that in this specification, the deep level DOS refers to DOS between energy at the valence band maximum (Ev) and the mid gap. Thus, for example, the deep level DOS is located closer to the mid gap than to energy at the valence band maximum.

In the oxide semiconductor film, there are two types of shallow level DOS. One is DOS in the vicinity of a surface of an oxide semiconductor film (at the interface with an insulating film (insulator) or in the vicinity of the interface with the insulating film), that is, surface shallow DOS. The other is DOS inside the oxide semiconductor film, that is, bulk shallow DOS. Furthermore, as a type of the deep level DOS, there is DOS inside the oxide semiconductor film, that is, bulk deep DOS.

These types of DOS are likely to act as described below. The surface shallow DOS in the vicinity of the surface of an oxide semiconductor film is located at a shallow level from the conduction band minimum, and thus trap and loss of an electric charge are likely to occur easily in the surface shallow DOS. The bulk shallow DOS inside the oxide semiconductor film is located at a deep level from the conduction band minimum as compared to the surface shallow DOS in the vicinity of the surface of the oxide semiconductor film, and thus loss of an electric charge does not easily occur in the bulk shallow DOS.

An element causing DOS in an oxide semiconductor film is described below.

For example, when a silicon oxide film is formed over an oxide semiconductor film, indium contained in the oxide semiconductor film is taken into the silicon oxide film and replaced with silicon to form shallow level DOS.

For example, in the interface between the oxide semiconductor film and the silicon oxide film, a bond between oxygen and indium contained in the oxide semiconductor film is broken and a bond between the oxygen and silicon is generated. This is because the bonding energy between silicon and oxygen is higher than the bonding energy between indium and oxygen, and the valence of silicon (tetravalence) is larger than the valence of indium (trivalence). Oxygen contained in the oxide semiconductor film is trapped by silicon, so that a site of oxygen that has been bonded to indium becomes an oxygen vacancy. In addition, this phenomenon occurs similarly when silicon is contained inside the oxide semiconductor film, as well as in the surface. Such an oxygen vacancy forms deep level DOS.

Another cause as well as silicon can break the bond between indium and oxygen. For example, in an oxide semiconductor film containing indium, gallium, and zinc, the bond between indium and oxygen is weaker and cut more easily than the bond between oxygen and gallium or zinc. For this reason, the bond between indium and oxygen is broken by plasma damages or damages due to sputtered particles, so that an oxygen vacancy can be produced. The oxygen vacancy forms deep level DOS.

The deep level DOS can trap a hole and thus serve as a hole trap (hole trapping center). This means that the oxygen vacancy forms bulk deep DOS inside the oxide semiconductor film. Since such an oxygen vacancy forms bulk deep DOS, the oxygen vacancy is an instability factor to the oxide semiconductor film.

Such deep level DOS due to an oxygen vacancy is one of causes for forming bulk shallow DOS in the oxide semiconductor film, which is described below.

In addition, an oxygen vacancy in the oxide semiconductor film traps hydrogen to be metastable. That is, when an oxygen vacancy that is deep level DOS and is capable of trapping a hole traps hydrogen, the oxygen vacancy forms bulk shallow DOS and becomes metastable. As described in <Thermodynamic State of $V_OH$> of this embodiment, when an oxygen vacancy traps hydrogen, the oxygen vacancy is positively charged. That is, $V_OH$, which is one bulk shallow DOS in the oxide semiconductor film, releases an electron, to be neutrally or positively charged, which adversely affects the characteristics of a transistor.

It is important to reduce the density of oxygen vacancies to prevent an adverse effect on the characteristics of the transistor. Thus, by supplying excess oxygen to the oxide semiconductor film, that is, by filling oxygen vacancies with excess oxygen, the density of oxygen vacancies in the oxide semiconductor film can be lowered. In other words, the oxygen vacancies become stable by receiving excess oxygen. For example, when excess oxygen is included in the oxide semiconductor film or an insulating film provided near the interface with the oxide semiconductor film, the excess oxygen can fill oxygen vacancies in the oxide semiconductor film, thereby effectively eliminating or reducing oxygen vacancies in the oxide semiconductor film.

As described above, the oxygen vacancy may become a metastable state or a stable state by hydrogen or oxygen.

As described in <Transition Level of $NO_x$ in Oxide Insulating Film> of this embodiment, NO or $NO_2$, which is $NO_x$, traps an electron included in the oxide semiconductor film. Because NO or $NO_2$, which is $NO_x$, is surface shallow DOS in the vicinity of the surface of the oxide semiconductor film, when $NO_x$ is included in the insulating film in the vicinity of the interface with the oxide semiconductor film, the characteristics of a transistor are adversely affected.

It is important to reduce the content of $NO_x$ in the insulating film in the vicinity of the interface with the oxide semiconductor film to prevent an adverse effect on the characteristics of the transistor.

<3-1. Model of Hysteresis Deterioration in Dark State of Transistor Including Oxide Semiconductor Film>

A mechanism in deterioration of a transistor including an oxide semiconductor film is described next. The transistor including an oxide semiconductor film deteriorates differently depending on whether or not the transistor is irradiated with light. When the transistor is irradiated with light, deterioration is likely to result from the bulk deep DOS at the deep level inside the oxide semiconductor film. When the transistor is not irradiated with light, deterioration is likely to result from the surface shallow DOS at the shallow level in the vicinity of the surface of the oxide semiconductor film (at the interface with an insulating film or in the vicinity thereof).

Thus, a state where the transistor including an oxide semiconductor film is not irradiated with light (dark state) is described. In the dark state, the deterioration mechanism of the transistor can be explained on the basis of trapping and releasing of a charge by the surface shallow DOS at the shallow level in the vicinity of the surface of the oxide semiconductor film (at the interface with an insulating film or in the vicinity of the interface). Note that here, a gate insulating film is described as an insulating film provided in the vicinity of the interface with the oxide semiconductor film.

Figure 36:
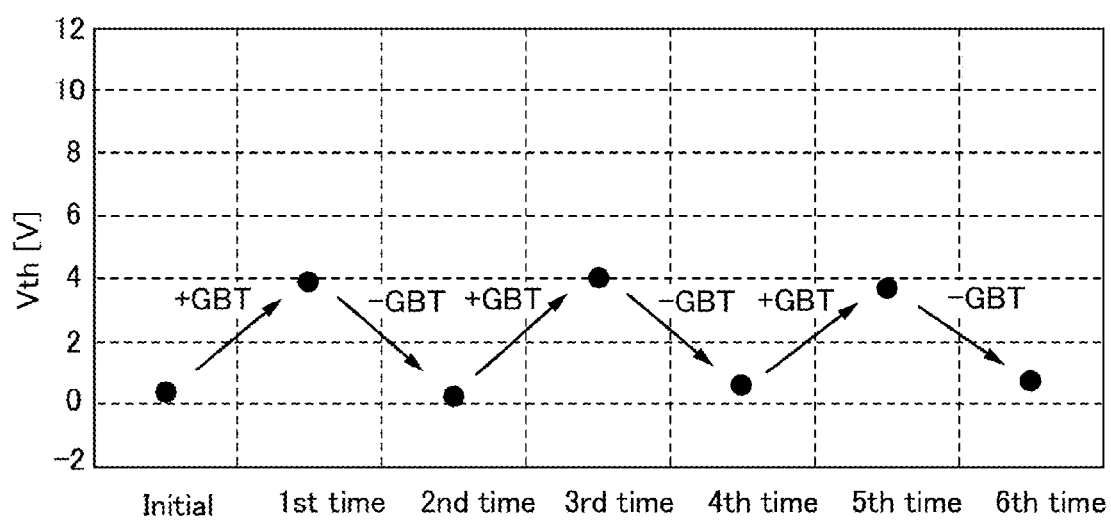
FIG. 36 is a graph showing deterioration of a transistor including an oxide semiconductor film in a dark state.

FIG. 36 shows variation in a threshold voltage ($V_{th}$) when the transistor including an oxide semiconductor film is subjected to a gate bias temperature (BT) stress test repeatedly in the dark state. As apparent from FIG. 36, the threshold voltage is shifted to a positive side by the positive gate BT (+GBT) stress test. Then, the transistor is subjected to a negative gate BT (−GBT) stress test, so that the threshold voltage is shifted to a negative side and is substantially equal to the initial value (initial). In this manner, by repeating the positive gate BT stress test and the negative gate BT stress test alternately, the threshold voltage is shifted positively and negatively (i.e., a hysteresis occurs). In other words, it is found that when the positive gate BT stress test and the negative gate BT stress test are repeated without light irradiation, the threshold voltage is shifted alternately to a positive side and then a negative side, but the shift fits in certain range as a whole.

Figure 37:
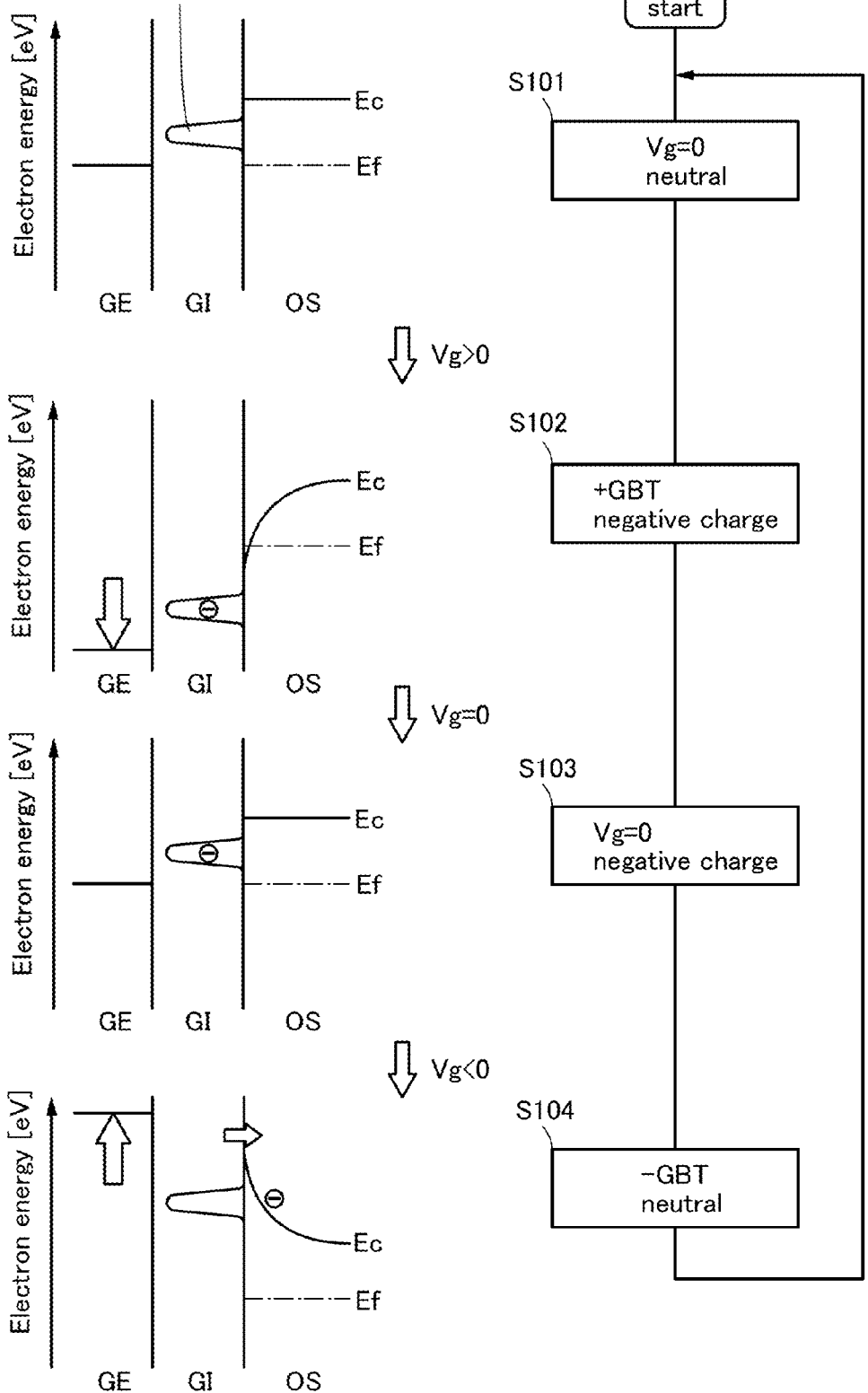
FIG. 37 illustrates deterioration of a transistor including an oxide semiconductor film in a dark state.

The variation in the threshold voltage of the transistor due to the gate BT stress test in the dark state can be explained with the surface shallow DOS in the vicinity of the surface of an oxide semiconductor film. FIG. 37 illustrates a band structure of an oxide semiconductor film and flow charts corresponding to the band structure.

Before application of the gate BT stress (at the gate voltage ($V_g$) of 0), the surface shallow DOS in the vicinity of the surface of an oxide semiconductor film has energy higher than the Fermi level ($E_f$) and is electrically neutral since an electron is not trapped (Step S101 in FIG. 37). In Step S101, the threshold voltage measured at this time is set as an initial value before the gate BT stress is applied.

Next, the positive gate BT stress test (dark state) is performed. When the positive gate voltage is applied, the conduction band is curved and the energy of the surface shallow DOS in the vicinity of the surface of the oxide semiconductor film becomes lower than the Fermi level. Thus, an electron is trapped in the surface shallow DOS in the vicinity of the surface of the oxide semiconductor film, so that the DOS is charged negatively (Step S102 in FIG. 37).

Next, the application of stress is stopped such that the gate voltage is 0. By the gate voltage at 0, the surface shallow DOS in the vicinity of the surface of an oxide semiconductor film has energy higher than the Fermi level. However, it takes a long time for the electron trapped in the surface shallow DOS in the vicinity of the surface of the oxide semiconductor film to be released. Thus, the surface shallow DOS in the vicinity of the surface of the oxide semiconductor film remains charged negatively (Step S103 in FIG. 37). At this time, a channel formation region of the transistor is being subjected to application of a negative voltage as well as the gate voltage. Accordingly, a gate voltage that is higher than the initial value should be applied so as to turn on the transistor, so that the threshold voltage is shifted to a positive side. In other words, the transistor tends to be normally off.

Next, a negative gate voltage is applied as the negative gate BT stress test (dark state). When the negative gate voltage is applied, the conduction band is curved and the energy of the surface shallow DOS in the vicinity of the surface of the oxide semiconductor film becomes much higher. Thus, the electron trapped in the surface shallow DOS in the vicinity of the surface of the oxide semiconductor film is released, so that the DOS becomes electrically neutral (Step S104 in FIG. 37).

Next, the application of stress is stopped such that the gate voltage is 0. The surface shallow DOS in the vicinity of the surface of an oxide semiconductor film at this time has released the electron and is electrically neutral (Step S101). Thus, the threshold voltage is shifted to a positive side, so that it returns to the initial value before the gate BT stress tests. The negative gate BT test and the positive gate BT stress test are repeated in the dark state, so that the threshold voltage is shifted repeatedly to the positive side and to the negative side. However, an electron trapped in the surface shallow DOS in the vicinity of the surface of an oxide semiconductor film at the time of the positive gate BT stress test is released at the time of the negative gate BT stress test; therefore, it is found that the threshold voltage is shifted within a certain range as a whole.

As described above, the shift in the threshold voltage of a transistor due to the gate BT stress test in the dark state can be explained on the basis of the understanding of the surface shallow DOS in the vicinity of the surface of the oxide semiconductor film.

<3-2. Model of Deterioration in Bright State of Transistor Including Oxide Semiconductor Film>

Then, a deterioration mechanism under light irradiation (bright state) is described here. The deterioration mechanism of the transistor in the bright state is explained on the basis of the trap and release of an electron in the bulk deep DOS at the deep level in the oxide semiconductor film.

Figure 38:
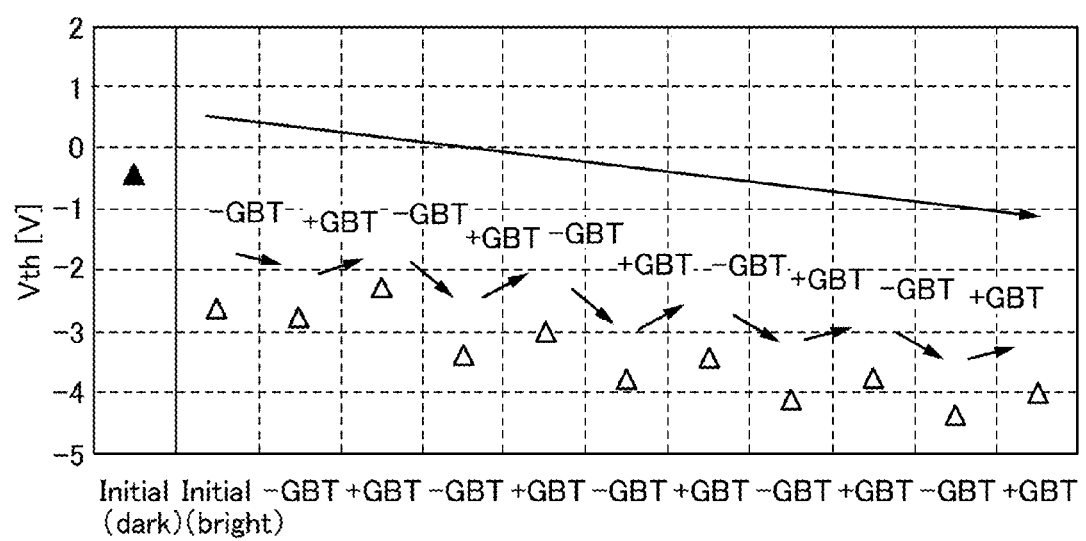
FIG. 38 is a graph showing deterioration of a transistor including an oxide semiconductor film under light irradiation.

FIG. 38 shows the shift in the threshold voltage ($V_{th}$) when the gate BT stress test is performed repeatedly on the transistor including an oxide semiconductor film in the bright state. As shown in FIG. 38, the threshold voltage ($V_{th}$) is shifted from the initial value (initial) in the negative direction.

In FIG. 38, a value measured in the dark state without application of the gate BT stress is plotted as the initial value of the threshold voltage. Then, the threshold voltage is measured in the bright state without application of the gate BT stress. As a result, the threshold voltage in the bright state is shifted to a negative side greatly from the threshold voltage in the dark state. One of the conceivable factors is that an electron and a hole are generated by light irradiation and the generated electron is excited to the conduction band. In other words, even when the gate BT stress is not applied, the threshold voltage of the transistor including an oxide semiconductor film is shifted to a negative side by light irradiation, so that the transistor is easily normally on. In this case, as the energy gap of the oxide semiconductor film is larger, or as fewer DOS exist in the gap, fewer electrons are excited. For that reason, the shift in the threshold voltage due to light irradiation is small in that case.

Then, when the negative gate BT stress is applied under light irradiation (−GBT), the threshold voltage is further shifted to a negative side.

After that, the positive gate BT (+GBT) stress test is performed under light irradiation, so that the threshold voltage is shifted to a positive side.

Further, when the negative gate BT stress test and the positive gate BT stress test are repeated under light irradiation, the threshold voltage is shifted to a positive side and a negative side repeatedly; as a result, it is found that the threshold voltage is shifted gradually to a negative side as a whole.

Figure 39:
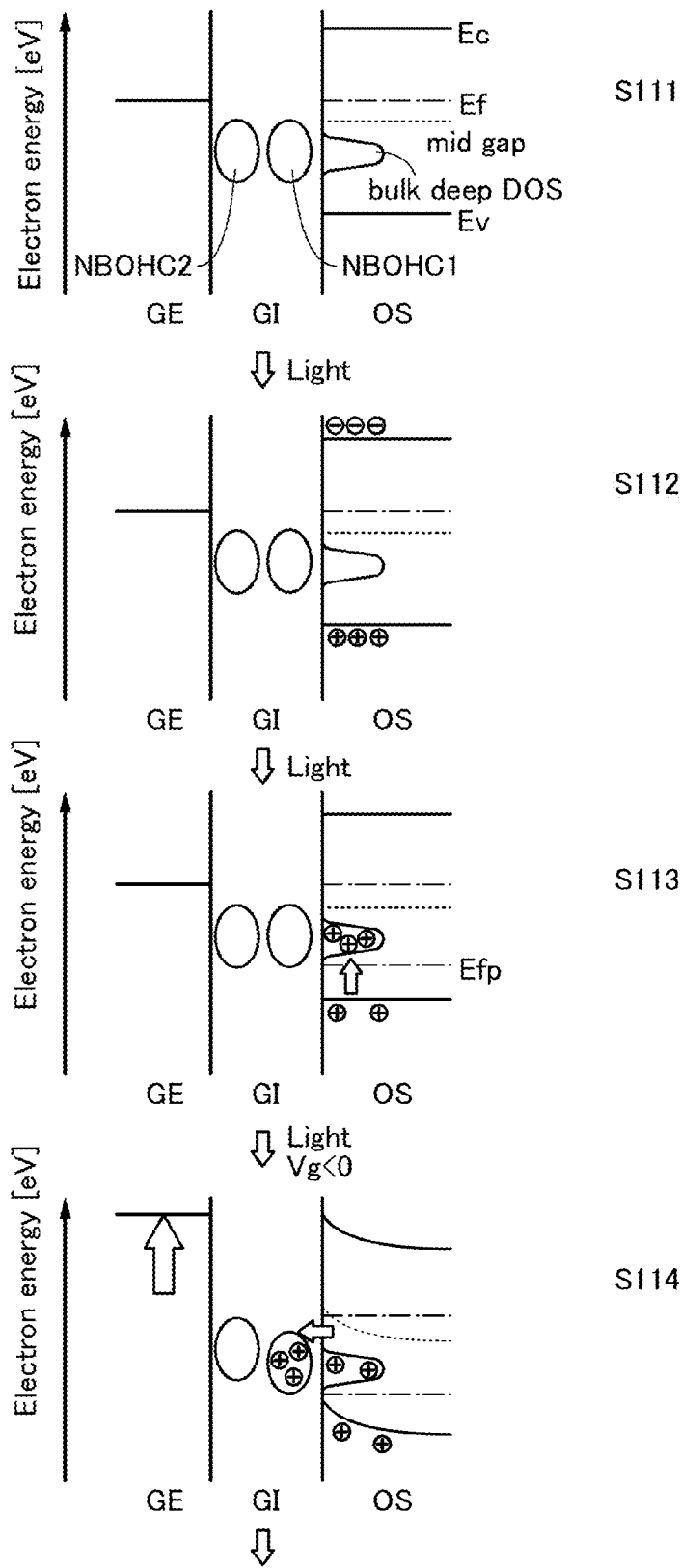
FIG. 39 illustrates deterioration of a transistor including an oxide semiconductor film under light irradiation.
Figure 40:
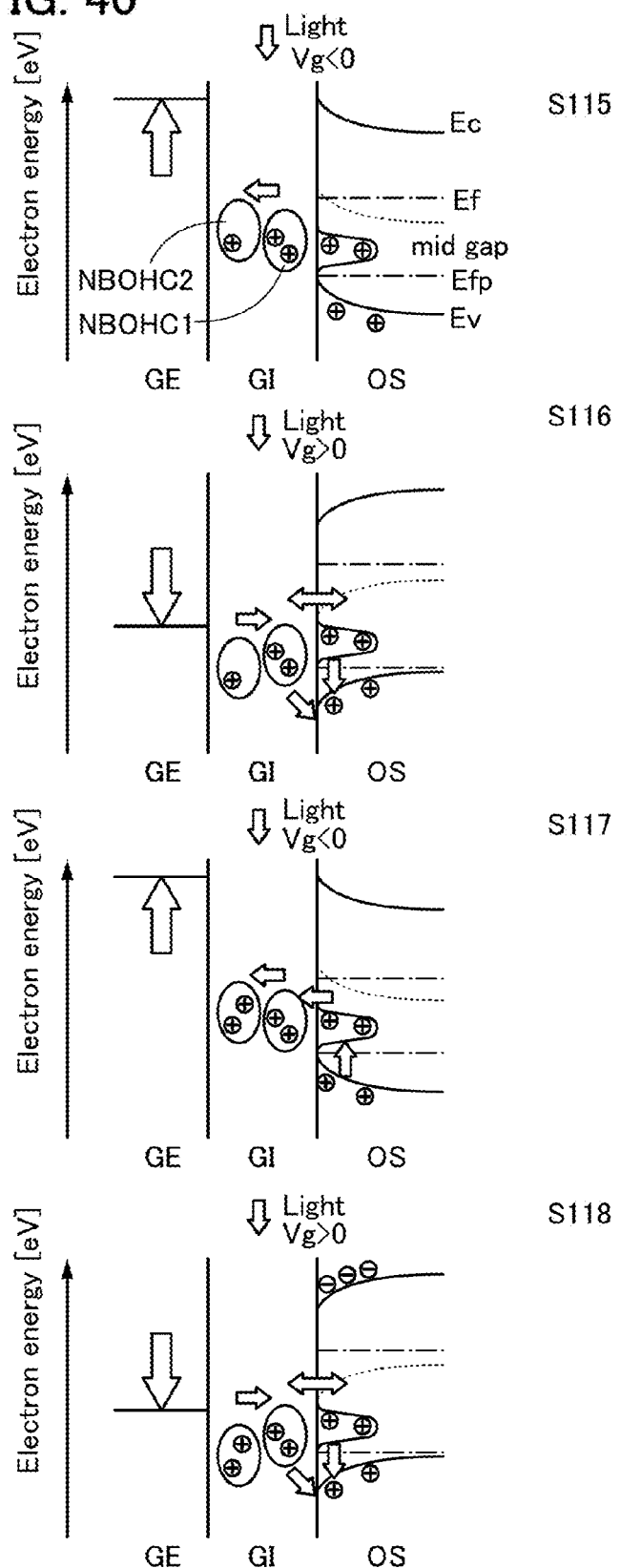
FIG. 40 illustrates deterioration of a transistor including an oxide semiconductor film under light irradiation.

In the gate BT stress tests (where the positive gate BT stress test and the negative gate BT stress test are repeated) in the bright state, a mechanism of the shift in the threshold voltage of the transistor is explained with reference to the band structures in FIG. 39 and FIG. 40. With reference to FIG. 39 and FIG. 40, the bulk deep DOS in the oxide semiconductor film and the non-bridging oxygen hole centers (NBOHC1 and NBOHC2) in the gate insulating film are described. Note that the non-bridging oxygen hole center (NBOHC1) is NBOHC that is located closer to the interface with the oxide semiconductor film (on the surface side) than the non-bridging oxygen hole center (NBOHC2) is.

Before the gate BT stress test and light irradiation (when the gate voltage ($V_g$) is 0), the bulk deep DOS in the oxide semiconductor film has energy lower than the Fermi level ($E_f$), and is electrically neutral since holes are not trapped (Step S111 in FIG. 39). At this time, the threshold voltage measured in the dark state is regarded as the initial value in the dark state.

Next, the oxide semiconductor film is irradiated with light without being subjected to the gate BT stress, so that electrons and holes are generated (Step S112 in FIG. 39). The generated electrons are excited to the conduction band, so that the threshold voltage is shifted to a negative side (electrons are not described in the subsequent steps). In addition, the generated holes lower the quasi-Fermi level ($E_{fp}$) of holes. Because the quasi-Fermi level ($E_{fp}$) of holes is lowered, holes are trapped in the bulk deep DOS inside the oxide semiconductor film (Step S113 in FIG. 39). Accordingly, under light irradiation without the gate BT stress test, the threshold voltage is shifted to the negative side, so that the transistor easily becomes normally on, unlike the transistor in the dark state.

Next, the negative gate BT stress test is performed under light irradiation, so that an electric field gradient is generated and holes trapped in the bulk deep DOS inside the oxide semiconductor film are injected to the non-bridging oxygen hole center (NBOHC1) in the gate insulating film (Step S114 in FIG. 39). In addition, some holes move into the non-bridging oxygen hole centers (NBOHC2) further inside the gate insulating film by the electric field (Step S115 in FIG. 40). The movement of holes from the non-bridging oxygen hole centers (NBOHC1) to the non-bridging oxygen hole centers (NBOHC2) in the gate insulating film progresses with time of the electric field application. The holes in the non-bridging oxygen hole centers (NBOHC1 and NBOHC2) in the gate insulating film act as positively-charged fixed charges, and shift the threshold voltage to the negative side, so that the transistor easily becomes normally on.

Light irradiation and the negative gate BT stress test are described as different steps for easy understanding, but the present invention is not construed as being limited to description in this embodiment. For example, Step S112 to Step S115 can occur in parallel.

Next, the positive gate BT stress test is performed under light irradiation, and holes trapped in the bulk deep DOS inside the oxide semiconductor film and holes in the non-bridging oxygen hole centers (NBOHC1) in the gate insulating film are released by the application of the positive gate voltage (Step S116 in FIG. 40). Thus, the threshold voltage is shifted to the positive side. Note that because the non-bridging oxygen hole center (NBOHC2) in the gate insulating film is at the deep level in the gate insulating film, almost no holes in the non-bridging oxygen hole centers (NBOHC2) are directly released even when the positive gate BT stress test is in the bright state. In order that the holes in the non-bridging oxygen hole center (NBOHC2) in the gate insulating film can be released, the holes should move to the non-bridging oxygen hole centers (NBOHC1) on the surface side. The movement of a hole from the non-bridging oxygen hole center (NBOHC2) to the non-bridging oxygen hole center (NBOHC1) in the gate insulating film progresses little by little with the time of electric field application. Therefore, the shift amount to the positive side of the threshold voltage is small, and the threshold voltage does not return completely to the initial value.

In addition, the movement of a hole occurs between the non-bridging oxygen hole center (NBOHC1) in the gate insulating film and the bulk deep DOS inside the oxide semiconductor film. However, because many holes have been trapped in the bulk deep DOS inside the oxide semiconductor film, the whole electric charge amount of the oxide semiconductor film and the gate insulating film can be hardly reduced.

Next, the negative gate BT stress test is performed again under light irradiation, so that an electric field gradient occurs and holes trapped in the bulk deep DOS inside the oxide semiconductor film are injected into the non-bridging oxygen hole center (NBOHC1) in the gate insulating film. In addition, some of the holes are injected into the non-bridging oxygen hole center (NBOHC2) that is deeper inside the gate insulating film by an electric field (Step S117 in FIG. 40). Note that the holes in the non-bridging oxygen hole centers (NBOHC2) in the gate insulating film, which have been injected thereinto in Step S115, are left without being released. Thus, holes are further injected, so that the number of holes serving as fixed charges is further increased. The threshold voltage is further shifted to the negative side, so that the transistor further easily becomes normally on.

Next, the positive gate BT stress test is performed under light irradiation, so that holes trapped in the bulk deep DOS in the oxide semiconductor film and holes in the non-bridging oxygen hole center (NBOHC1) in the gate insulating film are released by application of the positive gate voltage (Step S118 in FIG. 40). As a result, the threshold voltage is shifted to the positive side. However, the holes in the non-bridging oxygen hole center (NBOHC2) in the gate insulating film are hardly released. Accordingly, the shift amount to the positive side of the threshold voltage is small, and the threshold voltage does not return completely to the initial value.

It is presumed that by repeating the negative gate BT stress test and the positive gate BT stress test in the bright state as described above, the threshold voltage is gradually shifted to the negative side as a whole while the threshold voltage is shifted to the positive side and the negative side repeatedly.

The shift of the threshold voltage of the transistor in the gate BT stress test in the bright state can be explained on the basis of the bulk deep DOS inside the oxide semiconductor film and the non-bridging oxygen hole centers (NBOHC1 and NBOHC2) in the gate insulating film.

<3-3. Process Model of Dehydration, Dehydrogenation, and Oxygen Addition of Oxide Semiconductor Film>

In order to fabricate a transistor with stable electrical characteristics, it is important to reduce the DOS inside the oxide semiconductor film and in the vicinity of the interface of the oxide semiconductor film (to make a highly purified intrinsic state). A process model where the oxide semiconductor film is highly purified to be intrinsic is described below. Dehydration and dehydrogenation of the oxide semiconductor film are described first and then oxygen addition where an oxygen vacancy ($V_O$) is filled with oxygen is described.

Before a process model where the oxide semiconductor film is highly purified to be intrinsic is described, the position at which an oxygen vacancy is likely to be generated in the oxide semiconductor film is described. In the oxide semiconductor film containing indium, gallium, and zinc, the bond between indium and oxygen is broken most easily as compared to the bond between gallium and oxygen and the bond between zinc and oxygen. Thus, a model where the bond between indium and oxygen is broken to form an oxygen vacancy is described below.

When the bond between indium and oxygen is broken, oxygen is released and a site of the oxygen that has been bonded to indium serves as an oxygen vacancy. The oxygen vacancy forms the deep level DOS at the deep level of the oxide semiconductor film. Because the oxygen vacancy in the oxide semiconductor film is instable, it traps oxygen or hydrogen to be stable. For this reason, when hydrogen exists near an oxygen vacancy, the oxygen vacancy traps hydrogen to become $V_OH$. The $V_OH$ forms the shallow level DOS at the shallow level in the oxide semiconductor film.

Figure 41A:
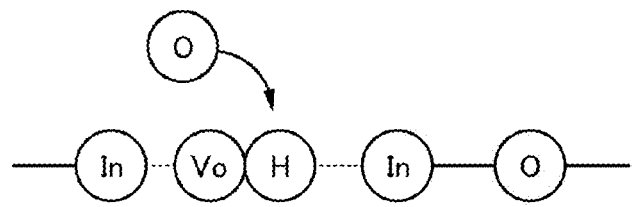
FIGS. 41A to 41F illustrate a model where an oxide semiconductor film is highly purified to be intrinsic.
Figure 41B:
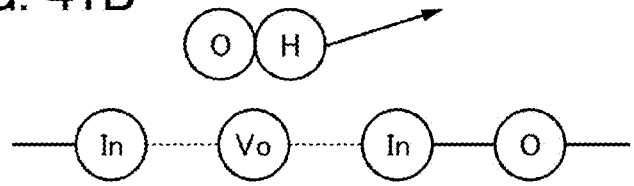

Next, when oxygen comes close to the $V_OH$ in the oxide semiconductor film, oxygen extracts hydrogen from $V_OH$ to become a hydroxyl group (OH), so that hydrogen is released from the $V_OH$ (see FIGS. 41A and 41B). The oxygen can move in the oxide semiconductor film so as to come closer to hydrogen by heat treatment and the like.

Figure 41C:
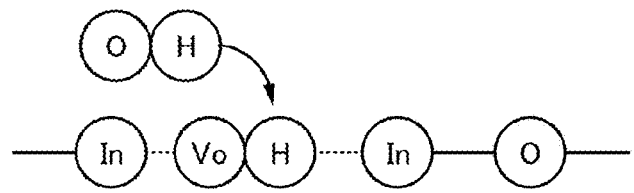
Figure 41D:
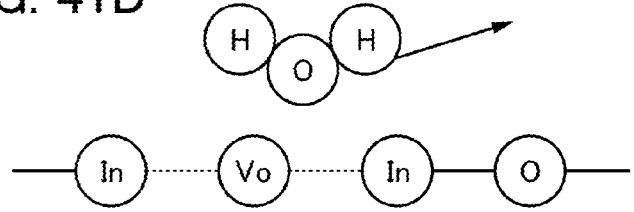

Furthermore, when the hydroxyl group comes closer to another $V_OH$ in the oxide semiconductor film, the hydroxyl group extracts hydrogen from $V_OH$ to become a water molecule ($H_2O$), so that hydrogen is released from $V_OH$ (see FIGS. 41C and 41D). In this manner, one oxygen atom releases two hydrogen atoms from the oxide semiconductor film. This is referred to as dehydration or dehydrogenation of the oxide semiconductor film. By the dehydration or dehydrogenation, the shallow level DOS at the shallow level in the oxide semiconductor film is reduced, and the deep level DOS is formed.

Figure 41E:
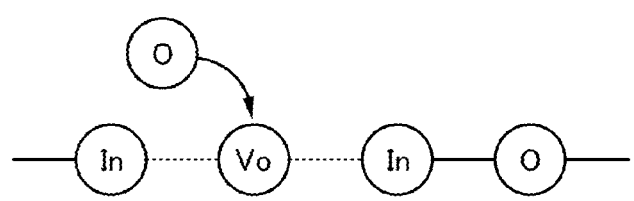
Figure 41F:
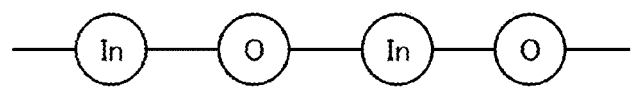

Next, when oxygen comes close to an oxygen vacancy in the oxide semiconductor film, oxygen is trapped by the oxygen vacancy, so that the oxygen vacancy is reduced (see FIGS. 41E and 41F). This is referred to as oxygen addition in the oxide semiconductor film. By the oxygen addition, the deep level DOS at the deep level in the oxide semiconductor film is reduced.

As described above, when dehydration or dehydrogenation and oxygen addition of the oxide semiconductor film are performed, the shallow level DOS and the deep level DOS in the oxide semiconductor film can be reduced. This process is referred to as a highly purification process for making an intrinsic oxide semiconductor.

Note that the structures, methods, and the like described in this embodiment can be used as appropriate in combination with any of the structures, methods, and the like described in the other embodiments and examples.

Embodiment 4

In this embodiment, one embodiment that can be applied to the oxide semiconductor film in any of the transistors included in the semiconductor device described in the above embodiment will be described.

An oxide semiconductor film is classified into a single crystal oxide semiconductor film and a non-single-crystal oxide semiconductor film. Examples of a non-single-crystal oxide semiconductor film include a c-axis aligned crystalline oxide semiconductor (CAAC-OS) film, a polycrystalline oxide semiconductor film, a nanocrystalline oxide semiconductor (nc-OS) film, an amorphous-like oxide semiconductor (a-like OS) film, and an amorphous oxide semiconductor film.

From another perspective, an oxide semiconductor film is classified into an amorphous oxide semiconductor film and a crystalline oxide semiconductor film. Examples of a crystalline oxide semiconductor film include a single crystal oxide semiconductor film, a CAAC-OS film, a polycrystalline oxide semiconductor film, and an nc-OS film.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor film cannot be regarded as a completely amorphous oxide semiconductor film. Moreover, an oxide semiconductor film that is not isotropic (e.g., an oxide semiconductor film that has a periodic structure in a microscopic region) cannot be regarded as a completely amorphous oxide semiconductor film. Note that an a-like OS film has a periodic structure in a microscopic region, but at the same time has a void and has an unstable structure. For this reason, an a-like OS film has physical properties similar to those of an amorphous oxide semiconductor film.

<CAAC-OS Film>

First, a CAAC-OS film is described.

A CAAC-OS film is one of oxide semiconductor films having a plurality of c-axis aligned crystal parts (also referred to as pellets).

In a combined analysis image (also referred to as a high-resolution TEM image) of a bright-field image and a diffraction pattern of a CAAC-OS film, which is obtained using a transmission electron microscope (TEM), a plurality of pellets can be observed. However, in the high-resolution TEM image, a boundary between pellets, that is, a grain boundary is not clearly observed. Thus, in the CAAC-OS film, a reduction in electron mobility due to the grain boundary is less likely to occur.

Figure 42A:
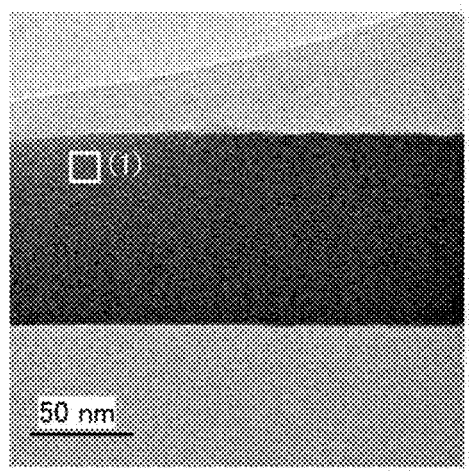
FIGS. 42A to 42D are Cs-corrected high-resolution TEM images of a cross section of a CAAC-OS film and a cross-sectional schematic view of a CAAC-OS film.

A CAAC-OS film observed with TEM is described below. FIG. 42A shows a high-resolution TEM image of a cross section of the CAAC-OS film which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 42B:
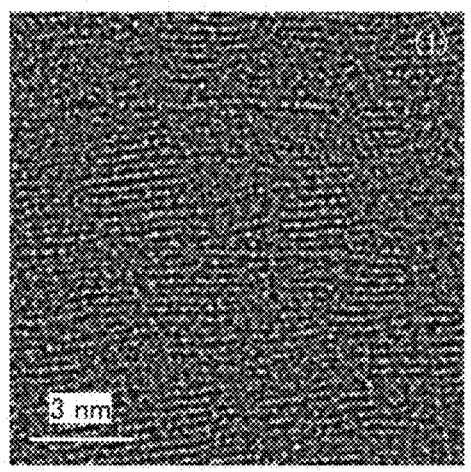

FIG. 42B is an enlarged Cs-corrected high-resolution TEM image of a region (1) in FIG. 42A. FIG. 42B shows that metal atoms are arranged in a layered manner in a pellet. Each metal atom layer has a configuration reflecting unevenness of a surface over which the CAAC-OS film is formed (hereinafter, the surface is referred to as a formation surface) or a top surface of the CAAC-OS film, and is arranged parallel to the formation surface or the top surface of the CAAC-OS film.

Figure 42C:
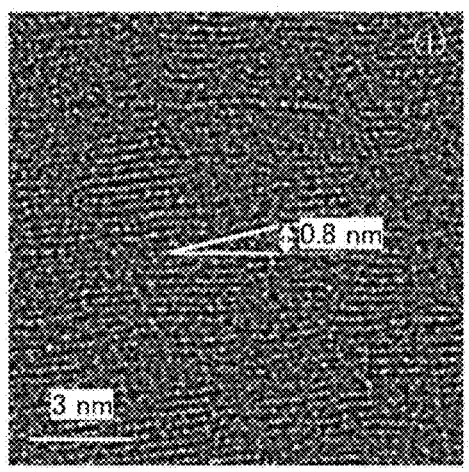

As shown in FIG. 42B, the CAAC-OS film has a characteristic atomic arrangement. The characteristic atomic arrangement is denoted by an auxiliary line in FIG. 42C. FIGS. 42B and 42C prove that the size of a pellet is approximately 1 nm to 3 nm, and the size of a space caused by tilt of the pellets is approximately 0.8 nm. Therefore, the pellet can also be referred to as a nanocrystal (nc). Furthermore, the CAAC-OS film can also be referred to as an oxide semiconductor film including c-axis aligned nanocrystals (CANC).

Figure 42D:
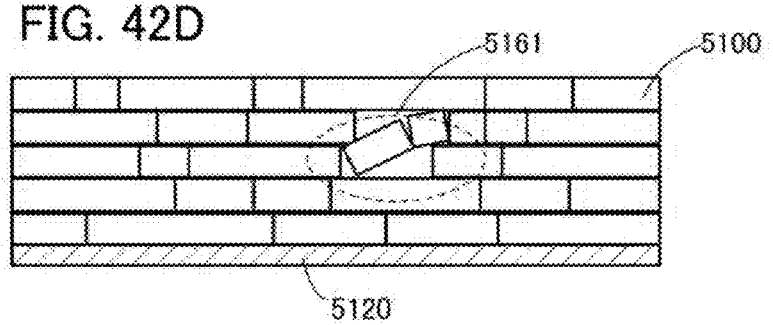

Here, according to the Cs-corrected high-resolution TEM images, the schematic arrangement of pellets 5100 of a CAAC-OS film over a substrate 5120 is illustrated by such a structure in which bricks or blocks are stacked (see FIG. 42D). The part in which the pellets are tilted as observed in FIG. 42C corresponds to a region 5161 shown in FIG. 42D.

FIG. 43A shows a Cs-corrected high-resolution TEM image of a plane of the CAAC-OS film observed from a direction substantially perpendicular to the sample surface. FIGS. 43B, 43C, and 43D are enlarged Cs-corrected high-resolution TEM images of regions (1), (2), and (3) in FIG. 43A, respectively. FIGS. 43B, 43C, and 43D indicate that metal atoms are arranged in a triangular, quadrangular, or hexagonal configuration in a pellet. However, there is no regularity of arrangement of metal atoms between different pellets.

Next, a CAAC-OS film analyzed by X-ray diffraction (XRD) is described. For example, when the structure of a CAAC-OS film including an $InGaZnO_4$ crystal is analyzed by an out-of-plane method, a peak appears at a diffraction angle ($2\theta$) of around 31° as shown in FIG. 44A. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that in structural analysis of the CAAC-OS film by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS film. It is preferable that in the CAAC-OS film analyzed by an out-of-plane method, a peak appear when $2\theta$ is around 31° and that a peak not appear when $2\theta$ is around 36°.

On the other hand, in structural analysis of the CAAC-OS film by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS film, when analysis ($\phi$ scan) is performed with $2\theta$ fixed at around 56° and with the sample rotated using a normal vector of the sample surface as an axis ($0$ axis), as shown in FIG. 44B, a peak is not clearly observed. In contrast, in the case of a single crystal oxide semiconductor film of $InGaZnO_4$, when $\phi$ scan is performed with $2\theta$ fixed at around 56°, as shown in FIG. 44C, six peaks which are derived from crystal planes equivalent to the (110) plane are observed. Accordingly, the structural analysis using XRD shows that the directions of a-axes and b-axes are different in the CAAC-OS film.

Figure 45A:
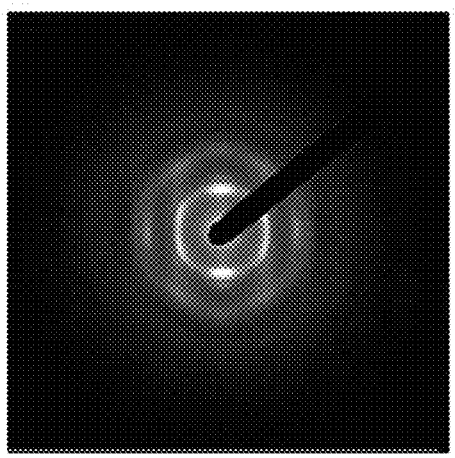
FIGS. 45A and 45B show electron diffraction patterns of a CAAC-OS film.
Figure 45B:
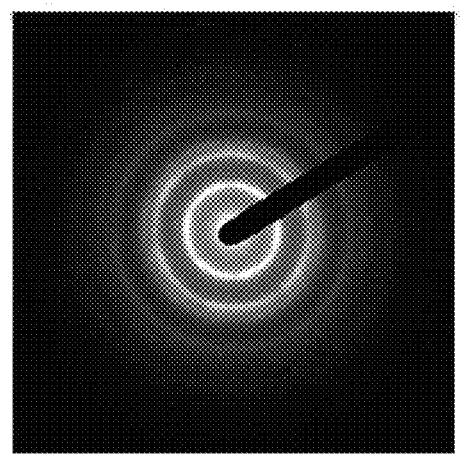

Next, a CAAC-OS film analyzed by electron diffraction is described. For example, when an electron beam with a probe diameter of 300 nm is incident on a CAAC-OS film including an $InGaZnO_4$ crystal in a direction parallel to the sample surface, a diffraction pattern (also referred to as a selected-area transmission electron diffraction pattern) shown in FIG. 45A might be obtained. In this diffraction pattern, spots derived from the (009) plane of an InGaZnO$_4$ crystal are included. Thus, the electron diffraction also indicates that pellets included in the CAAC-OS film have c-axis alignment and that the c-axes are aligned in a direction substantially perpendicular to the formation surface or the top surface of the CAAC-OS film. Meanwhile, FIG. 45B shows a diffraction pattern obtained in such a manner that an electron beam with a probe diameter of 300 nm is incident on the same sample in a direction perpendicular to the sample surface. As shown in FIG. 45B, a ring-like diffraction pattern is observed. Thus, the electron diffraction also indicates that the a-axes and b-axes of the pellets included in the CAAC-OS film do not have regular alignment. The first ring in FIG. 45B is considered to be derived from the (010) plane, the (100) plane, and the like of the InGaZnO$_4$ crystal. The second ring in FIG. 45B is considered to be derived from the (110) plane and the like.

As described above, the CAAC-OS film is an oxide semiconductor film with high crystallinity. Entry of impurities, formation of defects, or the like might decrease the crystallinity of an oxide semiconductor film. This means that the CAAC-OS film has small amounts of impurities and defects (e.g., oxygen vacancies).

Note that the impurity means an element other than the main components of the oxide semiconductor film, such as hydrogen, carbon, silicon, or a transition metal element. For example, an element (specifically, silicon or the like) having higher strength of bonding to oxygen than a metal element included in an oxide semiconductor film extracts oxygen from the oxide semiconductor film, which results in disorder of the atomic arrangement and reduced crystallinity of the oxide semiconductor film. A heavy metal such as iron or nickel, argon, carbon dioxide, or the like has a large atomic radius (or molecular radius), and thus disturbs the atomic arrangement of the oxide semiconductor film and decreases crystallinity.

The characteristics of an oxide semiconductor film having impurities or defects might be changed by light, heat, or the like. Impurities contained in the oxide semiconductor film might serve as carrier traps or carrier generation sources, for example. Furthermore, oxygen vacancies in the oxide semiconductor film serve as carrier traps or serve as carrier generation sources when hydrogen is captured therein.

The CAAC-OS film having small amounts of impurities and oxygen vacancies is an oxide semiconductor film with low carrier density. Specifically, an oxide semiconductor film with a carrier density of lower than $8\times10^{11}/cm^3$, preferably lower than $1\times10^{11}/cm^3$, further preferably lower than $1\times10^{10}/cm^3$, and higher than or equal to $1\times10^{-9}/cm^3$ can be used. Such an oxide semiconductor film is referred to as a highly purified intrinsic or substantially highly purified intrinsic oxide semiconductor film. A CAAC-OS film has a low impurity concentration and a low density of defect states. Thus, the CAAC-OS film can be referred to as an oxide semiconductor film having stable characteristics.

<nc-OS Film>

Next, an nc-OS film will be described.

An nc-OS film has a region in which a crystal part is observed and a region in which a crystal part is not clearly observed in a high-resolution TEM image. In most cases, the size of a crystal part included in the nc-OS film is greater than or equal to 1 nm and less than or equal to 10 nm, or greater than or equal to 1 nm and less than or equal to 3 nm. Note that an oxide semiconductor film including a crystal part whose size is greater than 10 nm and less than or equal to 100 nm is sometimes referred to as a microcrystalline oxide semiconductor film. In a high-resolution TEM image of the nc-OS film, for example, a grain boundary is not clearly observed in some cases. Note that there is a possibility that the origin of the nanocrystal is the same as that of a pellet in a CAAC-OS film. Therefore, a crystal part of the nc-OS film may be referred to as a pellet in the following description.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS film. Thus, the orientation of the whole film is not ordered. Accordingly, the nc-OS film cannot be distinguished from an a-like OS film or an amorphous oxide semiconductor film, depending on an analysis method. For example, when the nc-OS film is analyzed by an out-of-plane method using an X-ray beam having a diameter larger than the size of a pellet, a peak which shows a crystal plane does not appear. Furthermore, a diffraction pattern like a halo pattern is observed when the nc-OS film is subjected to electron diffraction using an electron beam with a probe diameter (e.g., 50 nm or larger) that is larger than the size of a pellet. Meanwhile, spots appear in a nanobeam electron diffraction pattern of the nc-OS film when an electron beam having a probe diameter close to or smaller than the size of a pellet is applied. Moreover, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

Since there is no regularity of crystal orientation between the pellets (nanocrystals) as mentioned above, the nc-OS film can also be referred to as an oxide semiconductor film including random aligned nanocrystals (RANC) or an oxide semiconductor film including non-aligned nanocrystals (NANC).

The nc-OS film is an oxide semiconductor film that has high regularity as compared with an amorphous oxide semiconductor film. Therefore, the nc-OS film is likely to have a lower density of defect states than an a-like OS film and an amorphous oxide semiconductor film. Note that there is no regularity of crystal orientation between different pellets in the nc-OS film. Therefore, the nc-OS film has a higher density of defect states than the CAAC-OS film.

<a-like OS Film>

An a-like OS film has a structure intermediate between those of the nc-OS film and the amorphous oxide semiconductor film.

In a high-resolution TEM image of the a-like OS film, a void may be observed. Furthermore, in the high-resolution TEM image, there are a region where a crystal part is clearly observed and a region where a crystal part is not observed.

The a-like OS film has an unstable structure because it includes a void. To verify that an a-like OS film has an unstable structure as compared with a CAAC-OS film and an nc-OS film, a change in structure caused by electron irradiation is described below.

An a-like OS film (referred to as Sample A), an nc-OS film (referred to as Sample B), and a CAAC-OS film (referred to as Sample C) are prepared as samples subjected to electron irradiation. Each of the samples includes an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 46:
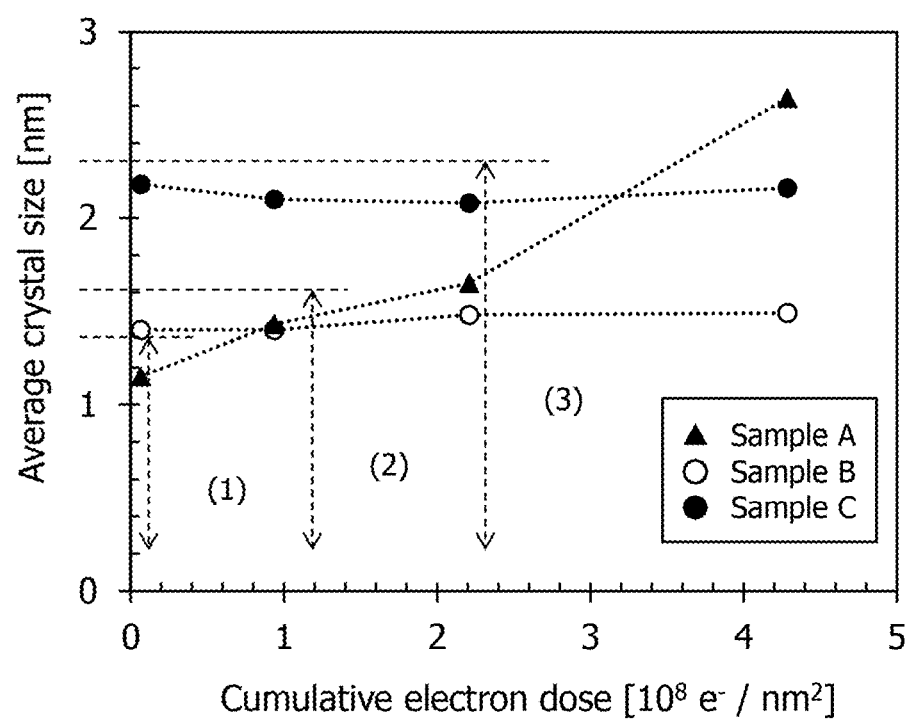
FIG. 46 shows a change in crystal part of an In—Ga—Zn oxide induced by electron irradiation.

FIG. 46 shows change in the average size of crystal parts (at 22 points to 45 points) in each sample. Note that the crystal part size corresponds to the length of a lattice fringe. FIG. 46 indicates that the crystal part size in the a-like OS film increases with an increase in the cumulative electron dose. Specifically, as shown by (1) in FIG. 46, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS film and the CAAC-OS film shows little change from the start of electron irradiation to a cumulative electron dose of $4.2 \times 10^8$ e$^-$/nm$^2$. Specifically, as shown by (2) and (3) in FIG. 46, the average crystal sizes in an nc-OS film and a CAAC-OS film are approximately 1.4 nm and approximately 2.1 nm, respectively, regardless of the cumulative electron dose.

In this manner, growth of the crystal part in the a-like OS film is induced by electron irradiation. In contrast, in the nc-OS film and the CAAC-OS film, growth of the crystal part is hardly induced by electron irradiation. Therefore, the a-like OS film has an unstable structure as compared with the nc-OS film and the CAAC-OS film.

The a-like OS film has a lower density than the nc-OS film and the CAAC-OS film because it includes a void. Specifically, the density of the a-like OS film is higher than or equal to 78.6% and lower than 92.3% of the density of the single crystal oxide semiconductor film having the same composition. The density of each of the nc-OS film and the CAAC-OS film is higher than or equal to 92.3% and lower than 100% of the density of the single crystal oxide semiconductor film having the same composition. Note that it is difficult to deposit an oxide semiconductor film having a density of lower than 78% of the density of the single crystal oxide semiconductor film.

For example, in the case of an oxide semiconductor film having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor film having an atomic ratio of In:Ga:Zn=1:1:1, the density of the a-like OS film is higher than or equal to 5.0 g/cm$^3$ and lower than 5.9 g/cm$^3$. For example, in the case of the oxide semiconductor film having an atomic ratio of In:Ga:Zn=1:1:1, the density of each of the nc-OS film and the CAAC-OS film is higher than or equal to 5.9 g/cm$^3$ and lower than 6.3 g/cm$^3$.

Note that there is a possibility that an oxide semiconductor film having a certain composition cannot exist in a single crystal structure. In that case, single crystal oxide semiconductor films with different compositions are combined at an adequate ratio, which makes it possible to calculate density equivalent to that of a single crystal oxide semiconductor film with the desired composition. The density of a single crystal oxide semiconductor film having the desired composition can be calculated using a weighted average according to the combination ratio of the single crystal oxide semiconductor films with different compositions. Note that it is preferable to use as few kinds of single crystal oxide semiconductor films as possible to calculate the density.

As described above, oxide semiconductor films have various structures and various properties. Note that an oxide semiconductor film may be a stacked layer including two or more films of an amorphous oxide semiconductor film, an a-like OS film, an nc-OS film, and a CAAC-OS film, for example.

<Deposition Model>

Examples of deposition models of a CAAC-OS and an nc-OS will be described below.

Figure 47A:
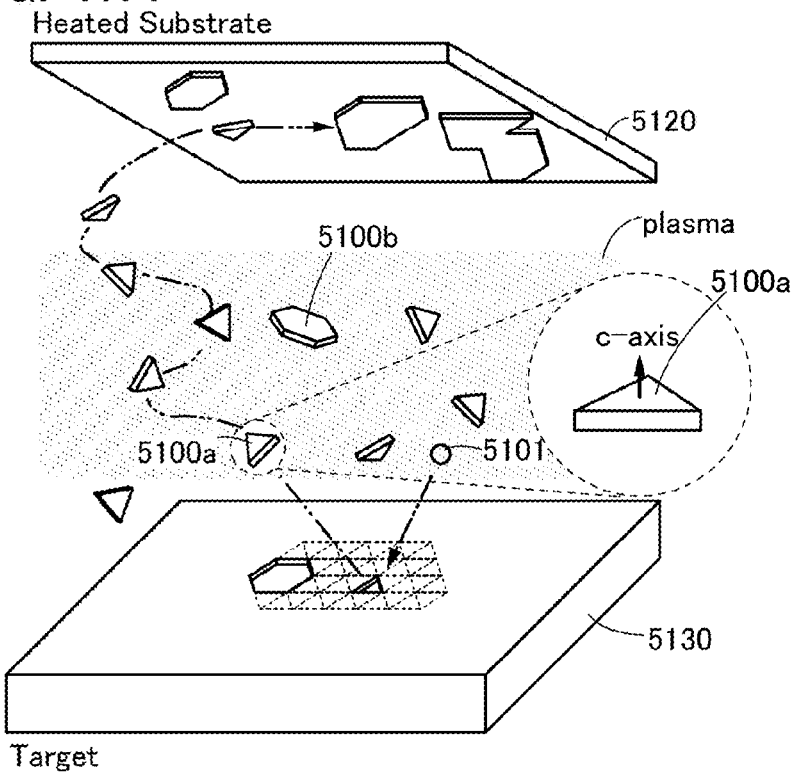
FIGS. 47A and 47B are schematic views showing deposition models of a CAAC-OS film and an nc-OS film.

FIG. 47A is a schematic view of the inside of a deposition chamber where a CAAC-OS film is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation (O$^+$) and an argon cation (Ar$^+$).

Figure 48A:
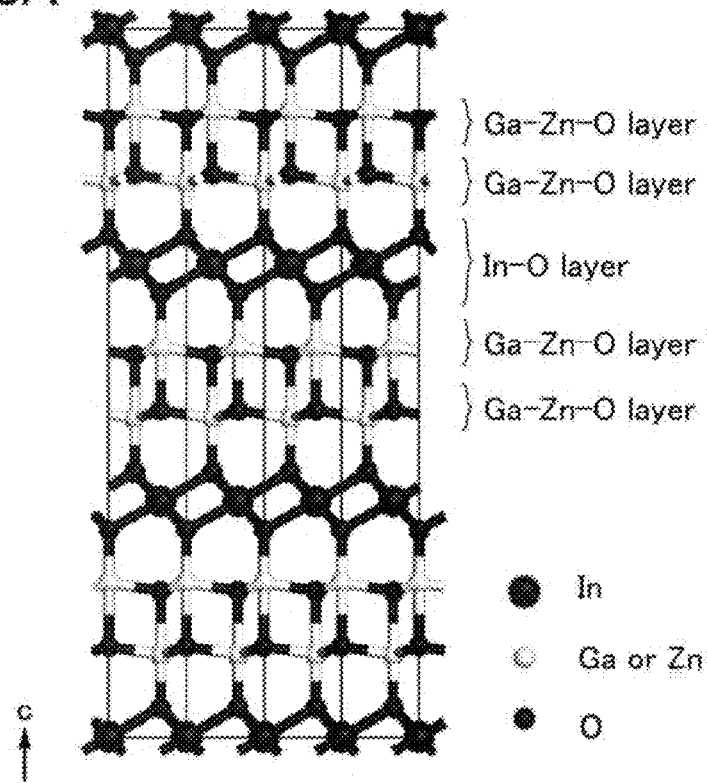
FIGS. 48A to 48C show an InGaZnO$_4$ crystal and a pellet.

Here, the target 5130 has a polycrystalline structure which includes a plurality of crystal grains and in which a cleavage plane exists in at least one crystal grain. FIG. 48A shows a structure of an InGaZnO$_4$ crystal included in the target 5130 as an example. Note that FIG. 48A shows a structure of the case where the InGaZnO$_4$ crystal is observed from a direction parallel to the b-axis. FIG. 48A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the InGaZnO$_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 48B:
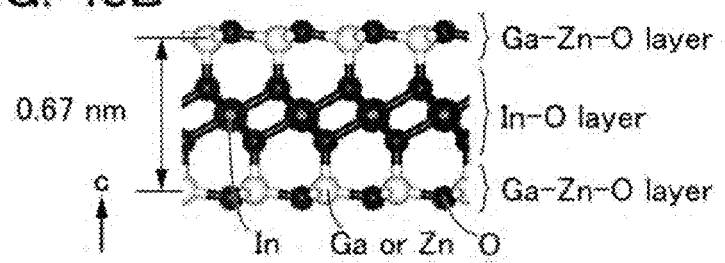
Figure 48C:
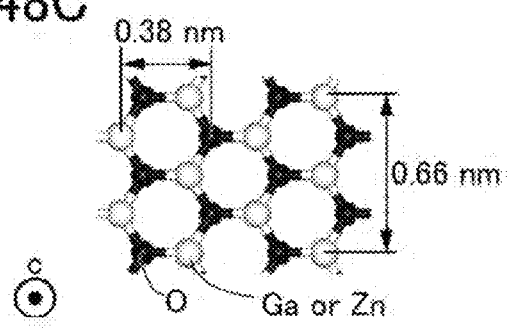

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 46. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 48B is separated. Note that FIG. 48C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS film includes an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 46 corresponds to the amount of growth in plasma. Here, in the case where the temperature of the substrate 5120 is at around room temperature, the pellet 5100 on the substrate 5120 hardly grows; thus, an nc-OS film is formed (see FIG. 47B). An nc-OS film can be deposited when the substrate 5120 has a large size because the deposition of an nc-OS film can be carried out at room temperature. Note that in order that the pellet 5100 grows in plasma, it is effective to increase deposition power in sputtering. High deposition power can stabilize the structure of the pellet 5100.

Figure 47B:
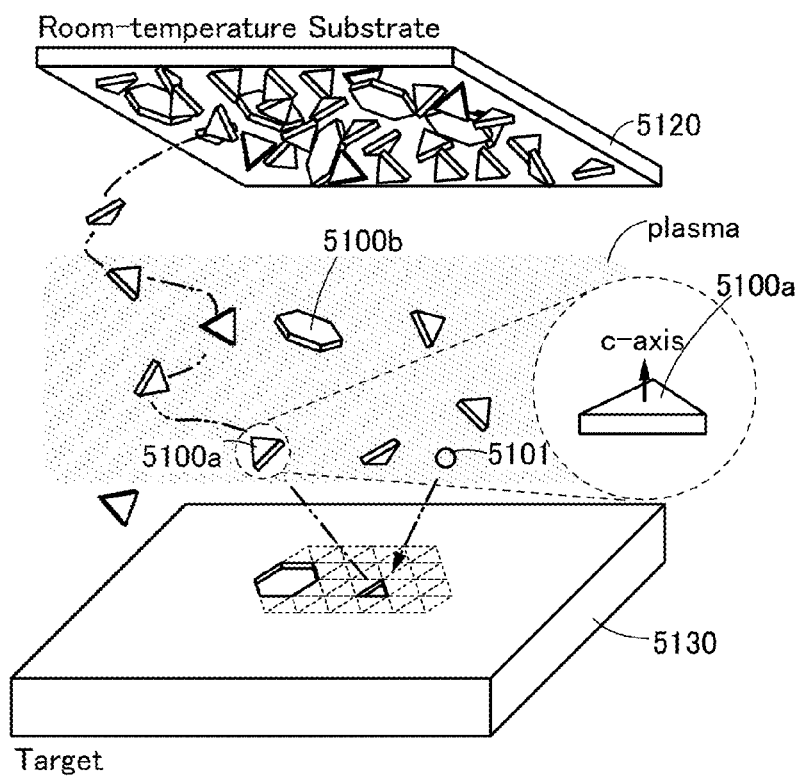

As shown in FIGS. 47A and 47B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 47A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS film might be filled; thus, the CAAC-OS film has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS film.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS film does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS film owing to heating during deposition, heating or bending after deposition, it is possible to relieve local stress or release distortion. Therefore, this structure is suitable for a flexible semiconductor device. Note that the nc-OS film has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 49A to 49D are cross-sectional schematic views.

Figure 49A:
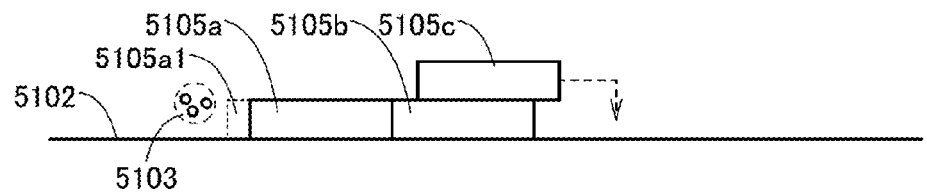
FIGS. 49A to 49D are schematic views showing a deposition model of a CAAC-OS film.

As illustrated in FIG. 49A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the pellet 5105a. Note that the plurality of particles 5103 may contain oxygen, zinc, indium, gallium, or the like.

Figure 49B:
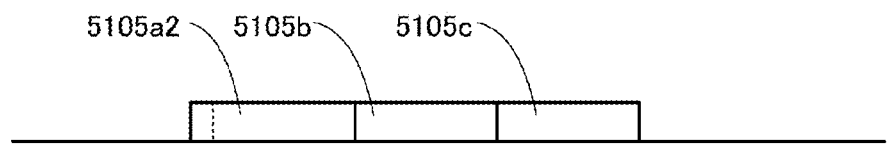

Then, as illustrated in FIG. 49B, the region 5105a1 grows to part of the pellet 5105a to form a pellet 5105a2. In addition, a side surface of the pellet 5105c is in contact with another side surface of the pellet 5105b.

Figure 49C:
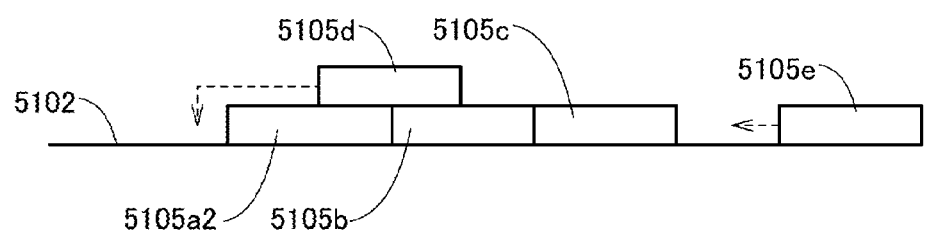

Next, as illustrated in FIG. 49C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 49D:
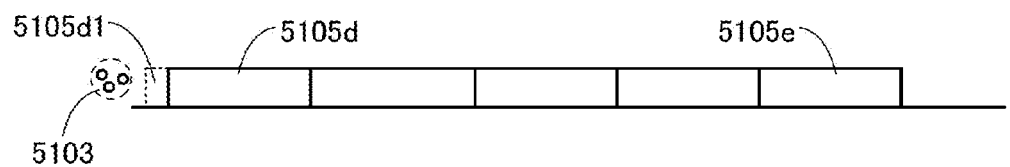

Then, as illustrated in FIG. 49D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heating of the substrate 5120 to form a region 5105d1 on another side surface of the pellet 5105d.

As described above, deposited pellets are placed to be in contact with each other and then growth is caused at side surfaces of the pellets, whereby a CAAC-OS film is formed over the substrate 5120. Therefore, each pellet of the CAAC-OS film is larger than that of the nc-OS film. A difference in size between (3) and (2) in FIG. 46 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS film can be deposited even when a formation surface does not have a crystal structure; therefore, a growth mechanism in this case is different from epitaxial growth. In addition, laser crystallization is not needed for formation of a CAAC-OS film, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS film can be formed.

In addition, it is found that in formation of the CAAC-OS film, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS film can be obtained.

In the case where the top surface of the substrate 5120 has unevenness, a CAAC-OS film in which n layers (n is a natural number) in each of which the pellets 5100 are arranged along the unevenness are stacked is formed. Since the substrate 5120 has unevenness, a gap is easily generated between the pellets 5100 in the CAAC-OS film in some cases. Note that, even in such a case, owing to intermolecular force, the pellets 5100 are arranged so that a gap between the pellets is as small as possible even on the unevenness surface. Therefore, even when the formation surface has unevenness, a CAAC-OS film with high crystallinity can be obtained.

Since the CAAC-OS film is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

Note that the structures, methods, and the like described in this embodiment can be used as appropriate in combination with any of the structures, methods, and the like described in the other embodiments and examples.

Embodiment 5

In this embodiment, an example of a circuit including the transistor of one embodiment of the present invention is described with reference to drawings.

[Cross-Sectional Structure]

FIG. 50A is a cross-sectional view of a semiconductor device of one embodiment of the present invention. The semiconductor device illustrated in FIG. 50A includes a transistor 2200 containing a first semiconductor material in a lower portion and a transistor 2100 containing a second semiconductor material in an upper portion. As the transistor 2100, any of the transistors described in the above embodiments can be used, and in FIG. 50A, an example in which the transistor 10 is used as the transistor 2100 is shown. A cross-sectional view of the transistor in the channel length direction is on the left side of a dashed-dotted line, and a cross-sectional view of the transistor in the channel width direction is on the right side of the dashed-dotted line.

The semiconductor device in the cross-sectional view has a structure in which the transistor 2100 is provided with a back gate; however, a structure without a back gate may be employed.

Here, the first semiconductor material and the second semiconductor material are preferably materials having different band gaps. For example, the first semiconductor material can be a semiconductor material (such as silicon (including strained silicon), germanium, silicon germanium, silicon carbide, gallium arsenide, aluminum gallium arsenide, indium phosphide, gallium nitride, or an organic semiconductor) other than an oxide semiconductor, and the second semiconductor material can be an oxide semiconductor. A transistor using a material other than an oxide semiconductor, such as single crystal silicon, can operate at high speed easily. In contrast, a transistor using an oxide semiconductor has low off-state current.

The transistor 2200 may be either an n-channel transistor or a p-channel transistor, and an appropriate transistor may be used in accordance with a circuit. Furthermore, the specific structure of the semiconductor device, such as the material or the structure used for the semiconductor device, is not necessarily limited to those described here except for the use of the transistor of one embodiment of the present invention which uses an oxide semiconductor.

FIG. 50A illustrates a structure in which the transistor 2100 is provided over the transistor 2200 with an insulating film 2201 and an insulating film 2207 provided therebetween. A plurality of wirings 2202 are provided between the transistor 2200 and the transistor 2100. Furthermore, wirings and electrodes provided over and under the insulating films are electrically connected to each other through a plurality of plugs 2203 embedded in the insulating films. An insulating film 2204 covering the transistor 2100, a wiring 2205 over the insulating film 2204, and a wiring 2206 formed by processing a conductive film that is also used for a pair of electrodes of the transistor 2100 are provided.

The stack of the two kinds of transistors reduces the area occupied by the circuit, allowing a plurality of circuits to be highly integrated.

Here, in the case where a silicon-based semiconductor material is used for the transistor 2200 provided in a lower portion, hydrogen in an insulating film provided in the vicinity of the semiconductor layer of the transistor 2200 terminates dangling bonds of silicon; accordingly, the reliability of the transistor 2200 can be improved. Meanwhile, in the case where an oxide semiconductor is used for the transistor 2100 provided in an upper portion, hydrogen in an insulating film provided in the vicinity of the semiconductor layer of the transistor 2100 becomes a factor of generating carriers in the oxide semiconductor; thus, the reliability of the transistor 2100 might be decreased. Therefore, in the case where the transistor 2100 using an oxide semiconductor is provided over the transistor 2200 using a silicon-based semiconductor material, it is particularly effective that the insulating film 2207 having a function of preventing diffusion of hydrogen is provided between the transistors 2100 and 2200. The insulating film 2207 makes hydrogen remain in the lower portion, thereby improving the reliability of the transistor 2200. In addition, since the insulating film 2207 suppresses diffusion of hydrogen from the lower portion to the upper portion, the reliability of the transistor 2100 also can be improved.

The insulating film 2207 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Furthermore, a blocking film 2208 (corresponding to the insulating film 19 in the transistor 10) having a function of preventing diffusion of hydrogen is preferably formed over the transistor 2100 to cover the transistor 2100 including an oxide semiconductor layer. For the blocking film 2208, a material that is similar to that of the insulating film 2207 can be used, and in particular, an aluminum oxide film is preferably used. The aluminum oxide film has a high shielding (blocking) effect of preventing penetration of both oxygen and impurities such as hydrogen and moisture. Thus, by using the aluminum oxide film as the blocking film 2208 covering the transistor 2100, release of oxygen from the oxide semiconductor layer included in the transistor 2100 can be prevented and entry of water and hydrogen into the oxide semiconductor layer can be prevented.

Note that the transistor 2200 can be a transistor of various types without being limited to a planar type transistor. For example, a FIN-type transistor, a TRI-GATE transistor, or the like can be used. An example of a cross-sectional view in this case is shown in FIG. 50D. An insulating film 2212 is provided over a semiconductor substrate 2211. The semiconductor substrate 2211 includes a projecting portion with a thin tip (also referred to a fin). Note that an insulating film may be provided over the projecting portion. The insulating film serves as a mask for preventing the semiconductor substrate 2211 from being etched when the projecting portion is formed. The projecting portion does not necessarily have the thin tip; a projecting portion with a cuboid-like projecting portion and a projecting portion with a thick tip are permitted, for example. A gate insulating film 2214 is provided over the projecting portion of the semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 includes the projecting portion; however, a semiconductor device of one embodiment of the present invention is not limited thereto. For example, a semiconductor region having a projecting portion may be formed by processing an SOI substrate.

[Circuit Configuration Example]

In the above structure, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

A circuit diagram in FIG. 50B shows a configuration of a "CMOS circuit" in which the p-channel transistor 2200 and the n-channel transistor 2100 are connected to each other in series and in which gates of them are connected to each other.

[Analog Switch]

A circuit diagram in FIG. 50C shows a configuration in which sources of the transistors 2100 and 2200 are connected to each other and drains of the transistors 2100 and 2200 are connected to each other. With such a configuration, the transistors can serve as what is called an analog switch.

[Memory Device Example]

Figure 51A:
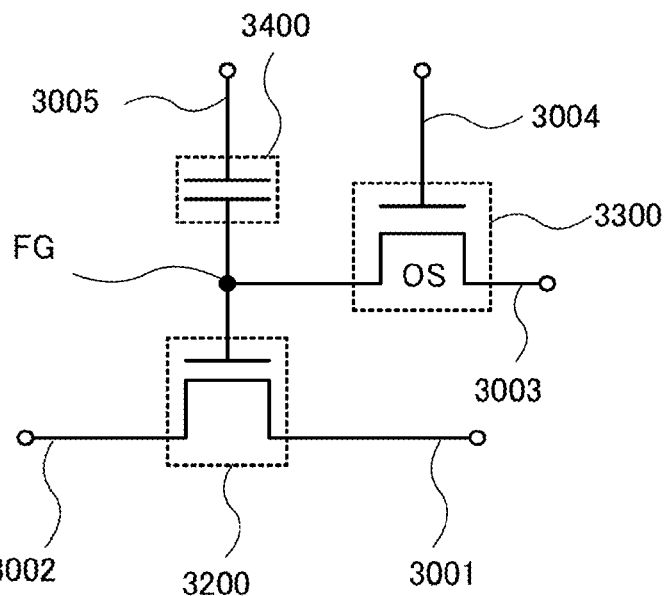
FIGS. 51A to 51C are circuit diagrams and a cross-sectional view each illustrating a memory device.
Figure 51B:
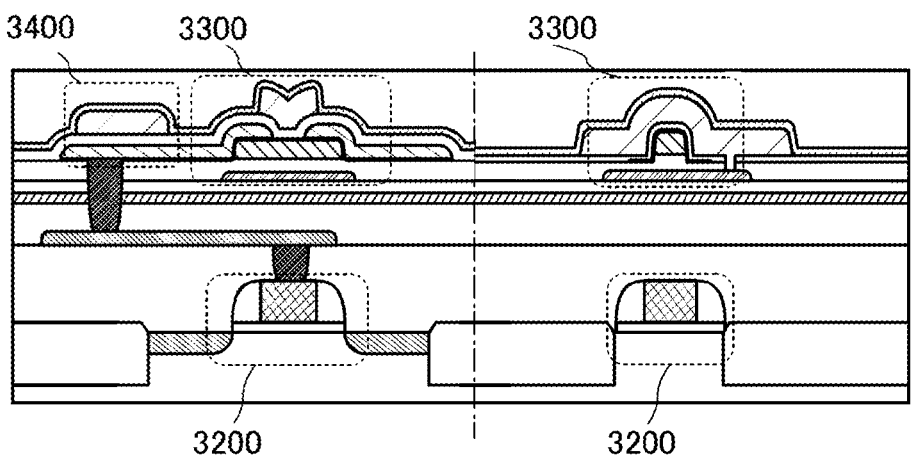
Figure 51C:
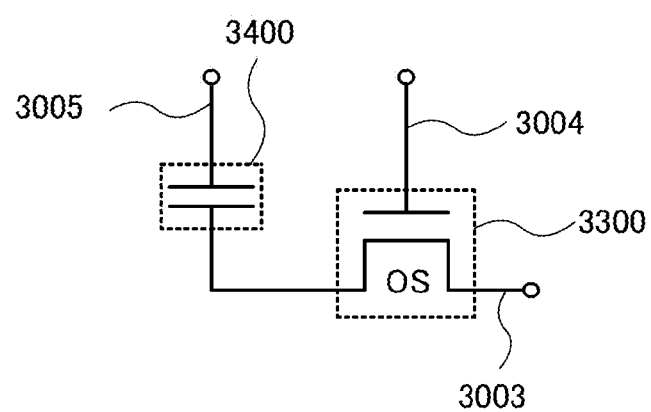

Examples of a semiconductor device (memory device), which includes the transistor of one embodiment of the present invention, which can retain stored data even when not powered, and which has an unlimited number of write cycles, are shown in FIGS. 51A to 51C.

The semiconductor device illustrated in FIG. 51A includes a transistor 3200 using a first semiconductor material, a transistor 3300 using a second semiconductor material, and a capacitor 3400. Note that any of the above-described transistors can be used as the transistor 3300.

FIG. 51B is a cross-sectional view of the semiconductor device illustrated in FIG. 51A. The semiconductor device in the cross-sectional view has a structure in which the transistor 3300 is provided with a back gate.

The transistor 3300 is a transistor in which a channel is formed in a semiconductor layer including an oxide semiconductor. Since the off-state current of the transistor 3300 is low, stored data can be retained for a long period. In other words, power consumption can be sufficiently reduced because a semiconductor device in which refresh operation is unnecessary or the frequency of refresh operation is extremely low can be provided.

In FIG. 51A, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 is electrically connected to the other of the source electrode, the drain electrode of the transistor 3300, and the one electrode of the capacitor 3400. A fifth wiring 3005 is electrically connected to the other electrode of the capacitor 3400.

The semiconductor device in FIG. 51A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely low, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell be read. In the case where such reading is not performed, the fifth wiring 3005 may be supplied with a potential at which the transistor 3200 is turned off regardless of the state of the gate electrode, that is, a potential lower than $V_{th\_H}$. Alternatively, the fifth wiring 3005 may be supplied with a potential at which the transistor 3200 is turned on regardless of the state of the gate electrode, that is, a potential higher than $V_{th\_L}$.

The semiconductor device illustrated in FIG. 51C is different from the semiconductor device illustrated in FIG. 51A in that the transistor 3200 is not provided. Also in this case, writing and retaining operation of data can be performed in a manner similar to the semiconductor device illustrated in FIG. 51A.

Next, reading of data is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely low off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device of the disclosed invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

Note that in this specification and the like, it may be possible for those skilled in the art to constitute one embodiment of the invention even when portions to which all the terminals of an active element (e.g., a transistor or a diode), a passive element (e.g., a capacitor or a resistor), are the like are connected are not specified. In other words, one embodiment of the invention is clear even when connection portions are not specified. Furthermore, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear. Moreover, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. Therefore, for example, in a diagram or text in which one or more active elements (e.g., transistors or diodes), wirings, passive elements (e.g., capacitors or resistors), conductive layers, insulating films, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<1V) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention.

Note that this embodiment can be combined with other embodiments and an example in this specification as appropriate.

Embodiment 6

In this embodiment, an RF tag that includes the transistor described in the above embodiments or the memory device described in the above embodiment is described with reference to FIG. 52.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 52. FIG. 52 is a block diagram illustrating a configuration example of an RF tag.

Figure 52:
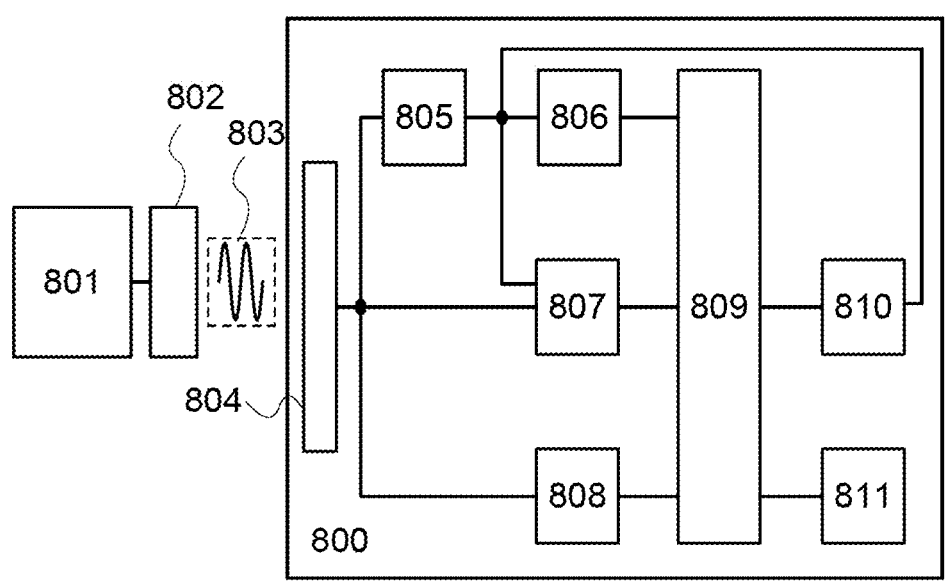
FIG. 52 illustrates a configuration example of an RF tag.

As shown in FIG. 52, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory circuit described in the above embodiment can be used as the memory circuit 810. Since the memory circuit of one embodiment of the present invention can retain data even when not powered, the memory circuit can be favorably used for an RF tag. Furthermore, the memory circuit of one embodiment of the present invention needs power (voltage) needed for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory circuit of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Note that this embodiment can be combined with other embodiments and an example in this specification as appropriate.

Embodiment 7

In this embodiment, a CPU including the memory device described in the above embodiment will be described.

Figure 53:
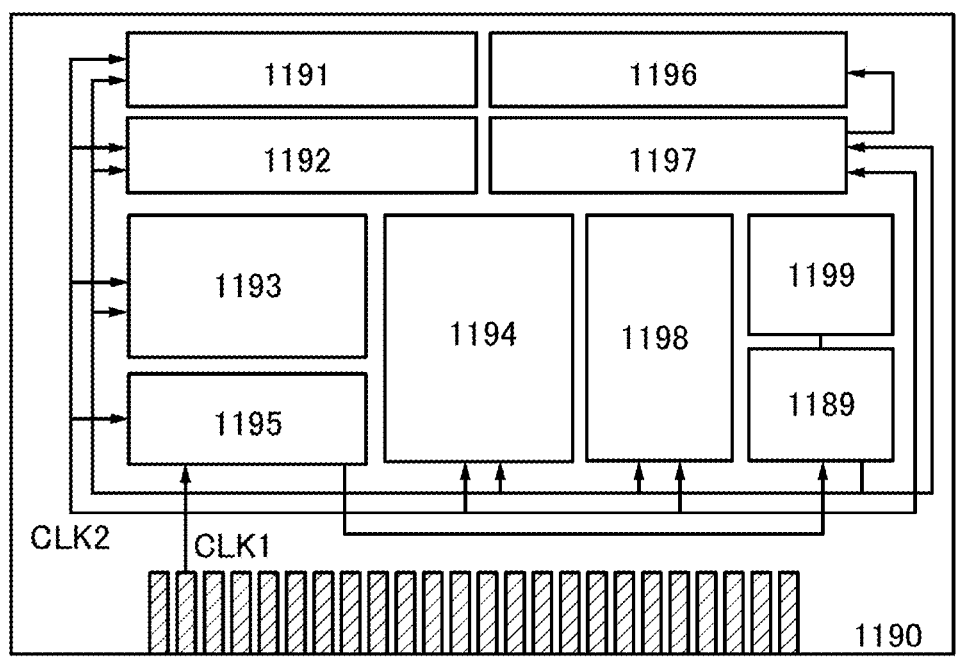
FIG. 53 illustrates a configuration example of a CPU.

FIG. 53 is a block diagram illustrating a configuration example of a CPU at least partly including any of the transistors described in the above embodiments as a component.

The CPU illustrated in FIG. 53 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 53 is just an example in which the configuration has been simplified, and an actual CPU may have a variety of configurations depending on the application. For example, the CPU may have the following configuration: a structure including the CPU illustrated in FIG. 53 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 53, a memory cell is provided in the register 1196. For the memory cell of the register 1196, any of the transistors described in the above embodiments can be used.

In the CPU illustrated in FIG. 53, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 54:
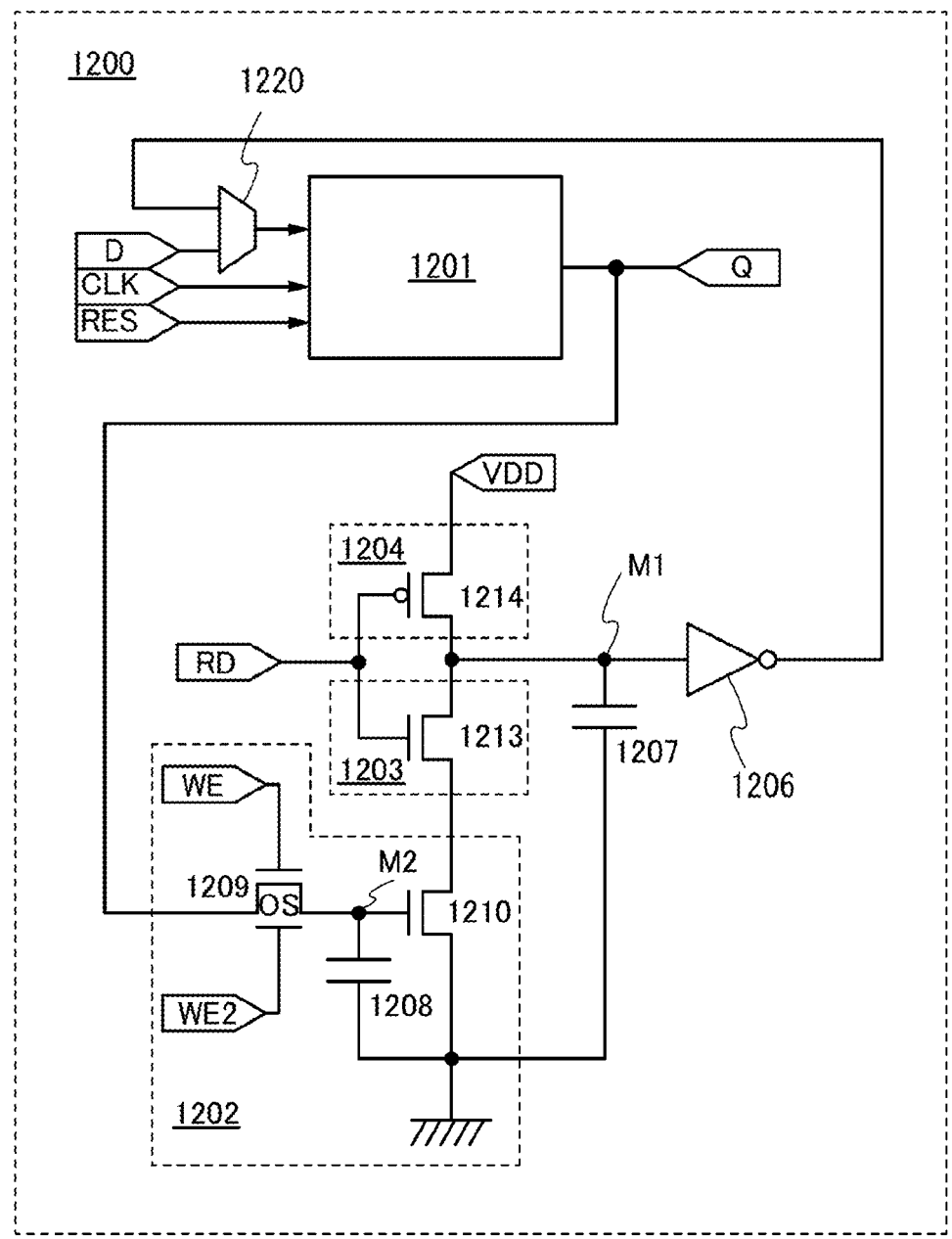
FIG. 54 is a circuit diagram of a memory element.

FIG. 54 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the memory device described in the above embodiment can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, a gate first of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessary as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

Note that the transistor 1209 in FIG. 54 has a structure with a second gate (second gate electrode; back gate). The control signal WE can be input to the first gate and the control signal WE2 can be input to the second gate. The control signal WE2 is a signal having a constant potential. As the constant potential, for example, a ground potential GND or a potential lower than a source potential of the transistor 1209 is selected. The control signal WE2 is a potential signal for controlling the threshold voltage of the transistor 1209, and Icut of the transistor 1209 can be further reduced. The control signal WE2 may be a signal having the same potential as that of the control signal WE. Note that as the transistor 1209, a transistor without a second gate may be used.

A signal corresponding to data retained in the circuit 1201 is input to the other of the source and the drain of the transistor 1209. FIG. 54 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 54, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 54, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 54, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency (RF) device.

Note that this embodiment can be combined with other embodiments and an example in this specification as appropriate.

Embodiment 8

In this embodiment, a configuration example of a display device using the transistor of one embodiment of the present invention will be described.

Configuration Example

Figure 55A:
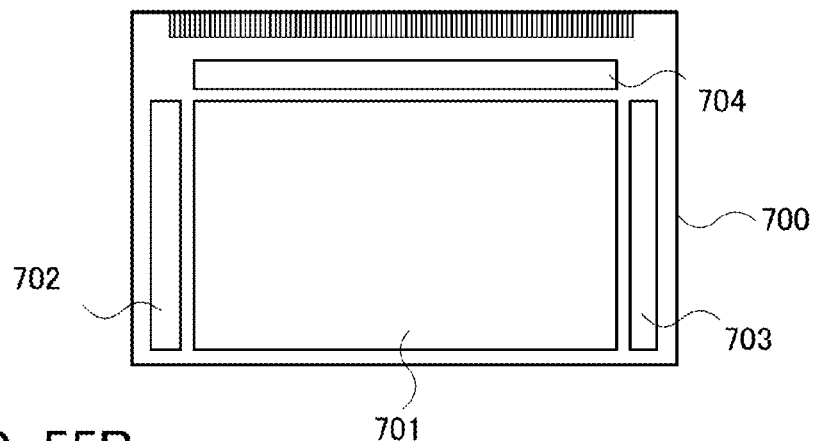
FIG. 55A illustrates a configuration example of a display device and FIGS. 55B and 55C are circuit diagrams of pixels.
Figure 55B:
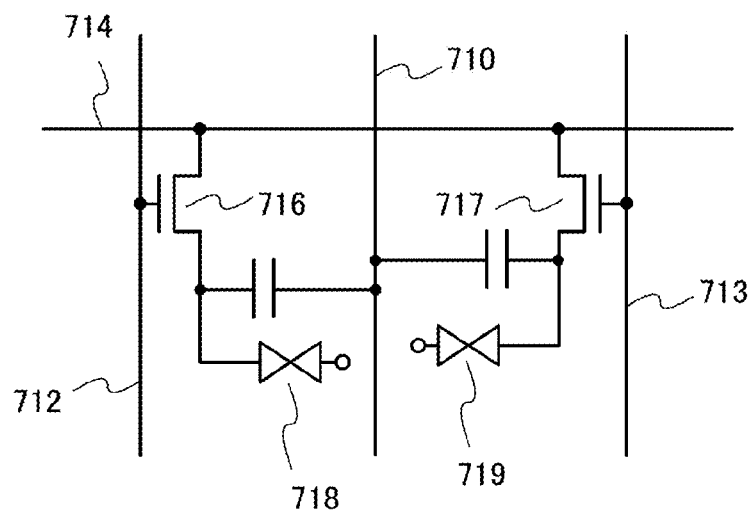
Figure 55C:
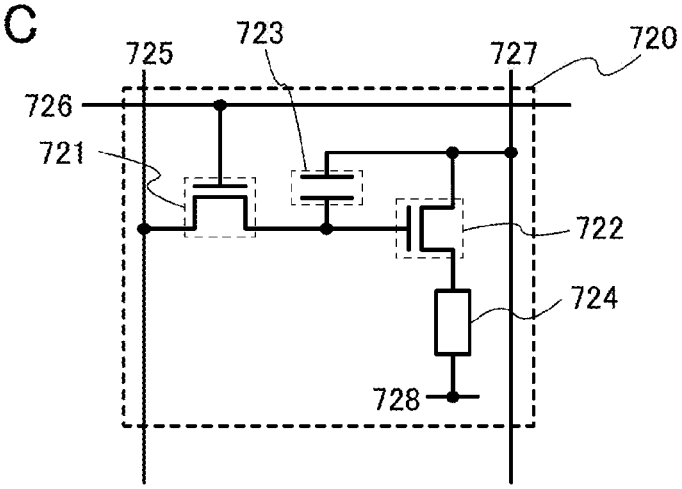

FIG. 55A is a top view of the display device of one embodiment of the present invention. FIG. 55B is a circuit diagram illustrating a pixel circuit that can be used in the case where a liquid crystal element is used in a pixel in the display device of one embodiment of the present invention. FIG. 55C is a circuit diagram illustrating a pixel circuit that can be used in the case where an organic EL element is used in a pixel in the display device of one embodiment of the present invention.

The transistor in the pixel portion can be formed in accordance with the above embodiments. Further, the transistor can easily be an n-channel transistor, and thus, part of a driver circuit that can be formed using an n-channel transistor in the driver circuit is formed over the same substrate as the transistor of the pixel portion. With the use of any of the transistors described in the above embodiments for the pixel portion or the driver circuit in this manner, a highly reliable display device can be provided.

FIG. 55A is an example of a top view of an active matrix display device. A pixel portion 701, a first scan line driver circuit 702, a second scan line driver circuit 703, and a signal line driver circuit 704 are provided over a substrate 700 in the display device. In the pixel portion 701, a plurality of signal lines extended from the signal line driver circuit 704 are arranged, and a plurality of scan lines extended from the first scan line driver circuit 702 and the second scan line driver circuit 703 are arranged. Pixels each including a display element are provided in matrix in respective regions in each of which the scan line and the signal line intersect with each other. The substrate 700 of the display device is connected to a timing control circuit (also referred to as controller or control IC) through a connection portion such as a flexible printed circuit (FPC).

In FIG. 55A, the first scan line driver circuit 702, the second scan line driver circuit 703, and the signal line driver circuit 704 are formed over the same substrate 700 as the pixel portion 701. Accordingly, the number of components provided outside, such as a driver circuit, is reduced, so that a reduction in cost can be achieved. Further, if the driver circuit is provided outside the substrate 700, wirings would need to be extended and the number of wiring connections would increase. However, by providing the driver circuit over the substrate 700, the number of wiring connections can be reduced and the reliability or yield can be improved. One or more of the first scan line driver circuit 702, the second scan line driver circuit 703, and the signal line driver circuit 704 may be mounted on the substrate 700 or provided outside the substrate 700.

[Liquid Crystal Display Device]

FIG. 55B illustrates an example of a circuit configuration of the pixel. Here, a pixel circuit that can be used in a pixel of a VA liquid crystal display device is illustrated as an example.

This pixel circuit can be used in a structure in which one pixel includes a plurality of pixel electrode layers. The pixel electrodes are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be given thereto. In contrast, a data line 714 is used in common for the transistors 716 and 717. Any of the transistors described in the above embodiments can be used as appropriate as each of the transistors 716 and 717. In this way, a highly reliable liquid crystal display device can be provided.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V-shape and the second pixel electrode layer is provided so as to surround the first pixel electrode layer.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Furthermore, a storage capacitor may be formed using a capacitor wiring 710, a gate insulating film serving as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of the present invention is not limited to that shown in FIG. 55B. For example, a switch, a resistor, a capacitor, a transistor, a sensor, a logic circuit, or the like may be added to the pixel circuit illustrated in FIG. 55B.

[Organic EL Display Device]

FIG. 55C illustrates another example of a circuit configuration of the pixel. Here, a pixel structure of a display device using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 55C illustrates an example of a pixel circuit that can be used. Here, an example in which two n-channel transistors are used in one pixel is shown. Further, digital time grayscale driving can be employed for the pixel circuit.

The configuration of the pixel circuit that can be used and operation of a pixel employing digital time grayscale driving are described.

A pixel 720 includes a switching transistor 721, a driving transistor 722, a light-emitting element 724, and a capacitor 723. A gate electrode layer of the switching transistor 721 is connected to a scan line 726. A first electrode (one of a source electrode layer and a drain electrode layer) of the switching transistor 721 is connected to a signal line 725. A second electrode (the other of the source electrode layer and the drain electrode layer) of the switching transistor 721 is connected to a gate electrode layer of the driving transistor 722. The gate electrode layer of the driving transistor 722 is connected to a power supply line 727 through the capacitor 723, a first electrode of the driving transistor 722 is connected to the power supply line 727, and a second electrode of the driving transistor 722 is connected to a first electrode (pixel electrode) of the light-emitting element 724. A second electrode of the light-emitting element 724 corresponds to a common electrode 728. The common electrode 728 is electrically connected to a common potential line formed over the same substrate as the common electrode 728.

As the switching transistor 721 and the driving transistor 722, any of the transistors described in the above embodiments can be used as appropriate. In this way, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and at least includes a forward threshold voltage.

Note that gate capacitance of the driving transistor 722 may be used as a substitute for the capacitor 723, so that the capacitor 723 can be omitted.

Next, a signal input to the driving transistor 722 is described. For a voltage-input voltage driving method, a video signal for turning on or off the driving transistor 722 without fail is input to the driving transistor 722. In order for the driving transistor 722 to operate in a subthreshold region, voltage higher than the voltage of the power supply line 727 is applied to the gate electrode layer of the driving transistor 722. Voltage higher than or equal to voltage that is the sum of power supply line voltage and the threshold voltage $V_{th}$ of the driving transistor 722 is applied to the signal line 725.

In the case where analog grayscale driving is performed, voltage higher than or equal to voltage that is the sum of the forward voltage of the light-emitting element 724 and the threshold voltage $V_{th}$ of the driving transistor 722 is applied to the gate electrode layer of the driving transistor 722. A video signal by which the driving transistor 722 is operated in a saturation region is input, so that current is supplied to the light-emitting element 724. In order for the driving transistor 722 to operate in a saturation region, the potential of the power supply line 727 is set higher than the gate potential of the driving transistor 722. When an analog video signal is used, current corresponding to the video signal can be supplied to the light-emitting element 724 and analog grayscale driving can be performed.

Note that the configuration of the pixel circuit is not limited to that shown in FIG. 55C. For example, a switch, a resistor, a capacitor, a sensor, a transistor, a logic circuit, or the like may be added to the pixel circuit illustrated in FIG. 55C.

In the case where the transistor described in the above embodiments is used for the circuit shown in FIGS. 55A to 55C, the source electrode (the first electrode) is electrically connected to the low potential side and the drain electrode (the second electrode) is electrically connected to the high potential side. Furthermore, the potential of the first gate electrode may be controlled by a control circuit or the like, and the potential described above as an example, e.g., a potential lower than the potential applied to the source electrode, may be input to the second gate electrode through a wiring that is not illustrated.

In this specification and the like, for example, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Alternatively, a display medium whose contrast, luminance, reflectance, transmittance, or the like is changed by electromagnetic action may be included. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink, Electronic Liquid Powder, or electrophoretic elements include electronic paper. In the case of a transflective liquid crystal display or a reflective liquid crystal display, some of or all of pixel electrodes serve as reflective electrodes. For example, some or all of pixel electrodes are formed to contain aluminum, silver, or the like. In such a case, a memory circuit such as an SRAM can be provided under the reflective electrodes. Accordingly, power consumption can be further reduced.

Note that this embodiment can be combined with other embodiments and an example in this specification as appropriate.

Embodiment 9

In this embodiment, a display module that can be formed using the semiconductor device of one embodiment of the present invention will be described with reference to FIG. 56.

Figure 56:
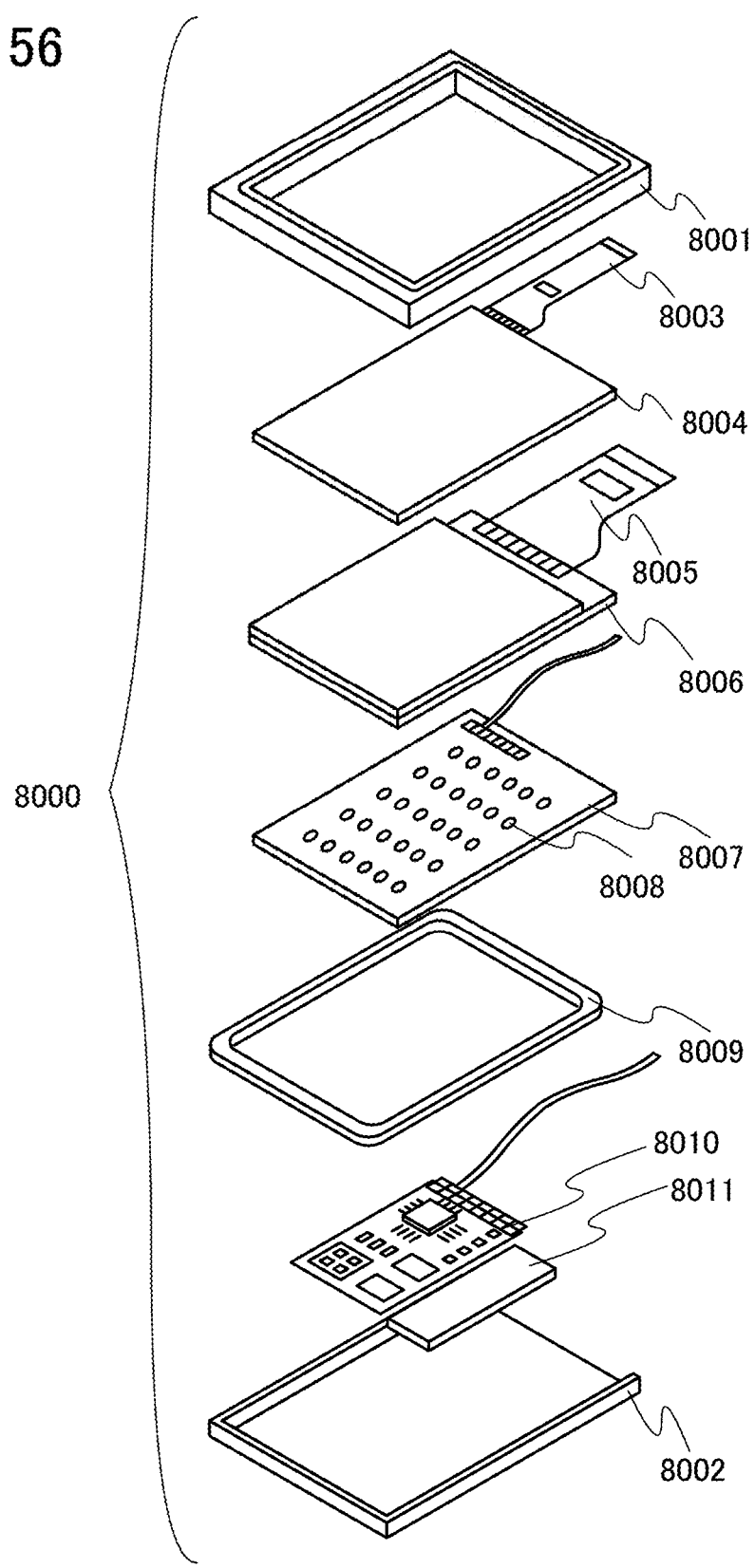
FIG. 56 illustrates a display module.

In a display module 8000 illustrated in FIG. 56, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 so that an optical touch panel function is added. An electrode for a touch sensor may be provided in each pixel of the display panel 8006 so that a capacitive touch panel function is added.

The backlight unit 8007 includes a light source 8008. The light source 8008 may be provided at an end portion of the backlight unit 8007 and a light diffusing plate may be used.

The frame 8009 protects the display panel 8006 and also serves as an electromagnetic shield for blocking electromagnetic waves generated by the printed board 8010. The frame 8009 may serve as a radiator plate.

The printed board 8010 is provided with a power supply circuit and a signal processing circuit for outputting a video signal and a clock signal. As a power source for supplying power to the power supply circuit, an external commercial power source or the battery 8011 provided separately may be used. Note that the battery 8011 is not necessary in the case where a commercial power source is used.

The display module 8000 may be additionally provided with a member such as a polarizing plate, a retardation plate, or a prism sheet.

Note that this embodiment can be combined with other embodiments and an example in this specification as appropriate.

Embodiment 10

The semiconductor device of one embodiment of the present invention can be used for display devices, personal computers, or image reproducing devices provided with recording media (devices which reproduce the content of recording media such as digital versatile discs (DVDs) and have displays for displaying the reproduced images, for a typical example). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 57A to 57F illustrate specific examples of these electronic devices.

Figure 57A:
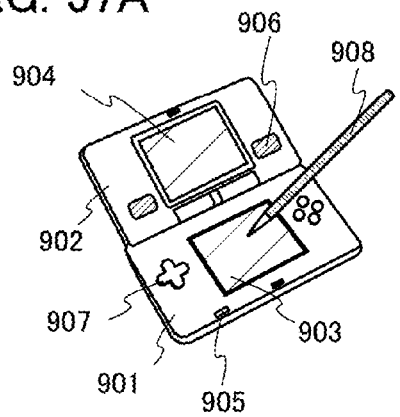
FIGS. 57A to 57F each illustrate an electronic device.

FIG. 57A illustrates a portable game console including a housing 901, a housing 902, a display portion 903, a display portion 904, a microphone 905, a speaker 906, an operation key 907, a stylus 908, and the like. Although the portable game machine in FIG. 57A has the two display portions 903 and 904, the number of display portions included in a portable game machine is not limited to this.

Figure 57B:
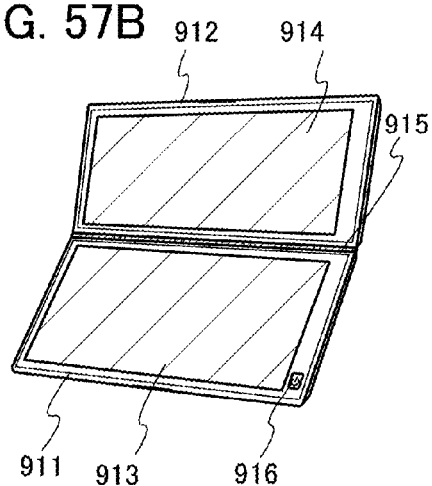

FIG. 57B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 57C:
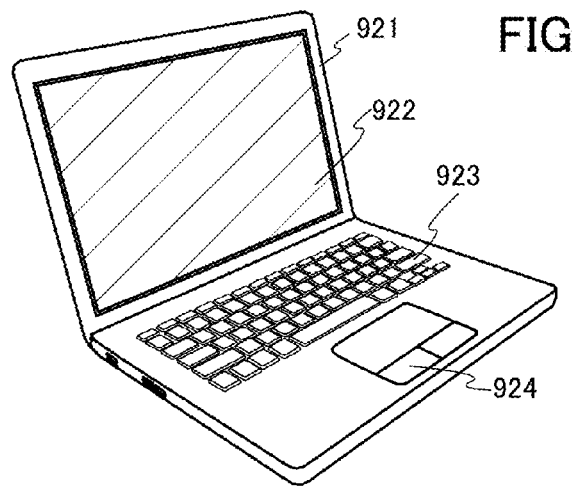

FIG. 57C illustrates a notebook personal computer, which includes a housing 921, a display portion 922, a keyboard 923, a pointing device 924, and the like.

Figure 57D:
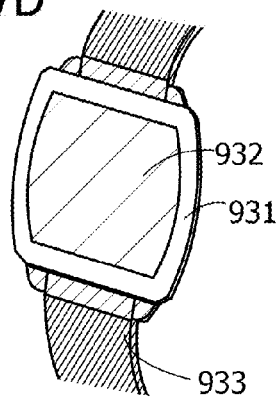

FIG. 57D illustrates a wrist-watch-type information terminal, which includes a housing 931, a display portion 932, a wristband 933, and the like. The display portion 932 may be a touch panel.

Figure 57E:
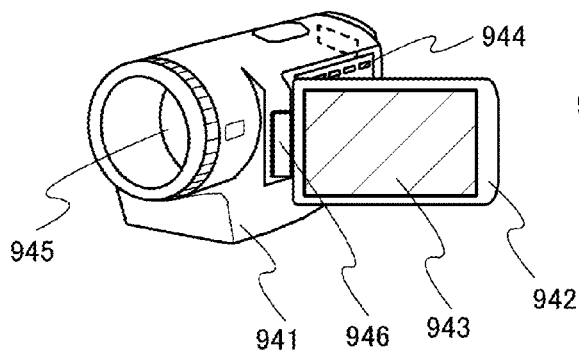

FIG. 57E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 57F:
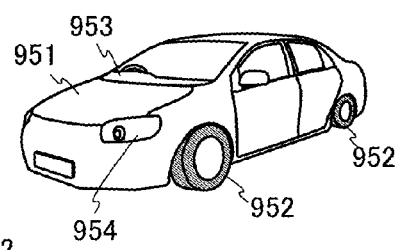
Figure 58A:
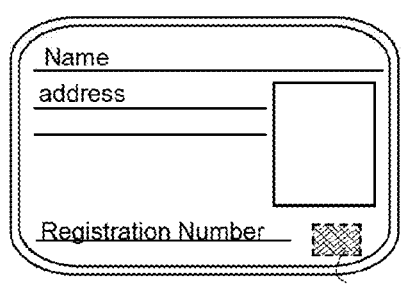
FIGS. 58A to 58F each illustrate an application example of an RF device.
Figure 58B:
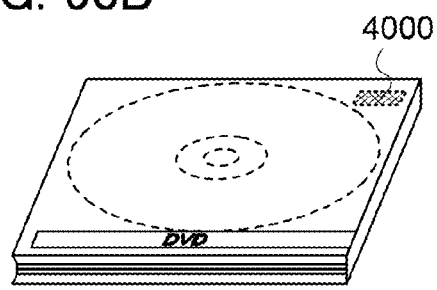
Figure 58C:
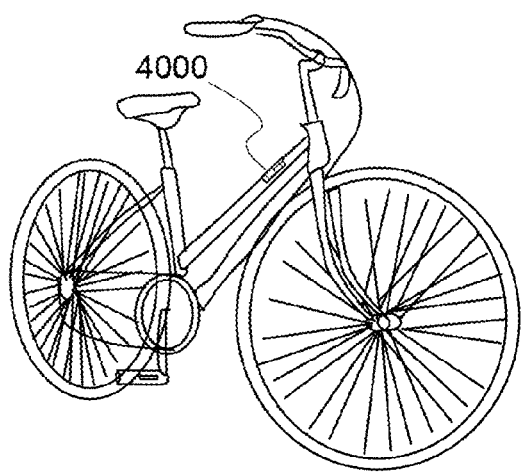
Figure 58D:
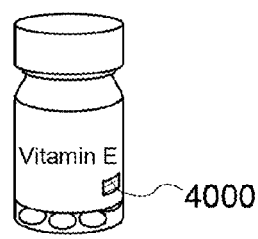
Figure 58E:
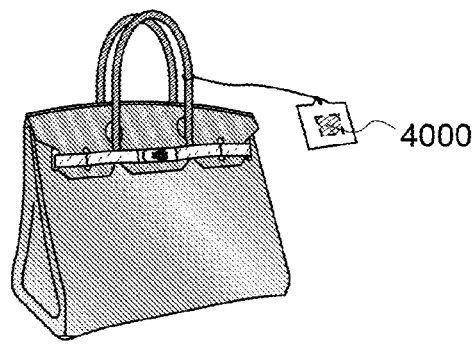
Figure 58F:
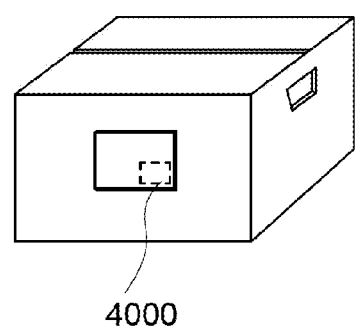

FIG. 57F illustrates an ordinary vehicle including a car body 951, wheels 952, a dashboard 953, lights 954, and the like.

Note that this embodiment can be combined with other embodiments and an example in this specification as appropriate.

Embodiment 11

In this embodiment, application examples of an RF device of one embodiment of the present invention are described with reference to FIGS. 58A to 58F. The RF device is widely used and can be provided for, for example, products such as bills, coins, securities, bearer bonds, documents (e.g., driver's licenses or resident's cards, see FIG. 58A), recording media (e.g., DVD or video tapes, see FIG. 58B), vehicles (e.g., bicycles, see FIG. 58C), packaging containers (e.g., wrapping paper or bottles, see FIG. 58D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 58E and 58F).

An RF device 4000 of one embodiment of the present invention is fixed to a product by being attached to a surface thereof or embedded therein. For example, the RF device 4000 is fixed to each product by being embedded in paper of a book, or embedded in an organic resin of a package. Since the RF device 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF device 4000 of one embodiment of the present invention, and the identification function can be utilized to prevent counterfeiting. Moreover, the efficiency of a system such as an inspection system can be improved by providing the RF device of one embodiment of the present invention for packaging containers, recording media, personal belongings, foods, clothing, household goods, electronic devices, or the like. Vehicles can also have higher security against theft or the like by being provided with the RF device of one embodiment of the present invention.

As described above, by using the RF device of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF device can be preferably used for application in which data is not frequently written or read.

Note that this embodiment can be combined with other embodiments and an example in this specification as appropriate.

Example 1

In this example, the number of defects in the oxide insulating film is described using the measurement results of electron spin resonance (ESR).

<Fabrication Method 1 of Sample>

Fabrication methods of Samples A1 to A3 of this example are described below.

<Sample A1>

A 35-nm-thick oxide semiconductor film was formed over a quartz substrate by a sputtering method. The oxide semiconductor film was formed under the following conditions: a sputtering target containing In, Ga, and Zn at an atomic ratio of 1:1:1 was used; oxygen at a flow proportion of 50% (oxygen:argon=1:1) was supplied as a sputtering gas into a reaction chamber of a sputtering apparatus; the pressure in the reaction chamber was controlled to 0.6 Pa; and direct-current power of 2.5 kW was supplied. Note that the oxide semiconductor film was formed at a substrate temperature of 170° C.

Next, heat treatment was performed at 450° C. in a nitrogen atmosphere for one hour, and after that, another heat treatment was performed at 450° C. in a mixed gas of nitrogen and oxygen for one hour.

Then, a first oxide insulating film and a second oxide insulating film were formed over the oxide semiconductor film.

The first oxide insulating film was formed to a thickness of 50 nm by a PECVD method under the following conditions: silane at a flow rate of 50 sccm and dinitrogen monoxide at a flow rate of 2000 sccm were used as a source gas; the pressure in the reaction chamber was 20 Pa; the substrate temperature was 220° C.; and a high-frequency power of 100 W was supplied to parallel-plate electrodes.

The second oxide insulating film was formed to a thickness of 400 nm by a PECVD method under the following conditions: silane at a flow rate of 160 sccm and dinitrogen monoxide at a flow rate of 4000 sccm were used as a source gas, the pressure in the reaction chamber was 200 Pa, the substrate temperature was 220° C., and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Next, by heat treatment, water, nitrogen, hydrogen, and the like were released from the first oxide insulating film and the second oxide insulating film and part of oxygen contained in the second oxide insulating film was supplied to the oxide semiconductor film. Here, the heat treatment was performed at 350° C. in an atmosphere of nitrogen and oxygen for one hour.

Through the above process, Sample A1 of this example was fabricated.

<Sample A2>

Sample A2, which was used for comparison, was fabricated under the same conditions as those of Sample A1 except for the formation pressure of the first oxide insulating film. Specifically, a sample including a first oxide insulating film formed under the following conditions was fabricated as Sample A2.

In Sample A2, the first oxide insulating film was formed by a PECVD method under the following conditions: silane at a flow rate of 50 sccm and dinitrogen monoxide at a flow rate of 2000 sccm were used as a source gas; the pressure in the reaction chamber was 100 Pa; the substrate temperature was 220° C.; and a high-frequency power of 100 W was supplied to parallel-plate electrodes.

<Sample A3>

Sample A3, which was used for comparison, was fabricated under the same conditions as those of Sample A1 except for the formation pressure of the first oxide insulating film. Specifically, a sample including a first oxide insulating film formed under the following conditions was fabricated as Sample A3.

In Sample A3, the first oxide insulating film was formed by a PECVD method under the following conditions: silane at a flow rate of 50 sccm and dinitrogen monoxide at a flow rate of 2000 sccm were used as a source gas; the pressure in the reaction chamber was 200 Pa; the substrate temperature was 220° C.; and a high-frequency power of 100 W was supplied to parallel-plate electrodes.

<ESR Measurement>

Next, Samples A1 to A3 were measured by ESR measurement. Here, the ESR measurement was performed under the following conditions. The measurement temperature was −170° C., the high-frequency power (power of microwaves) of 8.92 GHz was 1 mW, and the direction of a magnetic field was parallel to a surface of each sample. The detection limit of the spin density of a signal attributed to $NO_x$ is $4.7 \times 10^{15}$ spins/cm$^3$. This means that when the number of spins is small, the number of defects is small in the film.

FIG. 59A shows the spin densities of the signals attributed to $NO_x$ of Sample A1. FIG. 59B shows the spin densities of the signals attributed to $NO_x$ of Sample A2. FIG. 59C shows the spin densities of the signals attributed to $NO_x$ of Sample A3. Note that shown here is the spin densities obtained by converting the number of measured spins into that per unit volume.

As shown in FIGS. 59A to 59C, in Samples A1 to A3, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. These three signals are due to $NO_x$ and represent splits of a hyperfine structure arising from the interaction between an electron spin and the nuclear spin of a nitrogen atom. The signals attributed to $NO_x$ have anisotropic spin species and thus the waveform is asymmetrical.

The spin density of the signals attributed to $NO_x$ in Samples A2 and A3 is higher than that in Sample A1, and thus the oxide insulating films of Samples A2 and A3 have a large number of defects. In FIGS. 59A to 59C, the spin density of the signals attributed to $NO_x$ in Sample A1 is the smallest. Thus, it is shown that when the first oxide insulating film to be in contact with the oxide semiconductor film is formed at low pressure, the oxide insulating film having a reduced number of defects is formed.

<Fabrication Method 2 of Sample>

Fabrication methods of Samples B1 to B4 of this example are described below.

<Sample B1>

By thermal oxidation of a silicon wafer, a 100-nm-thick thermal oxide film was formed on a surface of the silicon wafer. The thermal oxidation was performed at 950° C. for four hours in a thermal oxidation atmosphere containing HCl at 3 vol % with respect to oxygen.

Then, a 300-nm-thick silicon oxynitride film was formed over the thermal oxide film by a PECVD method under the following conditions: silane at a flow rate of 2.3 sccm and dinitrogen monoxide at a flow rate of 800 sccm were used as source gases, the pressure in a reaction chamber was 40 Pa, the substrate temperature was 400° C., and power (RF) of 50 W was supplied.

Next, an oxygen ion ($^{16}O^+$) was implanted into the silicon oxynitride film by an ion implantation method under the following conditions: the acceleration voltage was 60 kV, the dosage was $2.0 \times 10^{16}$ ions/cm$^2$, the tilt angle was 7°, and the twist angle was 72°.

After that, a 20-nm-thick In—Ga—Zn oxide semiconductor film was formed over the silicon oxynitride film by a sputtering method under the following conditions: a target containing In, Ga, and Zn at an atomic ratio of 1:3:4 was used; the oxygen partial pressure was 11%; the pressure was 0.4 Pa; the electric power (DC) was 0.5 kW; the substrate temperature was 200° C.; and the distance between the substrate and the target was 60 mm.

Next, heat treatment was performed at 450° C. in a nitrogen atmosphere for one hour, and after that, another heat treatment was performed at 450° C. in an oxygen atmosphere for one hour.

Through the above process, Sample B1 of this example was fabricated.

<Sample B2>

Sample B2 was fabricated under the same conditions as those of Sample B1 except that the oxygen partial pressure for forming the oxide semiconductor film was 33%.

<Sample B3>

Sample B3 was fabricated under the same conditions as those of Sample B1 except that the oxygen partial pressure for forming the oxide semiconductor film was 50%.

<Sample B4>

Sample B4 was fabricated under the same conditions as those of Sample B1 except that an oxide semiconductor film was formed at an oxygen partial pressure of 100%.

<ESR Measurement>

Figure 60:
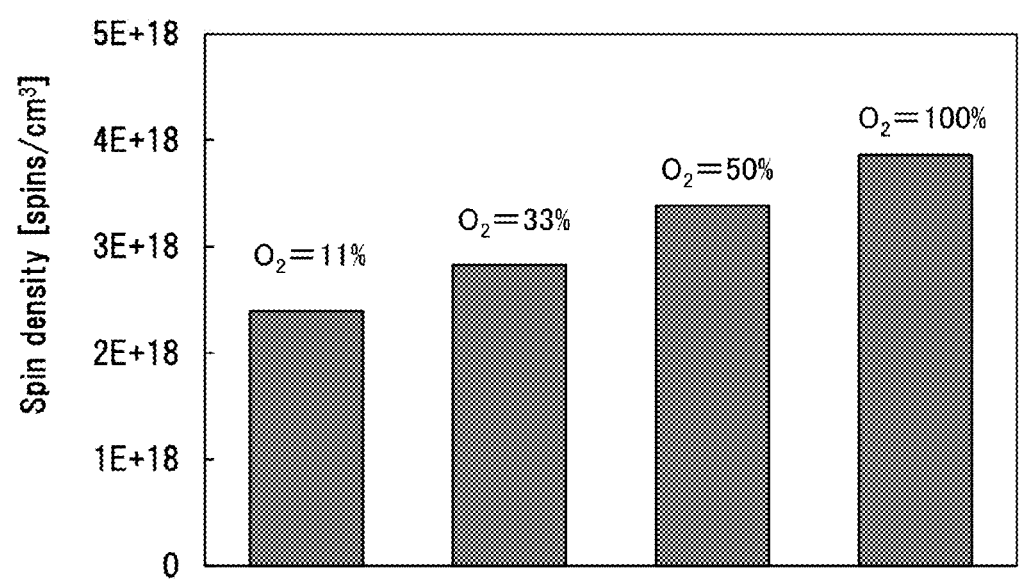
FIG. 60 shows ESR measurement results.

Samples B1 to B4 were measured by ESR. FIG. 60 shows the sum of the spin densities of three signals attributed to $NO_x$ of Samples B1 to B4.

According to FIG. 60, the lower the oxygen partial pressure for forming an oxide semiconductor film is, the lower the sum of the spin densities of three signals of the silicon oxynitride film is.

Example 2

In this example, TDS results of the amounts of nitrogen monoxide, nitrogen dioxide, and oxygen released by heating from the silicon oxynitride film in each of Samples B1 to B4 fabricated in Example 1 will be described.

First, the whole oxide semiconductor films in Samples B1 to B4 were etched so that the silicon oxynitride films were exposed. As an etchant, a solution of about 85% phosphoric acid or a mixed solution (also referred to as an aluminum etchant) containing a phosphoric acid (72%), a nitric acid (2%), and an acetic acid (9.8%) was used.

<TDS Analysis>

Figure 61:
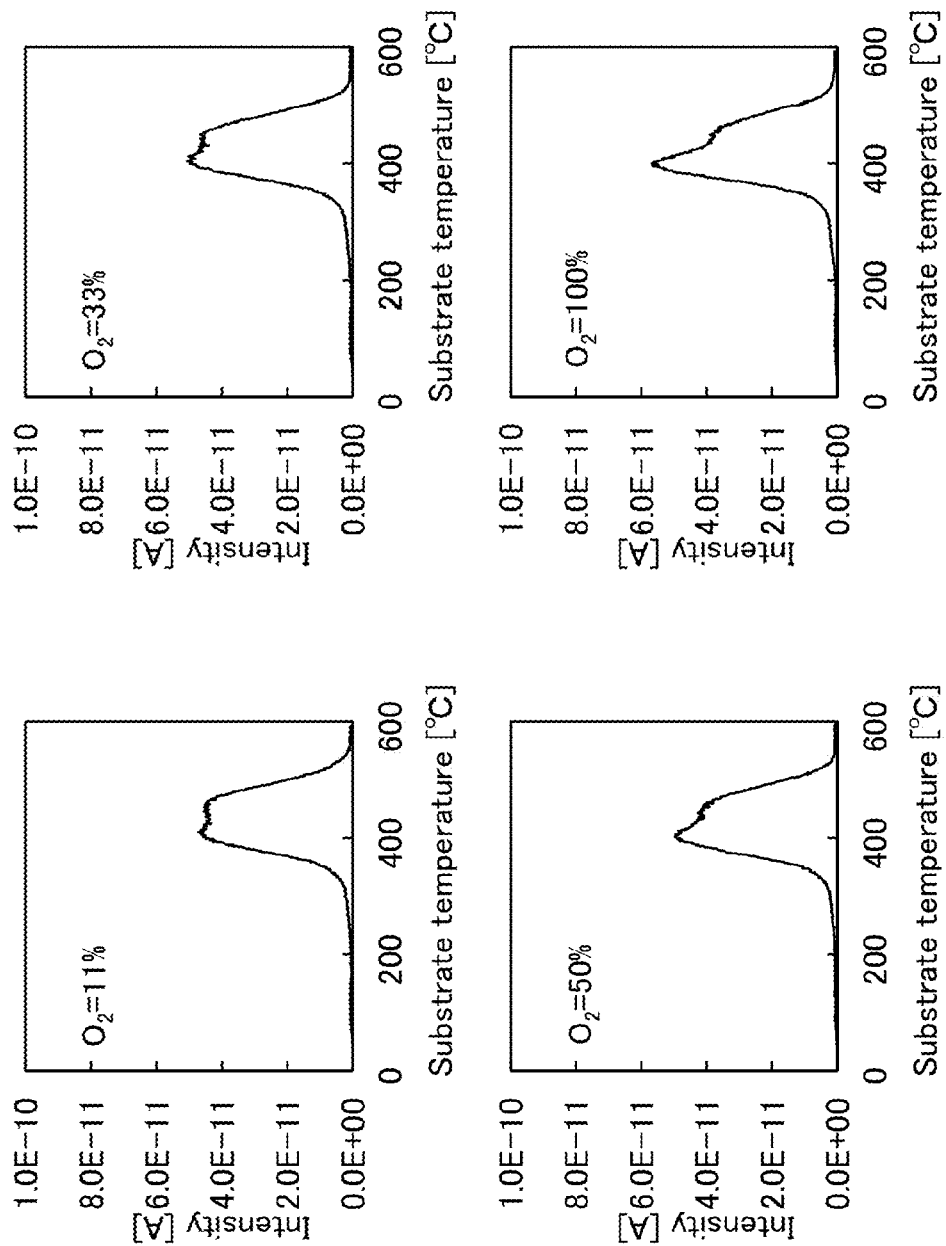
FIG. 61 shows measurement results of TDS analyses.
Figure 62:
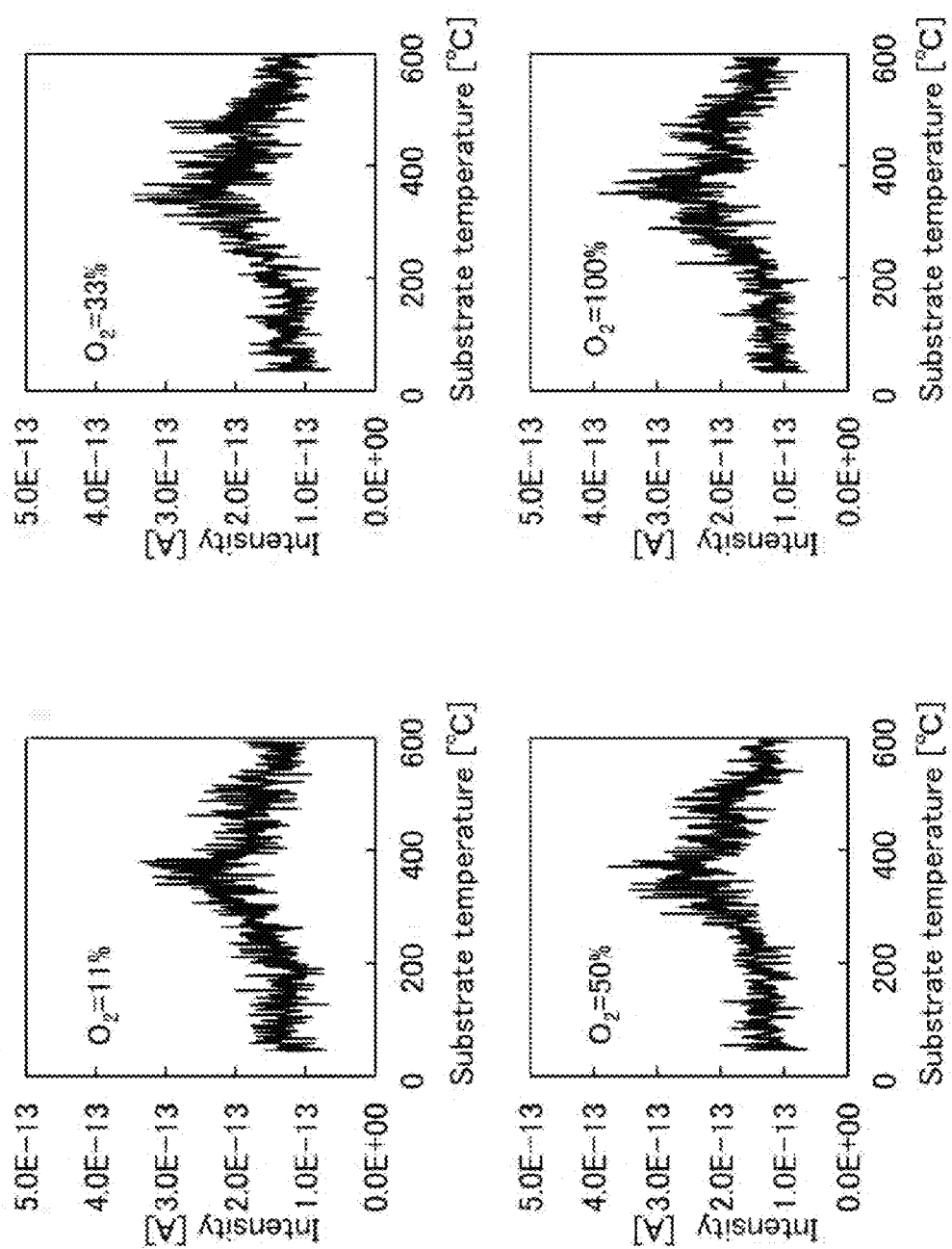
FIG. 62 shows measurement results of TDS analyses.

Thermal desorption spectroscopy (TDS) analysis was performed on the silicon oxynitride films in Samples B1 to B4. In each of the samples, the silicon wafer was heated at a temperature higher than or equal to 50° C. and lower than or equal to 927° C. FIGS. 61 to 63 show the amounts of nitrogen monoxide (m/z=30), nitrogen dioxide (m/z=46), and oxygen (m/z=32) released in Samples B1 to B4.

In FIGS. 61 to 63, the lateral axes indicate substrate temperature; here, the temperature is higher than or equal to 0° C. and lower than or equal to 600° C. The longitudinal axes indicate intensity proportional to the amounts of gases released with respective molecular weights. The total number of the molecules released to the outside corresponds to the integral value of the peak. Thus, with the degree of the peak intensity, the total number of the molecules contained in the silicon oxynitride film can be evaluated.

Figure 64:
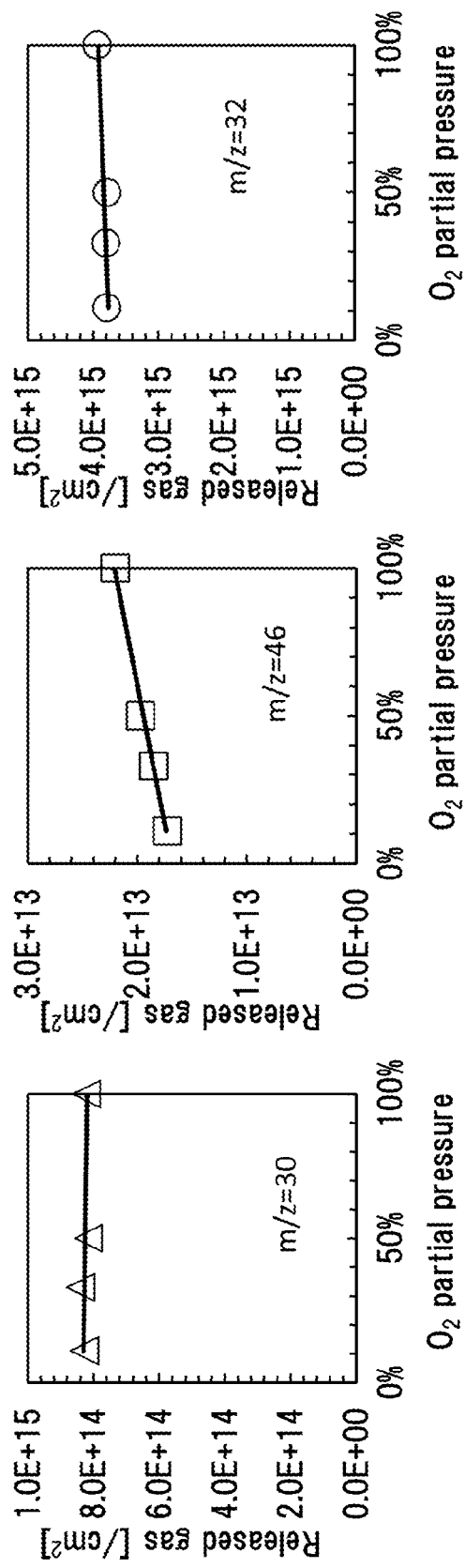
FIG. 64 shows relations between oxygen partial pressure and the amounts of gases released with respective molecular weights.

FIG. 64 shows relations between the oxygen partial pressure for forming the oxide semiconductor films and the amounts of (the number of molecules) gases released with respective molecular weights.

According to FIGS. 61 to 64, the amounts of nitrogen monoxide (m/z=30) and oxygen (m/z=32) released hardly depend on the oxygen partial pressure for forming the oxide semiconductor film; in contrast, the amount of nitrogen dioxide (m/z=46) released decreases as the oxygen partial pressure for forming the oxide semiconductor film becomes lower.

Example 3

In this example, examination results of the reliability of fabricated transistors will be described.

<Fabrication Method of Sample>

Transistors were fabricated as Samples C1 to C4 of this example.

<Sample C1>

By thermal oxidation of a silicon wafer, a 100-nm-thick thermal oxide film was formed on a surface of the silicon wafer. The thermal oxidation was performed at 950° C. for four hours in a thermal oxidation atmosphere containing HCl at 3 vol % with respect to oxygen.

Next, over the thermal oxidation film, a silicon oxynitride film serving as a base insulating film was formed to have a thickness of 300 nm by a PECVD method under the following conditions: silane ($SiH_4$) at a flow rate of 1 sccm and dinitrogen monoxide ($N_2O$) at a flow rate of 800 sccm were used as source gases; pressure in a reaction chamber was 200 Pa; substrate temperature was 350° C.; and a high-frequency power of 150 W was supplied to parallel plate electrodes with a 60 MHz high frequency power source.

Then, an oxygen ion ($^{16}O^+$) was implanted into the silicon oxynitride film by an ion implantation method under the following conditions: the acceleration voltage was 60 kV, the dosage was $2.0 \times 10^{16}$ ions/cm$^2$, the tilt angle was 7°, and the twist angle was 72°.

After that, a 20-nm-thick In—Ga—Zn oxide semiconductor film (hereinafter, a first oxide semiconductor film) was formed over the silicon oxynitride film by a sputtering method under the following conditions: a target containing In, Ga, and Zn at an atomic ratio of 1:3:4 was used; the oxygen partial pressure was 11% (Ar at a flow rate of 40 sccm, $O_2$ at a flow rate of 5 sccm); the pressure was 0.4 Pa; the electric power (DC) was 0.5 kW; the substrate temperature was 200° C.; and the distance between the substrate and the target was 60 mm.

Subsequently, a 15-nm-thick In—Ga—Zn oxide semiconductor film (hereinafter, a second oxide semiconductor film) was formed over the first oxide semiconductor film by a sputtering method under the following conditions: a target containing In, Ga, and Zn at an atomic ratio of 1:1:1 was used; the oxygen partial pressure was 33% (Ar at a flow rate of 30 sccm, $O_2$ at a flow rate of 15 sccm); the pressure was 0.4 Pa; the electric power (DC) was 0.5 kW; the substrate temperature was 300° C.; and the distance between the substrate and the target was 60 mm.

Next, heat treatment was performed. The heat treatment was performed under a nitrogen atmosphere at 450° C. for one hour, and then performed under an oxygen atmosphere at 450° C. for one hour.

Then, the first and second semiconductor films were processed into island shapes by ICP etching under the following conditions: a mixed atmosphere of a boron trichloride ($BCl_3$) gas at a flow rate of 60 sccm and a chlorine ($Cl_2$) gas at a flow rate of 20 sccm was used; power supply was 450 W; bias power was 100 W; pressure was 1.9 Pa; and substrate temperature was 70° C.

Next, a tungsten film was formed over the first and second oxide semiconductor films to have a thickness of 100 nm by a sputtering method under the following conditions: a tungsten target was used; an atmosphere of an argon (Ar) gas at a flow rate of 80 sccm was used; pressure was 0.8 Pa; substrate temperature was 230° C.; the distance between the target and the substrate was 60 mm; and a DC power of 1.0 kW was applied.

Subsequently, the tungsten film was subjected to ICP etching three times to form a pair of electrodes. The first etching was performed under the following conditions: a mixed atmosphere of a carbon tetrafluoride ($CF_4$) gas at a flow rate of 45 sccm, a chlorine ($Cl_2$) gas at a flow rate of 45 sccm, and an oxygen ($O_2$) gas at a flow rate of 55 sccm was used; power supply was 3000 W; bias power was 110 W; and pressure was 0.67 Pa. The second etching was performed under the following conditions: an oxygen ($O_2$) atmosphere at a flow rate of 100 sccm was used; power supply was 2000 W; bias power was 0 W; and pressure was 3.00 Pa. The third etching was performed under the following conditions: a mixed atmosphere of a carbon tetrafluoride ($CF_4$) gas at a flow rate of 45 sccm, a chlorine ($Cl_2$) gas at a flow rate of 45 sccm, and an oxygen ($O_2$) gas at a flow rate of 55 sccm was used; power supply was 3000 W; bias power was 110 W: and pressure was 0.67 Pa.

Next, a 5-nm-thick In—Ga—Zn oxide semiconductor film (hereinafter, a third oxide semiconductor film) was formed over the second oxide semiconductor film and the pair of electrodes by a sputtering method under the following conditions: a target containing In, Ga, and Zn at an atomic ratio of 1:3:2 was used; the oxygen partial pressure was 33% (Ar at a flow rate of 30 sccm, $O_2$ at a flow rate of 15 sccm); the pressure was 0.4 Pa; the electric power (DC) was 0.5 kW; the substrate temperature was 200° C.; and the distance between the substrate and the target was 60 mm.

After that, over the third oxide semiconductor film, a silicon oxynitride film to be a gate insulating film was formed to have a thickness of 20 nm by a PECVD method under the following conditions: silane ($SiH_4$) at a flow rate of 1 sccm and dinitrogen monoxide ($N_2O$) at a flow rate of 800 sccm were used as source gases; pressure in a reaction chamber was 200 Pa; substrate temperature was 350° C.; and a high-frequency power of 150 W was supplied to parallel plate electrodes with a 60 MHz high frequency power source.

Next, a tantalum nitride film was formed to have a thickness of 30 nm over the silicon oxynitride film by a sputtering method under the following conditions: a tantalum nitride target was used; an argon (Ar) gas at a flow rate of 50 sccm and a nitrogen ($N_2$) gas at a flow rate of 10 sccm were used as deposition gases; pressure was 0.6 Pa; substrate temperature was room temperature; and a DC power of 1.0 kW was applied. Over the tantalum nitride film, a tungsten film was formed to have a thickness of 135 nm by a sputtering method under the following conditions: a tungsten target was used; an argon gas at a flow rate of 100 sccm was used as a deposition gas; pressure was 2.0 Pa; substrate temperature was 230° C.; the distance between the target and the substrate was 60 mm: and a DC power of 4.0 kW was applied.

After that, the tantalum nitride film and the tungsten film were subjected to ICP etching twice to form a gate electrode. The first etching was performed under the following conditions: a mixed atmosphere of a carbon tetrafluoride ($CF_4$) gas at a flow rate of 55 sccm, a chlorine ($Cl_2$) gas at a flow rate of 45 sccm, and an oxygen ($O_2$) gas at a flow rate of 55 sccm was used; power supply was 3000 W; bias power was 110 W; and pressure was 0.67 Pa. The second etching was performed under the following conditions: a chlorine ($Cl_2$) atmosphere at a flow rate of 100 sccm was used; power supply was 2000 W; bias power was 50 W; and pressure was 0.67 Pa.

Then, with the use of the gate electrode as a mask, the gate insulating film and the third oxide semiconductor film were processed into island shapes by ICP etching under the following conditions: a boron trichloride ($BCl_3$) gas atmosphere at a flow rate of 80 sccm was used; power supply was 450 W; bias power was 100 W; and pressure was 1.0 Pa.

Subsequently, over the gate electrode and the pair of electrodes, an aluminum oxide film was formed to have a thickness of 70 nm by a sputtering method under the following conditions: an aluminum oxide target was used; an argon (Ar) gas at a flow rate of 25 sccm and an oxygen ($O_2$) gas at a flow rate of 25 sccm were used as deposition gases; pressure was 0.4 Pa; substrate temperature was 250° C.; the distance between the target and the substrate was 60 mm; and an RF power of 2.5 kW was applied.

Then, over the aluminum oxide film, a silicon oxynitride film was formed to have a thickness of 300 nm by a PECVD method under the following conditions: silane ($SiH_4$) at a flow rate of 5 sccm and dinitrogen monoxide ($N_2O$) at a flow rate of 1000 sccm were used as source gases; pressure in a reaction chamber was 133 Pa; substrate temperature was 325° C.; and a high-frequency power of 35 W was supplied to parallel plate electrodes with a 13.56 MHz high frequency power source.

Through the above process, Sample C1 of this example was fabricated. Note that the channel length and the channel width of Sample C1 of this example were 0.49 μm and 10 μm, respectively.

<Sample C2>

Sample C2 was fabricated under the same conditions as those of Sample C1 except that a first oxide semiconductor film was formed at an oxygen partial pressure of 33% (Ar at a flow rate of 30 sccm, $O_2$ at a flow rate of 15 sccm).

<Sample C3>

Sample C3 was fabricated under the same conditions as those of Sample C1 except that a first oxide semiconductor film was formed at an oxygen partial pressure of 50% (Ar at a flow rate of 23 sccm, $O_2$ at a flow rate of 23 sccm).

<Sample C4>

Sample C4 was fabricated under the same conditions as those of Sample C1 except that a first oxide semiconductor film was formed at an oxygen partial pressure of 100% ($O_2$ at a flow rate of 45 sccm).

<Stress Test>

Next, stress tests were performed on Samples C1 to C4 under the following conditions: the source voltage $V_s$ and drain voltage $V_d$ were 0 V, the gate voltage was −3.3 V or +3.3 V, the stress temperature was 150° C., and the stress time was 3600 seconds.

Figure 65:
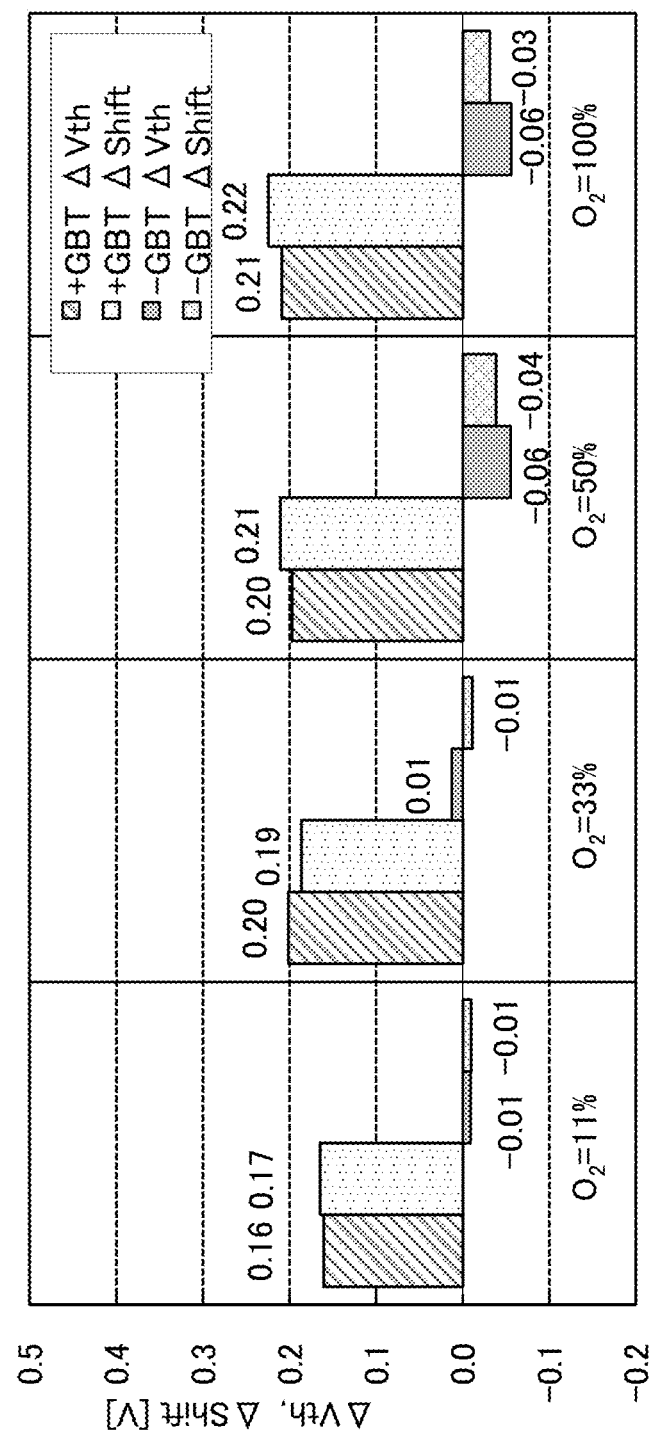
FIG. 65 shows variations in threshold voltages and the differences in shift values.

In a positive gate BT stress test, positive voltage was applied to the gate electrode, and in a negative gate BT stress test, negative voltage was applied to the gate electrode. FIG. 65 shows a difference between threshold voltage in the initial characteristics and threshold voltage after the BT stress test (i.e., a variation in threshold voltage ($\Delta V_{th}$)) and a difference between a shift value in the initial characteristics and a shift value after the BT stress test (i.e., a variation in the shift value ($\Delta$Shift)) of respective Samples C1 to C4.

Here, a threshold voltage and a shift value in this specification are described. Threshold voltage $V_{th}$ is defined as, in the $V_g$-$I_d$ curve where the lateral axis represents gate voltage $V_g$ [V] and the longitudinal axis represents the square root of drain current $I_d$ ($I_d^{1/2}$) [A], gate voltage at the intersection point of the line of $I_d^{1/2}$=0 ($V_g$ axis) and the tangent to the curve at a point where the slope of the curve is the steepest. Note that here, the threshold voltage is calculated with a drain voltage $V_d$ of 10 V.

Furthermore, shift value Shift in this specification is defined as, in the $V_g$-$I_d$ curve where the lateral axis represents the gate voltage $V_g$ [V] and the longitudinal axis represents the logarithm of the drain current $I_d$ [A], gate voltage at the intersection point of the line of $I_d$=1.0×10$^{-12}$ [A] and the tangent to the curve at a point where the slope of the curve is the steepest. Note that here, the shift value is calculated with a drain voltage $V_d$ of 10 V.

The results of the positive gate BT stress tests in FIG. 65 show that the lower the oxygen partial pressure for forming the first oxide semiconductor film is, the smaller the variation in threshold voltage and the variation in shift value are.

After the positive gate BT stress tests, the sum of the spin densities of the three signals and the amounts of nitride oxide and oxygen released from the silicon oxynitride films serving as base insulating films were measured.

Figure 66:
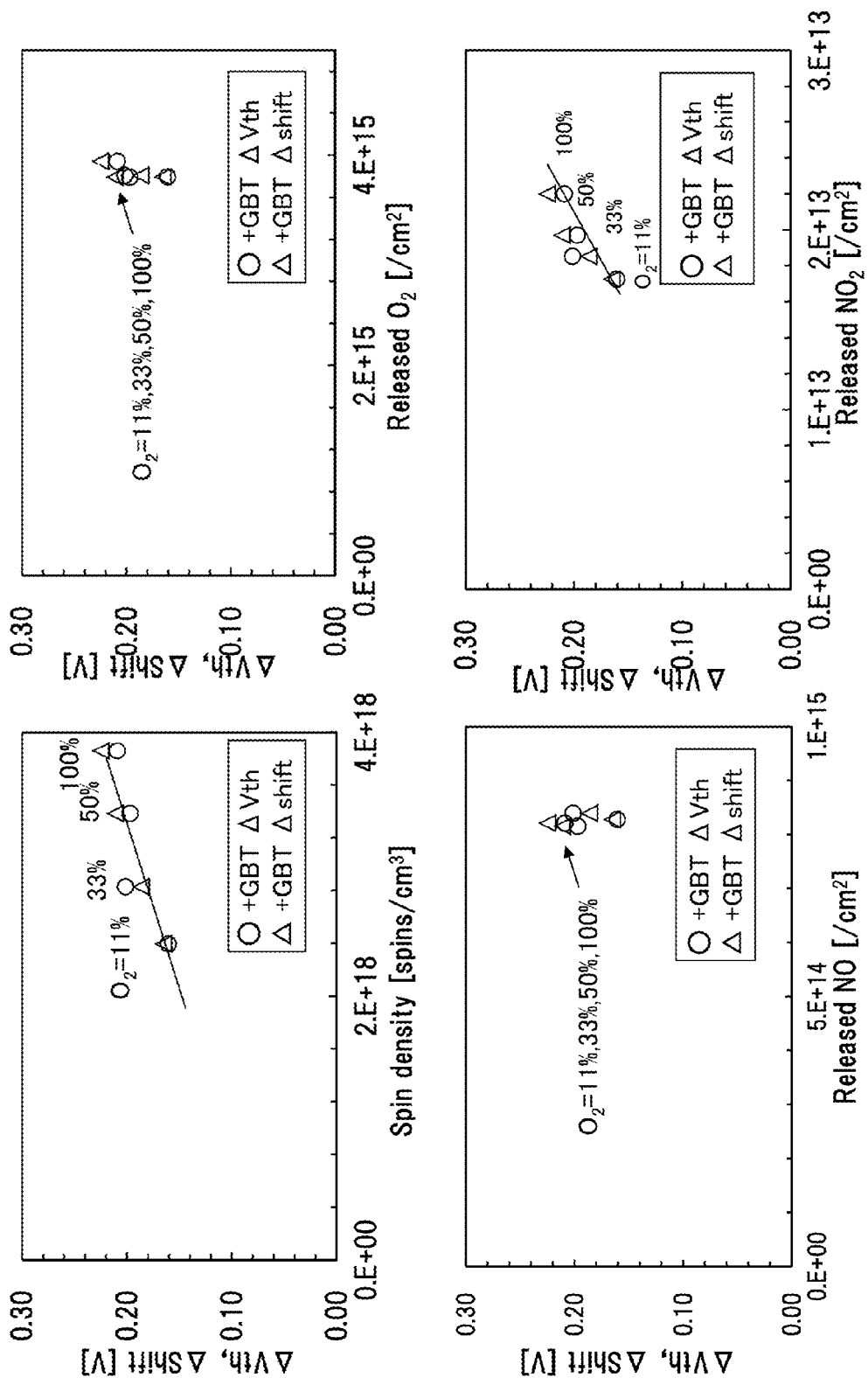
FIG. 66 shows correlations of variations in threshold voltage and shift value with the sum of the spin densities of three signals and with the amounts of nitride oxide and oxygen released from silicon oxynitride films.

FIG. 66 shows correlations of variations in threshold voltage and shift value with the sum of the spin densities of the three signals and with the amounts of nitride oxide and oxygen released from the silicon oxynitride films.

FIG. 66 shows that there is a correlation between the variations in threshold voltage and shift value and the sum of the spin densities of the three signals and between the variation in threshold voltage and the amount of nitrogen dioxide, which is nitride oxide, released. FIG. 66 also shows that the lower the oxygen partial pressure for forming the first oxide semiconductor film is, the smaller the amount of nitrogen dioxide released is and the more the degradation due to the positive gate BT stress test is improved.

Example 4

In this example, the amounts of hydrogen and nitrogen contained in oxide insulating films measured by SIMS will be described.

For each of samples of this example, a 100-nm-thick oxide insulating film was formed over a silicon wafer. As the oxide insulating film, a silicon oxynitride film was formed by a PECVD method at a deposition temperature of 350° C., 400° C., 450° C., 500° C., or 550° C.

<SIMS Analysis>

Figure 67:
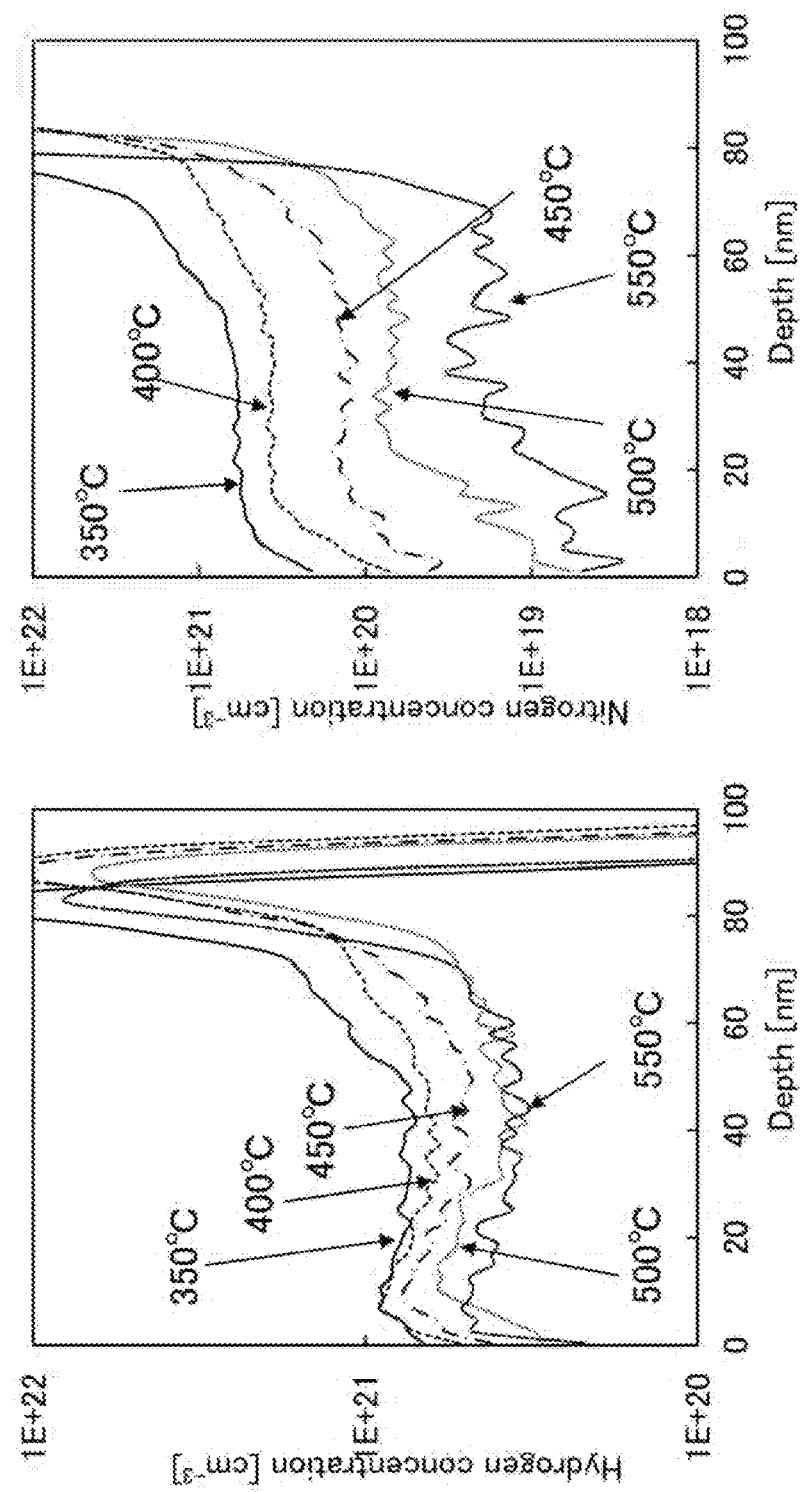
FIG. 67 shows measurement results of SIMS.

The above samples were subjected to SIMS analysis. The concentration of each of hydrogen and nitrogen in each sample was measured, from the surface of the oxide insulating film toward the silicon wafer. FIG. 67 shows the measurement results. In FIG. 67, the lateral axis indicates a distance in the film thickness direction, and the longitudinal axis indicates the concentration of each element.

According to FIG. 67, the higher the deposition temperature is, the lower the hydrogen concentration and the nitrogen concentration in the oxide insulating film are. FIG. 67 also shows that although the hydrogen concentration in the oxide insulating film ceases to decrease at a deposition temperature of around 500° C., the nitrogen concentration in the oxide insulating film decreases even from 500° C.

FIG. 68 shows plots of current densities after heating at 125° C. for 10 hours versus the concentrations of elements in the oxide insulating film measured by SIMS.

As shown in the top graph of FIG. 68, the current density decreases as the substrate temperature increases, and the current density does not change significantly at a substrate temperature higher than or equal to 500° C. As shown in the bottom two graphs of FIG. 68, there is a correlation between the current density and the hydrogen concentration in the oxide insulating film. There is also a correlation between the current density and the nitrogen concentration in the oxide insulating film; however, there is no great difference in the current density between nitrogen concentrations of $1\times10^{19}$ $cm^{-3}$ and $1\times10^{20}$ $cm^{-3}$.

Example 5

In this example, a transistor was fabricated as an example sample and its cross sectional shape was examined. In addition, the electric characteristics of the fabricated transistor were evaluated.

<Fabrication Method of Sample>

The transistor in this example has the same structure as the transistor in Example 3 except that an antioxidant film is provided between a second oxide semiconductor film and a pair of electrodes.

After a first oxide semiconductor film and the second oxide semiconductor film were etched by an ICP etching method as in Example 3, a 25-nm-thick In—Ga—Zn oxide semiconductor film (hereinafter referred to as an antioxidant film) was formed by a sputtering method under the following conditions: a target containing In, Ga, and Zn at an atomic ratio of 1:1:1 was used, the oxygen partial pressure was 33% (Ar at a flow rate of 30 sccm, $O_2$ at a flow rate of 15 sccm), the pressure was 0.7 Pa, the electric power (DC) was 0.5 kW, the substrate temperature was 300° C., and the distance between a substrate and the target was 60 mm.

Then, a 100-nm-thick tungsten film was formed over the antioxidant film by a sputtering method using a tungsten target in an atmosphere of an argon (Ar) gas at a flow rate of 80 sccm under the conditions where the pressure was 0.8 Pa, the substrate temperature was 230° C., the distance between the target and the substrate was 60 mm, and a DC power of 1.0 kW was applied.

Then, the tungsten film was etched so that the pair of electrodes is formed (refer to Example 3).

After that, the antioxidant film was subjected to first etching by an ICP etching method under the following conditions: a mixed atmosphere of a methane ($CH_4$) gas at a flow rate of 16 sccm and an argon (Ar) gas at a flow rate of 32 sccm was used, the electric power was 600 W, the bias power was 50 W, and the pressure was 3.0 Pa. Subsequently, second etching was performed by an ICP etching method under the following conditions: a mixed atmosphere of a methane ($CH_4$) gas at a flow rate of 16 sccm and an argon (Ar) gas at a flow rate of 32 sccm was used, the electric power was 600 W, the bias power was 50 W, and the pressure was 1.0 Pa.

Next, the third oxide semiconductor film, the gate insulating film, the gate electrode, the aluminum oxide film, and the silicon oxynitride film over the aluminum oxide film were formed as described in Example 3.

Note that after the gate insulating film was formed, heat treatment was performed under an oxygen atmosphere at 400° C., 490° C., or 530° C.

A sample without an antioxidant film was fabricated as a comparative example (the temperature of heat treatment after the formation of a gate insulating film was 400° C.).

Figure 69A:
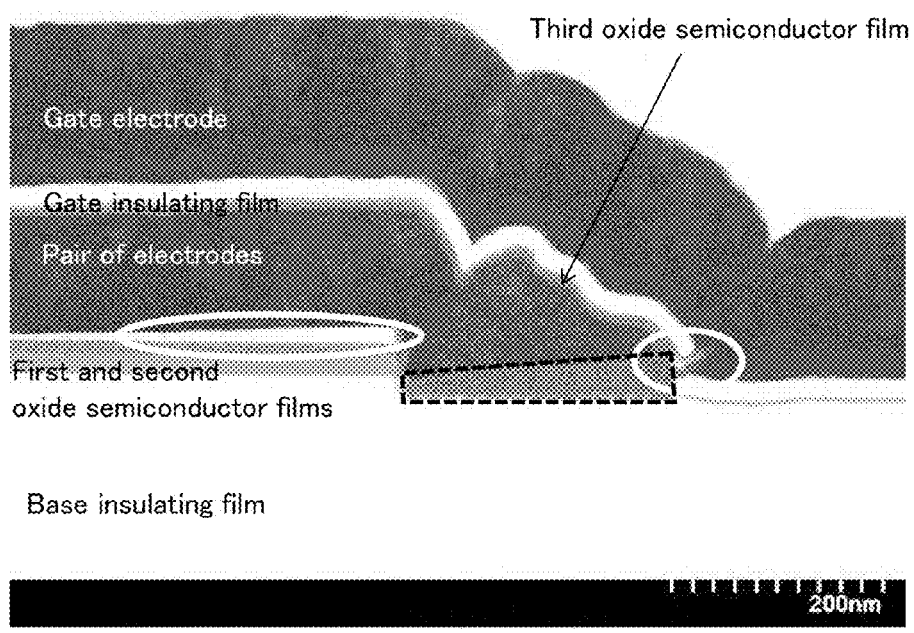
FIGS. 69A and 69B are cross sectional STEM images.
Figure 69B:
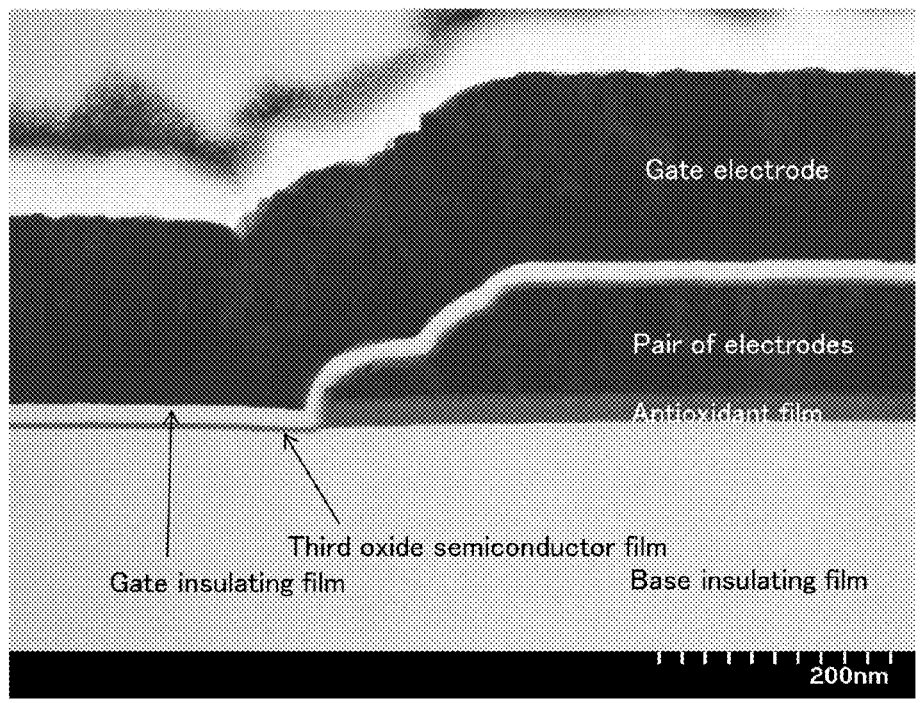

FIGS. 69A and 69B are cross-sectional STEM images of the samples fabricated in the above manner. FIG. 69A is a cross-sectional image of the comparative sample in the channel width direction and FIG. 69B is a cross-sectional image of the example sample (the temperature of heat treatment after the formation of the gate insulating film was 530° C.) in the channel width direction.

In the comparative sample shown in FIG. 69A, oxygen from a base insulating film oxidized the pair of electrodes in a portion surrounded by dotted lines, which caused expansion of the pair of electrodes; as a result, poor coverage with the gate insulating film was caused and a space was formed between the oxide semiconductor film and the pair of electrodes, as shown in portions surrounded by solid lines. In the example sample shown in FIG. 69B, oxidation of the pair of electrodes was not observed.

Figure 70A:
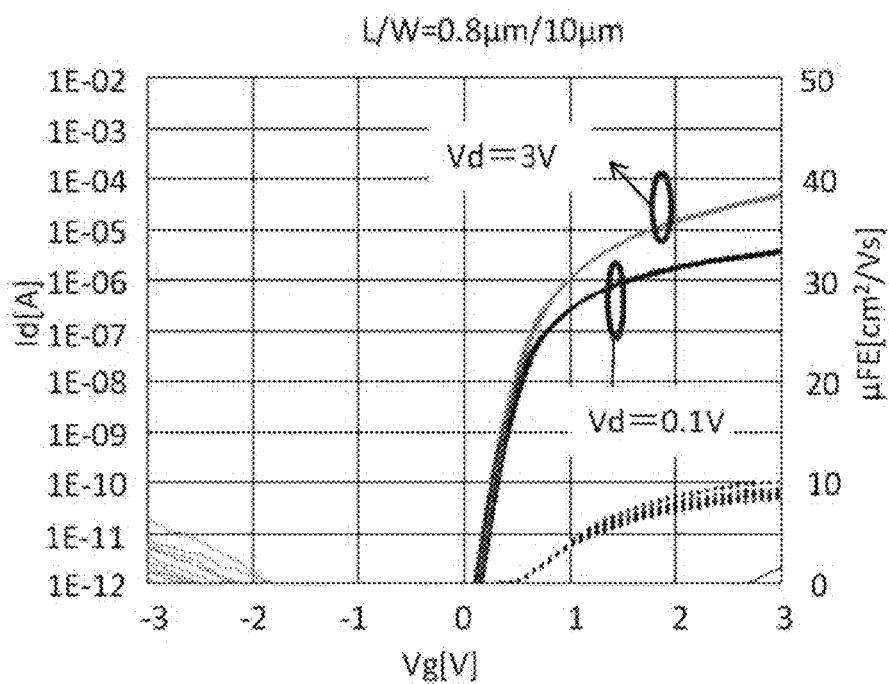
FIGS. 70A and 70B each show electrical characteristics of a comparative sample.
Figure 70B:
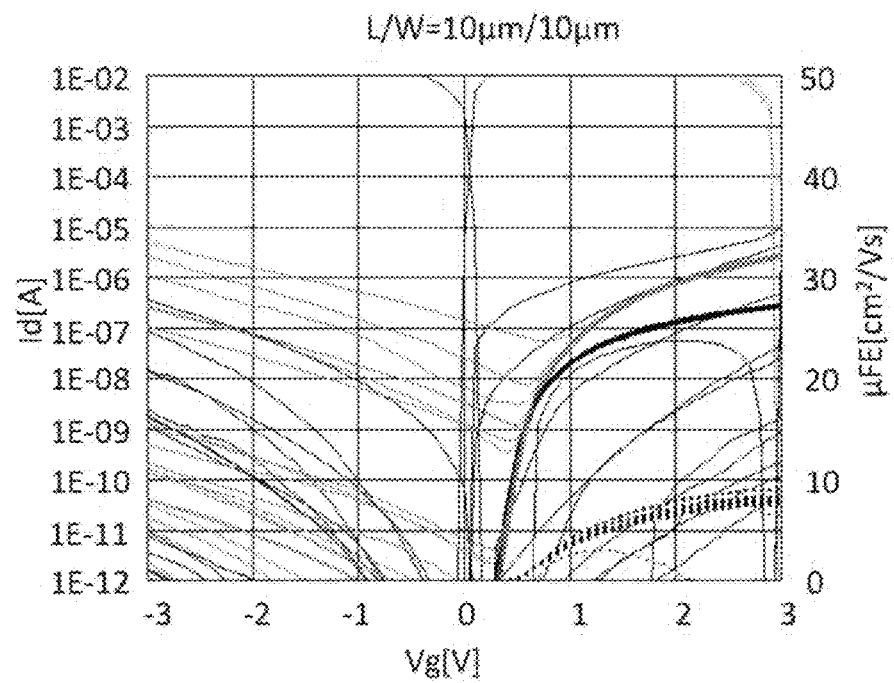
Figure 71A:
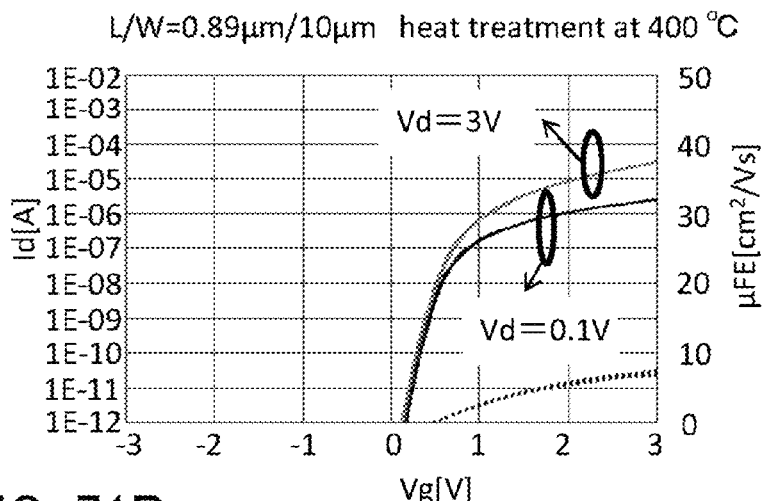
FIGS. 71A to 71C each show electrical characteristics of an example sample.
Figure 71B:
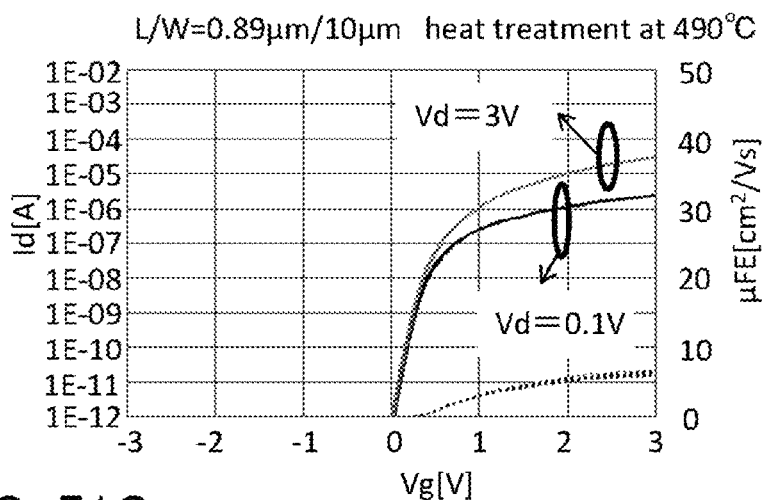
Figure 71C:
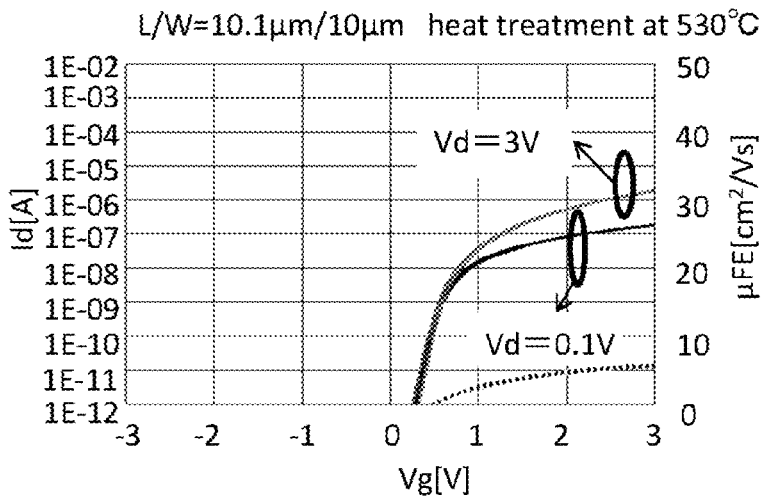

Next, in the fabricated samples, a drain current ($I_d$: [A]) was measured under the conditions where drain voltage $V_d$ was set to 0.1 V or 1 V and gate voltage $V_g$ was swept from −3 V to 3 V. FIGS. 70A and 70B show the measurement results of the comparative samples and FIGS. 71A to 71C show the measurement results of the example samples. In FIGS. 70A and 70B and FIGS. 71A to 71C, the measurement results at drain voltages $V_d$ of 0.1 V and 3 V are shown; lateral axes indicate gate voltage ($V_g$: [V]) and right longitudinal axes indicate drain current ($I_d$: [A]). Note that "drain voltage ($V_d$: [V])" refers to a potential difference between a drain and a source when the potential of the source is used as a reference potential, and "gate voltage ($V_g$: [V])" refers to a potential difference between a gate and a source when the potential of the source is used as a reference potential. Note that "L/W" above each graph represents the size of the transistor (sample); L represents the channel length and W represents the channel width.

As shown in FIG. 70A, drain current at a drain voltage of 3 V is higher than or equal to $1\times10^{-12}$ A when the gate voltage is around −3 V to −2 V. FIG. 70B shows poor characteristics caused by a short circuit between the gate electrode and the pair of electrodes due to the poor coverage with the gate insulating film.

In contrast, as shown in FIGS. 71A to 71C, the example samples have favorable characteristics with which on/off of the transistors can be controlled.

Example 6

In this example, a transistor having the structure illustrated in FIGS. 17A to 17C was fabricated and its reliability was evaluated.

By thermal oxidation of a silicon wafer, a 400-nm-thick thermal oxide film was formed on a surface of the silicon wafer. The thermal oxidation was performed at 950° C. for four hours in a thermal oxidation atmosphere containing HCl at 3 vol % with respect to oxygen.

Then, a 50-nm-thick tungsten film was formed by a sputtering method using a tungsten target in an atmosphere of an argon (Ar) gas at a flow rate of 80 sccm under the conditions where the pressure was 0.8 Pa, the substrate temperature was 230° C., the distance between the target and the substrate was 60 mm, and a DC power of 1.0 kW was applied.

After that, to form a back gate electrode, the tungsten film was subjected to ICP etching under the following conditions: a mixed atmosphere of a carbon tetrafluoride ($CF_4$) gas at a flow rate of 45 sccm, a chlorine (C12) gas at a flow rate of 45 sccm, and an oxygen ($O_2$) gas at a flow rate of 55 sccm was used; power supply was 3000 W; bias power was 110 W; and pressure was 0.67 Pa.

Next, a silicon oxynitride film serving as a base insulating film was formed to have a thickness of 100 nm by a PECVD method under the following conditions: silane ($SiH_4$) at a flow rate of 1 sccm and dinitrogen monoxide ($N_2O$) at a flow rate of 800 sccm were used as source gases; pressure in a reaction chamber was 40 Pa; substrate temperature was 500° C.; and a high-frequency power of 150 W was supplied to parallel plate electrodes with a 60 MHz high frequency power source.

After that, as described in Example 3, the first oxide semiconductor film and the second oxide semiconductor film were formed and heat treatment was performed. Subsequently, the pair of electrodes was formed.

Then, the first and second semiconductor films were processed into island shapes by ICP etching under the following conditions: an atmosphere of a boron trichloride ($BCl_3$) gas at a flow rate of 80 sccm was used; power supply was 450 W; bias power was 100 W; pressure was 1.2 Pa; and substrate temperature was 70° C.

Next, the third oxide semiconductor film was formed as described in Example 3, and an oxygen ion ($^{16}O^+$) was implanted into the third oxide semiconductor film by an ion implantation method under the following conditions: the acceleration voltage was 60 kV, the dosage was $2.0 \times 10^{16}$ ions/cm$^2$, the tilt angle was 7°, and the twist angle was 72°.

Then, a silicon oxynitride film to be the gate insulating film was formed over the third oxide semiconductor film as described in Example 3.

Next, a titanium nitride film was formed to have a thickness of 30 nm over the silicon oxynitride film by a sputtering method under the following conditions: a titanium nitride target was used; a nitrogen ($N_2$) gas at a flow rate of 50 sccm was used as a deposition gas; pressure was 0.2 Pa; substrate temperature was room temperature; and a DC power of 12 kW was applied. Over the titanium nitride film, a tungsten film was formed to have a thickness of 135 nm by a sputtering method under the following conditions: a tungsten target was used; an argon gas at a flow rate of 100 sccm was used as a deposition gas; pressure was 2.0 Pa; substrate temperature was 230° C.; the distance between the target and the substrate was 60 mm: and a DC power of 4.0 kW was applied.

After that, the titanium nitride film and the tungsten film were subjected to ICP etching twice to form a gate electrode. The first etching was performed under the following conditions: a mixed atmosphere of a carbon tetrafluoride ($CF_4$) gas at a flow rate of 55 sccm, a chlorine ($Cl_2$) gas at a flow rate of 45 sccm, and an oxygen ($O_2$) gas at a flow rate of 55 sccm was used; power supply was 3000 W; bias power was 110 W; and pressure was 0.67 Pa. The second etching was performed under the following conditions: a mixed atmosphere of chlorine ($Cl_2$) at a flow rate of 100 sccm and boron trichloride ($BCl_3$) at a flow rate of 150 sccm was used; power supply was 1000 W; bias power was 50 W; and pressure was 0.67 Pa.

Next, the gate insulating film and the third oxide semiconductor film were processed into island shapes using the gate electrode as a mask, as described in Example 3.

Then, a 150-nm-thick aluminum oxide film was formed over the gate electrode and the pair of electrodes by a sputtering method using an aluminum oxide target under the conditions where an argon (Ar) gas at a flow rate of 25 sccm and an oxygen ($O_2$) gas at a flow rate of 25 sccm were used as deposition gases, the pressure was 0.4 Pa, the substrate temperature was 250° C., the distance between the target and the substrate was 60 mm, and an RF power of 2.5 kW was applied.

Then, a 300-nm-thick silicon oxynitride film was formed over the aluminum oxide film by a PECVD method in which silane ($SiH_4$) at a flow rate of 5 sccm and dinitrogen monoxide ($N_2O$) at a flow rate of 1000 sccm were used as source gases, the pressure in a reaction chamber was 133 Pa, the substrate temperature was 325° C., and a high-frequency power of 35 W was supplied to parallel plate electrodes by using a 13.56 MHz high-frequency power source.

Through the above process, the sample of this example was fabricated. Note that the channel length and the channel width of the sample of this example were 0.82 μm and 0.8 μm, respectively.

Figure 72A:
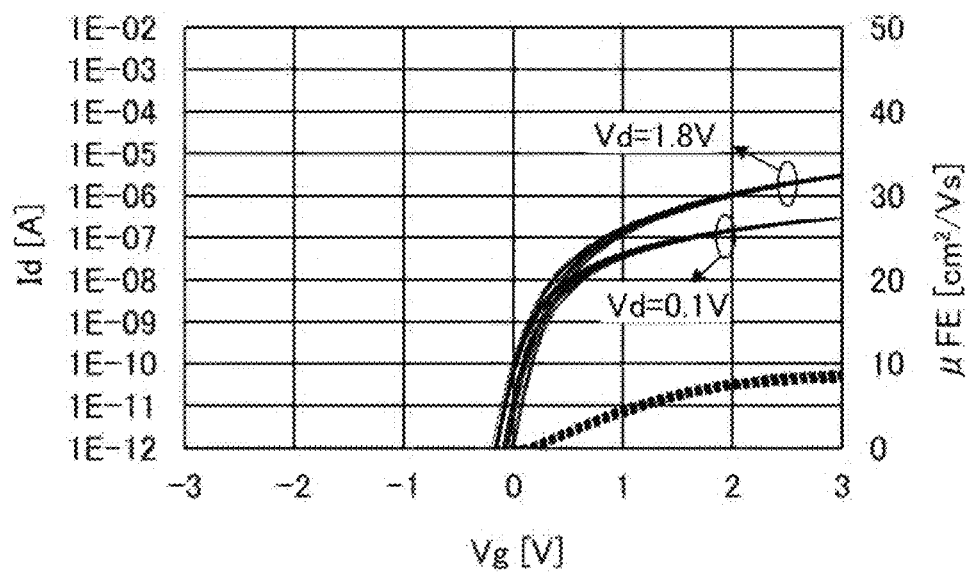
FIGS. 72A and 72B each show electrical characteristics of an example sample.
Figure 72B:
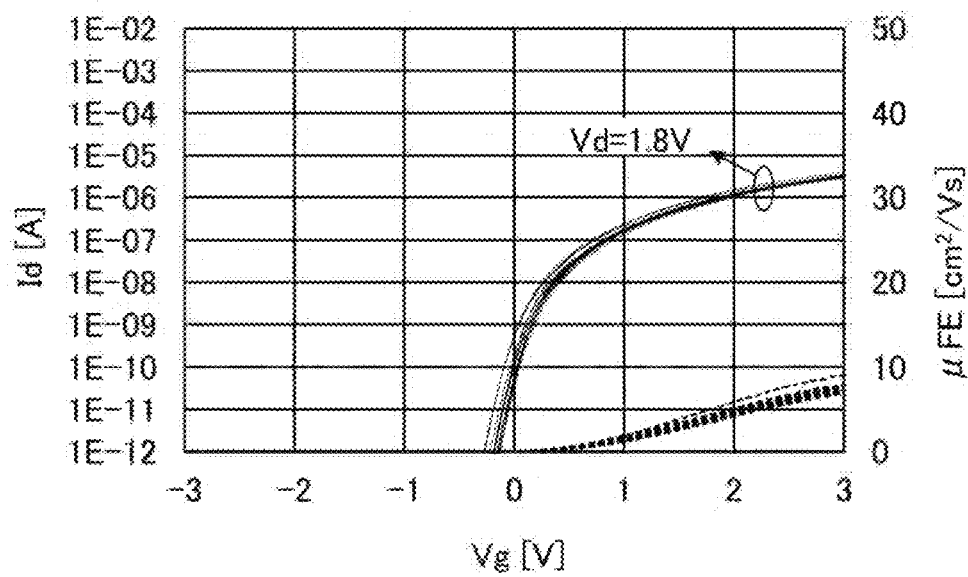

Next, in the fabricated samples, a drain current ($I_d$: [A]) was measured under the conditions where drain voltage $V_d$ was set to 0.1 V or 1.8 V and gate voltage $V_g$: was swept from −3 to 3 V. FIG. 72A shows the measurement results of the example sample. The transistors (example samples) are arranged in 8 rows and 8 columns in the memory device illustrated in FIG. 51A. FIG. 72B shows the measurement results of the example sample at a drain voltage $V_d$: of 1.8 V.

As shown in FIGS. 72A and 72B, favorable characteristics with which on/off of the transistors can be controlled was obtained.

In addition, a first stress test was performed in a state where the memory device stored data "1" and a second stress test was performed in a state where the memory device stored data "0". The first stress test was performed at a source voltage $V_s$ of 0 V, a gate voltage $V_g$ of 0 V, and a drain voltage $V_d$ of 1.8 V. The second stress test was performed at a source voltage of 0 V, a drain voltage of 0 V, and a gate voltage of 0 V. The first stress test and the second stress test were performed under the following common conditions: the back gate voltage $V_{bg}$ was −7.0 V (back gate voltage was adjusted so that a shift value became 0.8 V to 1.0 V), the stress temperature was 150° C., and the stress time was 3600 seconds.

Figure 73A:
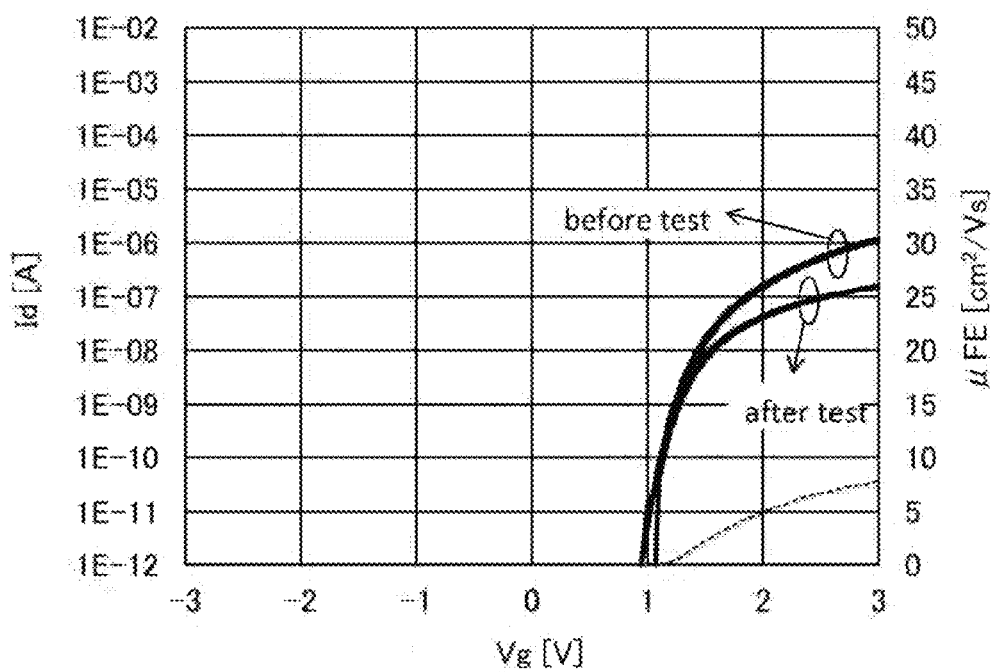
FIGS. 73A and 73B each show electrical characteristics of an example sample.
Figure 73B:
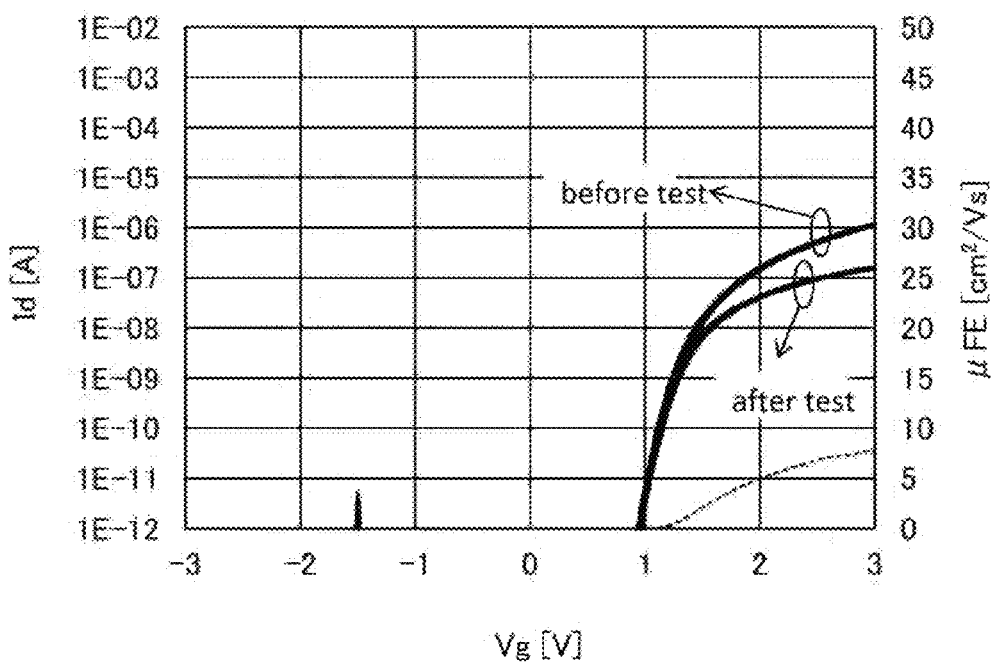

FIG. 73A shows the initial characteristics of the transistor and the characteristics of the transistor after the first stress test, and FIG. 73B shows the initial characteristics of the transistor and the characteristics of the transistor after the second stress test.

As shown in FIGS. 73A and 73B, the initial characteristics of the transistor (characteristics before the stress test) and the characteristics after the stress test are not significantly different from each other. The difference between the threshold voltage in the initial characteristics of the transistor and the threshold voltage after the first stress test ($\Delta V_{th}$) was 0.05 V, the difference in the shift values ($\Delta$Shift) was 0.02 V, and the deterioration rate of on-state current was 10.5%. The difference between the threshold voltage in the initial characteristics of the transistor and the threshold voltage after the second stress test ($\Delta V_{th}$) was 0.04 V, the difference in the shift values ($\Delta$Shift) was 0.02 V, and the deterioration rate of on-state current was 7.0%.

The above results show that the deterioration of the transistor due to the stress test can be suppressed.

EXPLANATION OF REFERENCE

10: transistor, 10a: transistor, 10b: transistor, 10c: transistor, 10d: transistor, 10e: transistor, 11: substrate, 12: conductive film, 13: base insulating film, 13a: base insulating film, 14: oxide semiconductor film, 14a: oxide semiconductor film, 15: electrode, 15a: conductive film, 15b: conductive film, 16: electrode, 17: gate insulating film, 18: gate electrode, 19: insulating film, 20: antioxidant film, 20a: antioxidant film, 20b: antioxidant film, 20c: antioxidant film, 24: multilayer film, 25: oxide semiconductor film, 26: oxide semiconductor film, 26a: oxide semiconductor film, 27: oxide semiconductor film, 30: oxygen, 34: multilayer film, 41: low-resistance region, 42: low-resistance region, 50: transistor, 50a: transistor, 50b: transistor, 50c: transistor, 50d: transistor, 700: substrate, 701: pixel portion, 702: scanning line driver circuit, 703: scanning line driver circuit, 704: signal line driver circuit, 710: capacitor wiring, 712: gate wiring, 713: gate wiring, 714: data line, 716: transistor, 717: transistor, 718: liquid crystal element, 719: liquid crystal element, 720: pixel, 721: switching transistor, 722: driver transistor, 723: capacitor, 724: light-emitting element, 725: signal line, 726: scan line, 727: power line, 728: common electrode, 800: RF tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: connection portion, 916: operation key, 921: housing, 922: display portion, 923: keyboard, 924: pointing device, 931: housing, 932: display portion, 933: wristband, 941: housing, 942: housing, 943: display portion, 944: operation key, 945: lens, 946: connection portion, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing: controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 2100: transistor, 2200: transistor, 2201: insulating film, 2202: wiring, 2203: plug, 2204: insulating film, 2205: wiring, 2206: wiring, 2207: insulating film, 2208: blocking film, 2211: semiconductor substrate, 2212: insulating film, 2213: gate electrode, 2214: gate insulating film, 2215: source region and drain region, 3001: wiring, 3002: wiring, 3003: wiring, 3004: wiring, 3005: wiring, 3200: transistor, 3300: transistor, 3400: capacitor, 4000: RF device, 5100: pellet, 5100a: pellet, 5100b: pellet, 5101: ion, 5102: zinc oxide layer, 5103: particle, 5105a: pellet, 5105a1: region, 5105a2: pellet, 5105b: pellet, 5105c: pellet, 5105d: pellet, 5105d1: region, 5105e: pellet, 5120: substrate, 5130: target, 5161: region, 8000: display module, 8001: upper cover, 8002: lower cover, 8003: FPC, 8004: touch panel, 8005: FPC, 8006: display panel, 8007: backlight unit, 8008: light source, 8009: frame, 8010: printed board, and 8011: battery.

This application is based on Japanese Patent Application serial no. 2013-267525 filed with Japan Patent Office on Dec. 25, 2013, the entire contents of which are hereby incorporated by reference.

The invention claimed is:

1. A semiconductor device comprising:
an oxide semiconductor film over an insulating surface;
a film over the insulating surface and the oxide semiconductor film, the film being capable of blocking oxygen;
a pair of electrodes over and in contact with the film, the pair of electrodes being electrically connected to the oxide semiconductor film;
a gate insulating film over the film and the pair of electrodes; and
a gate electrode over the gate insulating film, the gate electrode overlapping with the oxide semiconductor film,
wherein the film includes a pair of first regions and a second region,
wherein the pair of first regions overlaps with the pair of electrodes,
wherein the second region does not overlap with the pair of electrodes,
wherein the second region overlaps with the gate electrode,
wherein a width of each of the pair of first regions is longer than a width of the second region in a channel width direction,
wherein at least one of the gate insulating film and an insulating film having the insulating surface has a first signal, a second signal, and a third signal,
wherein the first signal appears at a g-factor of greater than or equal to 2.037 and less than or equal to 2.039,
wherein the second signal appears at a g-factor of greater than or equal to 2.001 and less than or equal to 2.003,
wherein the third signal appears at a g-factor of greater than or equal to 1.964 and less than or equal to 1.966, and
wherein a sum of spin densities of the first signal, the second signal, and the third signal is lower than $4 \times 10^{18}$ spins/cm$^3$.

2. The semiconductor device according to claim 1, wherein the film includes an oxide semiconductor.

3. The semiconductor device according to claim 1, wherein the film is further capable of blocking hydrogen and water.

4. The semiconductor device according to claim 1, further comprising:
a conductive film over the insulating surface, the conductive film overlapping with the oxide semiconductor film; and an insulating film over the conductive film and under the oxide semiconductor film.

5. The semiconductor device according to claim 1, wherein at least one of the gate insulating film and an insulating film having the insulating surface comprises a portion with a nitrogen concentration of lower than $1 \times 10^{20}$ atoms/cm$^3$.

6. The semiconductor device according to claim 1, wherein at least one of the gate insulating film and an insulating film having the insulating surface comprises a portion with a hydrogen concentration of lower than $5 \times 10^{20}$ atoms/cm$^3$.

7. The semiconductor device according to claim 1, wherein the film overlaps with an entire portion of the oxide semiconductor film.

8. A semiconductor device comprising:
a first oxide semiconductor film over an insulating surface;
a film over the insulating surface and the first oxide semiconductor film, the film being capable of blocking oxygen;
a pair of electrodes over and in contact with the film, the pair of electrodes being electrically connected to the first oxide semiconductor film;
a second oxide semiconductor film over the pair of electrodes;
a gate insulating film over the film and the second oxide semiconductor film; and
a gate electrode over the gate insulating film, the gate electrode overlapping with the first oxide semiconductor film,
wherein the film includes a pair of first regions and a second region,
wherein the pair of first regions overlaps with the pair of electrodes,
wherein the second region does not overlap with the pair of electrodes,
wherein the second region overlaps with the gate electrode,
wherein a width of each of the pair of first regions is longer than a width of the second region in a channel width direction,
wherein at least one of the gate insulating film and an insulating film having the insulating surface has a first signal, a second signal, and a third signal,
wherein the first signal appears at a g-factor of greater than or equal to 2.037 and less than or equal to 2.039,
wherein the second signal appears at a g-factor of greater than or equal to 2.001 and less than or equal to 2.003,
wherein the third signal appears at a g-factor of greater than or equal to 1.964 and less than or equal to 1.966, and
wherein a sum of spin densities of the first signal, the second signal, and the third signal is lower than $4 \times 10^{18}$ spins/cm$^3$.

9. The semiconductor device according to claim 8, wherein the film includes an oxide semiconductor.

10. The semiconductor device according to claim 8, wherein the film is further capable of blocking hydrogen and water.

11. The semiconductor device according to claim 8, further comprising:
a conductive film over the insulating surface, the conductive film overlapping with the first oxide semiconductor film; and
an insulating film over the conductive film and under the first oxide semiconductor film.

12. The semiconductor device according to claim 8, wherein at least one of the gate insulating film and an insulating film having the insulating surface comprises a portion with a nitrogen concentration of lower than $1 \times 10^{20}$ atoms/cm$^3$.

13. The semiconductor device according to claim 8, wherein at least one of the gate insulating film and an insulating film having the insulating surface comprises a portion with a hydrogen concentration of lower than $5 \times 10^{20}$ atoms/cm$^3$.

14. The semiconductor device according to claim 8, wherein the film overlaps with an entire portion of the first oxide semiconductor film.

* * * * *